(12) United States Patent
Lin et al.

(10) Patent No.: US 11,799,002 B2
(45) Date of Patent: Oct. 24, 2023

(54) SEMICONDUCTOR DEVICES AND METHODS OF FORMING THE SAME

(71) Applicant: Taiwan Semiconductor Manufacturing Co., Ltd., Hsinchu (TW)

(72) Inventors: Yen-Po Lin, Taipei (TW); Wei-Yang Lee, Taipei (TW); Yuan-Ching Peng, Hsinchu (TW); Chia-Pin Lin, Xinpu Township (TW); Jiun-Ming Kuo, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 130 days.

(21) Appl. No.: 17/199,933

(22) Filed: Mar. 12, 2021

(65) Prior Publication Data

US 2021/0376094 A1    Dec. 2, 2021

Related U.S. Application Data

(60) Provisional application No. 63/031,641, filed on May 29, 2020.

(51) Int. Cl.
| | |
|---|---|
| H01L 21/768 | (2006.01) |
| H01L 29/417 | (2006.01) |
| H01L 29/423 | (2006.01) |
| H01L 29/66 | (2006.01) |
| H01L 29/40 | (2006.01) |
| H01L 29/786 | (2006.01) |

(52) U.S. Cl.
CPC ...... *H01L 29/41733* (2013.01); *H01L 29/401* (2013.01); *H01L 29/42392* (2013.01); *H01L 29/66545* (2013.01); *H01L 29/78696* (2013.01)

(58) Field of Classification Search
None
See application file for complete search history.

(56) References Cited

U.S. PATENT DOCUMENTS

| | | | |
|---|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |

(Continued)

*Primary Examiner* — Joseph C. Nicely
*Assistant Examiner* — Lamont B Koo
(74) *Attorney, Agent, or Firm* — Slater Matsil, LLP

(57) ABSTRACT

A method includes depositing a dummy semiconductor layer and a first semiconductor layer over a substrate, forming spacers on sidewalls of the dummy semiconductor layer, forming a first epitaxial material in the substrate, exposing the dummy semiconductor layer and the first epitaxial material, where exposing the dummy semiconductor layer and the first epitaxial material includes thinning a backside of the substrate, etching the dummy semiconductor layer to expose the first semiconductor layer, where the spacers remain over and in contact with end portions of the first semiconductor layer while etching the dummy semiconductor layer, etching portions of the first semiconductor layer using the spacers as a mask, and replacing a second epitaxial material and the first epitaxial material with a backside via, the backside via being electrically coupled to a source/drain region of a first transistor.

20 Claims, 67 Drawing Sheets

(56) References Cited

U.S. PATENT DOCUMENTS

| | | |
|---|---|---|
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2005/0167782 A1* | 8/2005 | Sanchez ............ H01L 21/76898 257/532 |
| 2017/0040357 A1* | 2/2017 | Yu ..................... H01L 27/14636 |
| 2019/0326405 A1* | 10/2019 | Morrow .......... H01L 21/823418 |

* cited by examiner

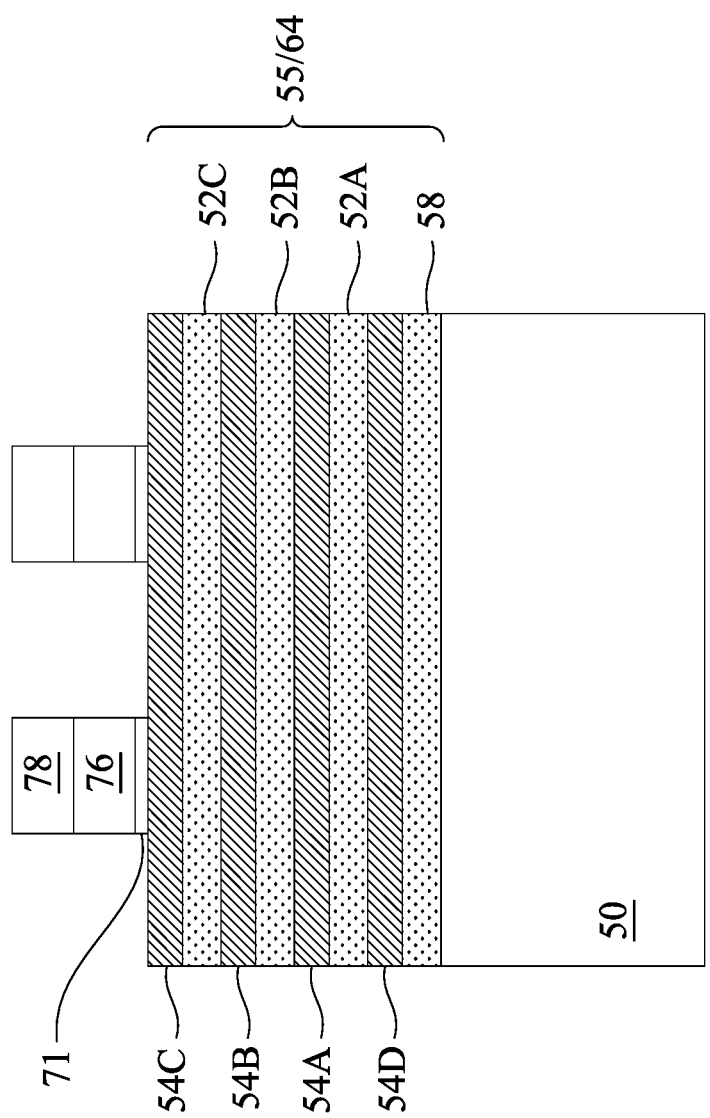

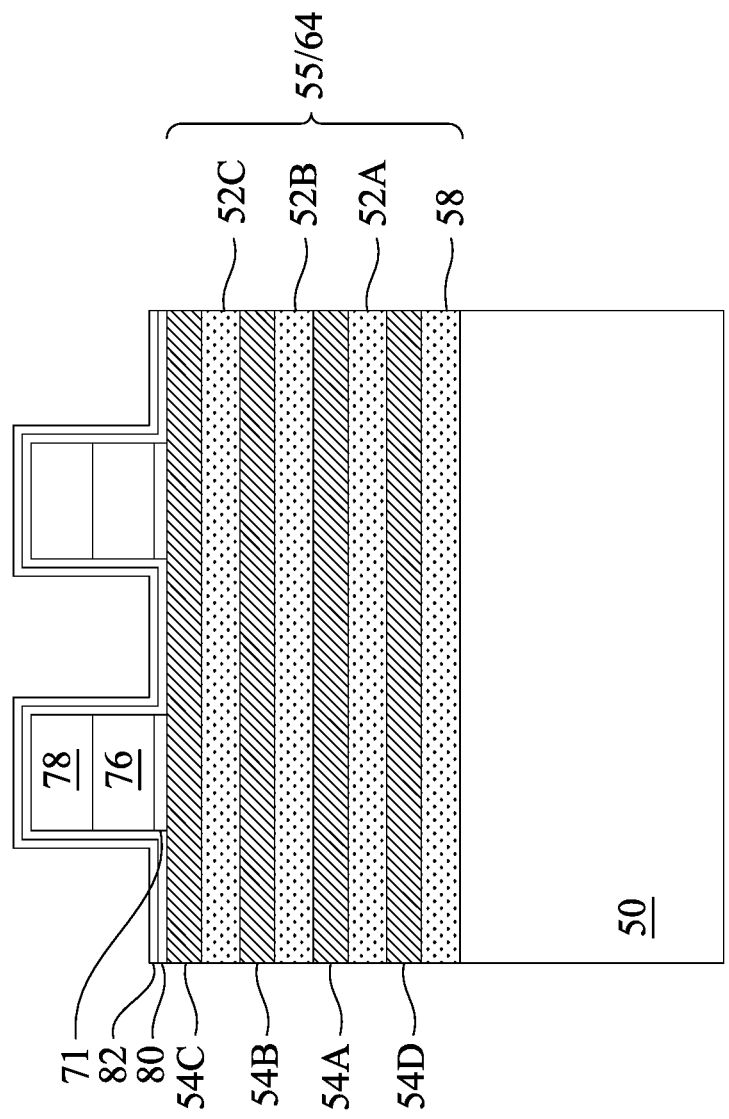

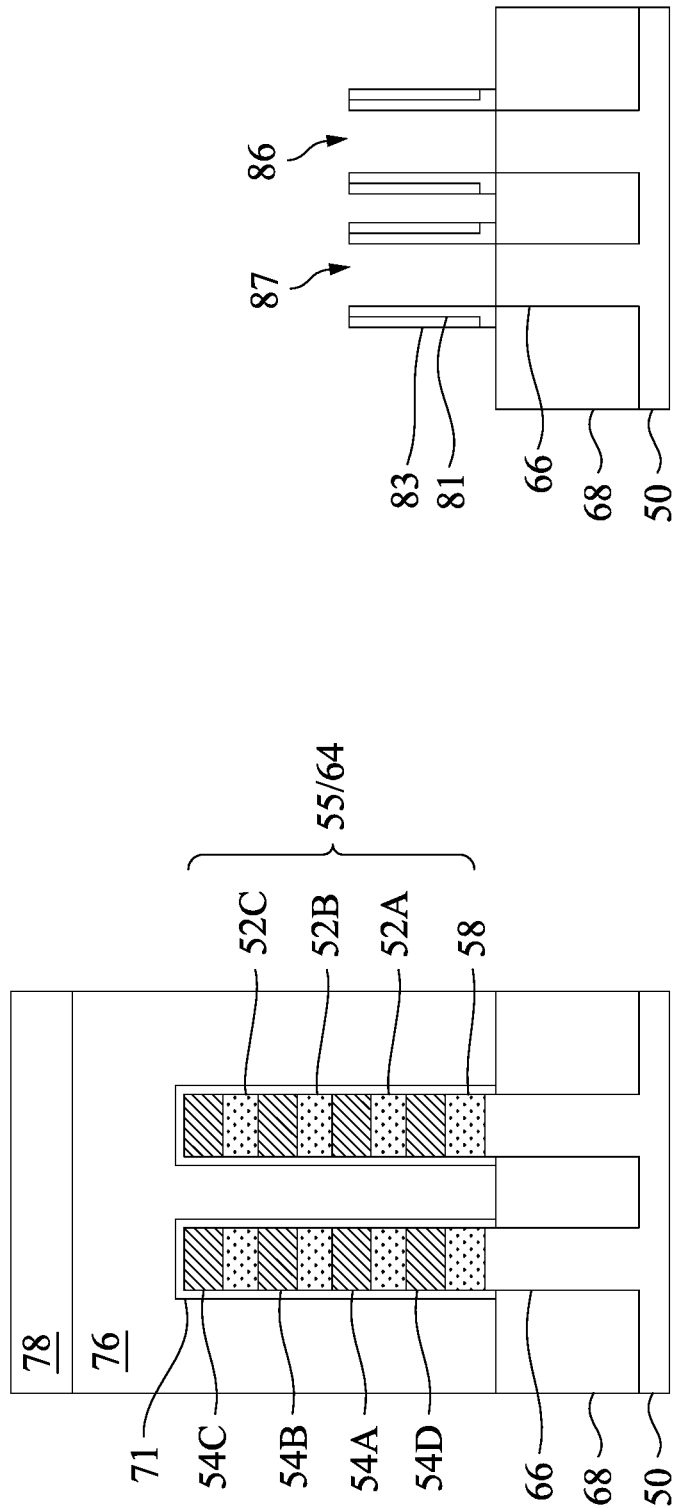

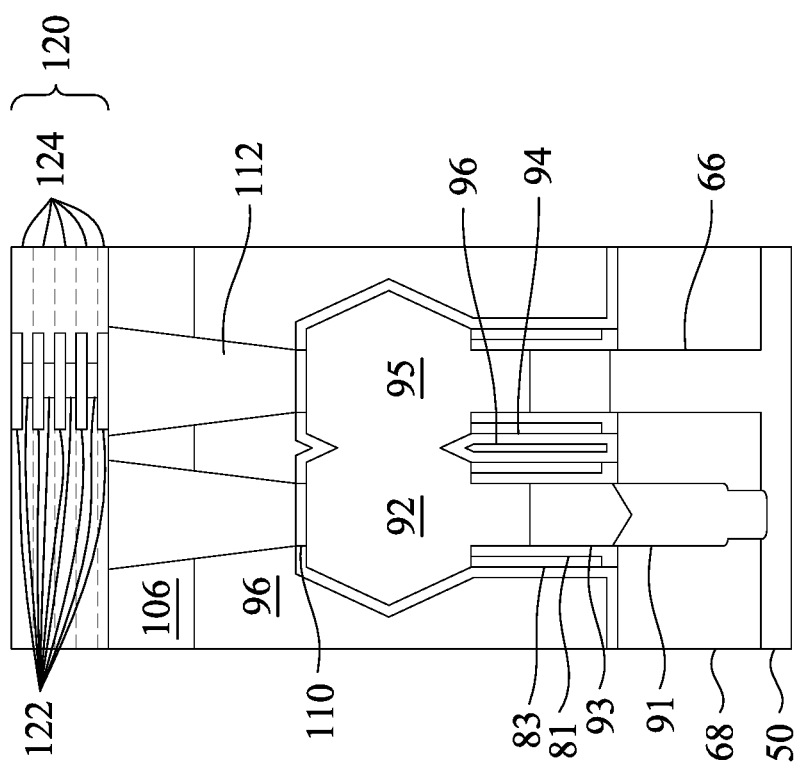
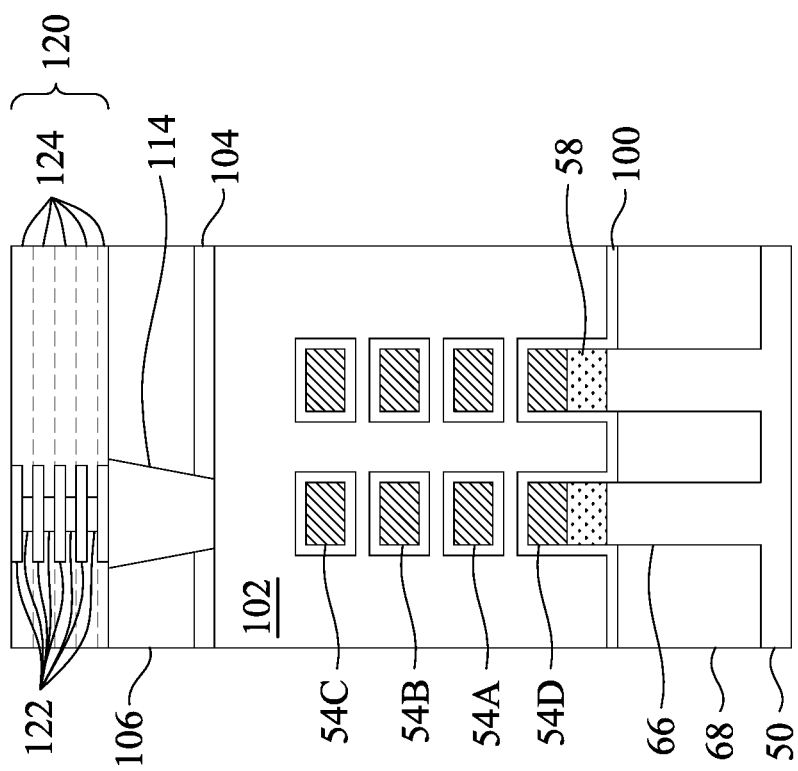
Fig. 22B
Fig. 22A

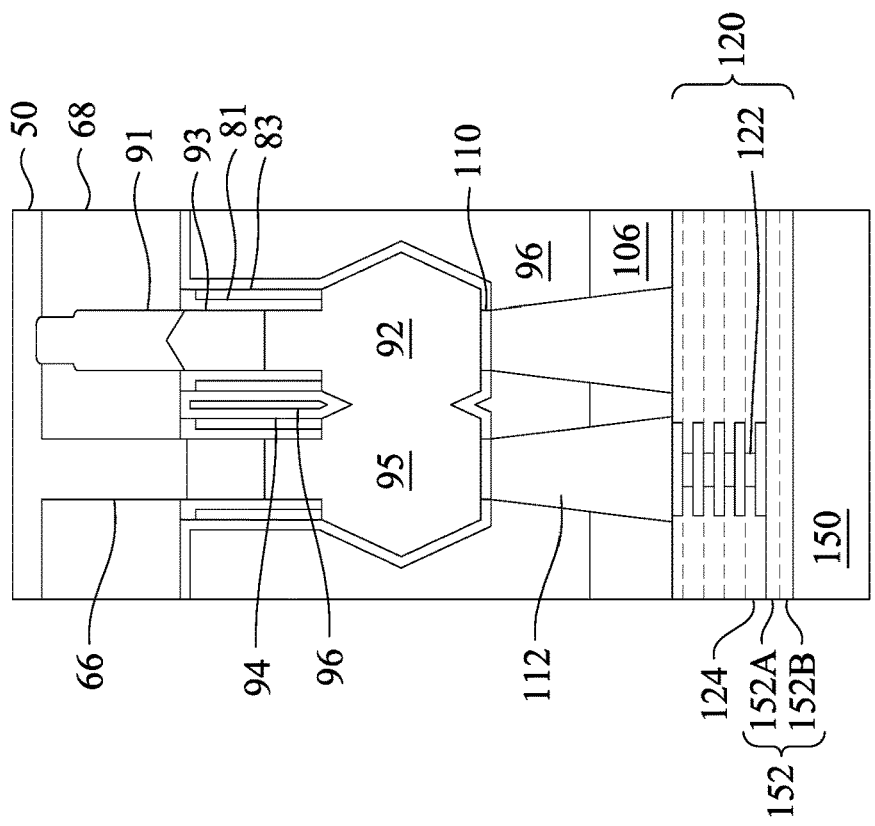
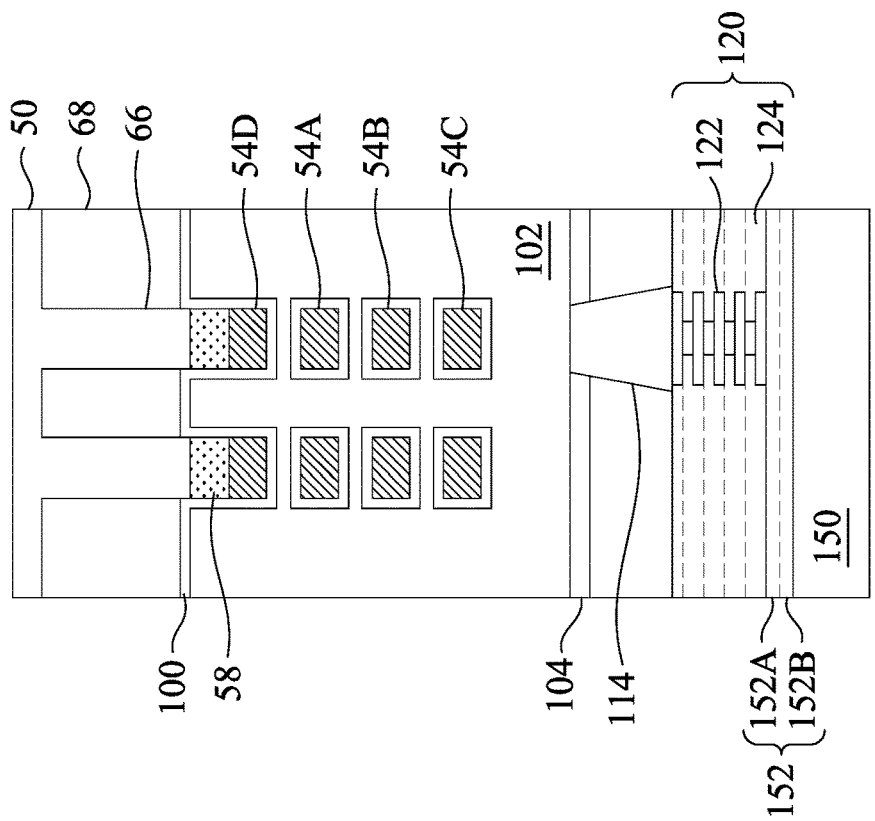
Fig. 23B
Fig. 23A

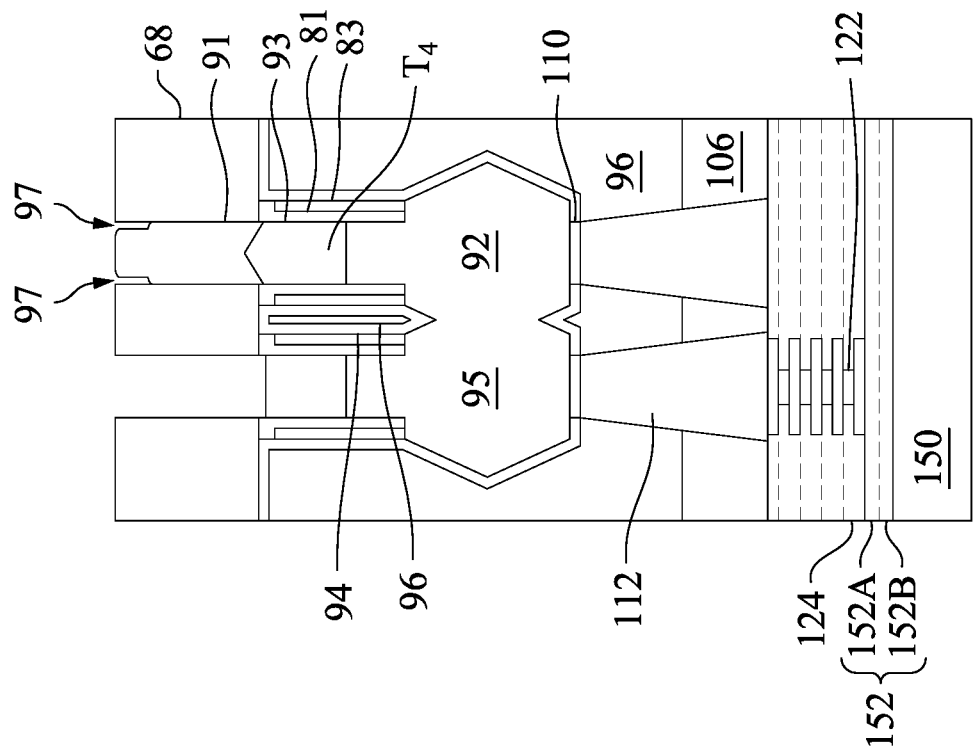
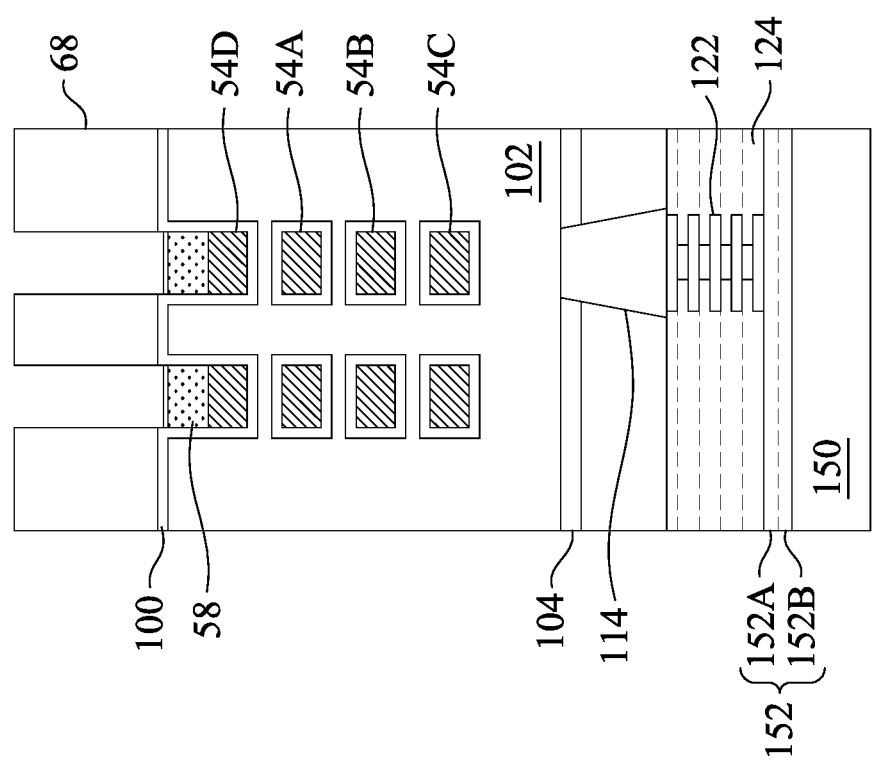
Fig. 25B
Fig. 25A

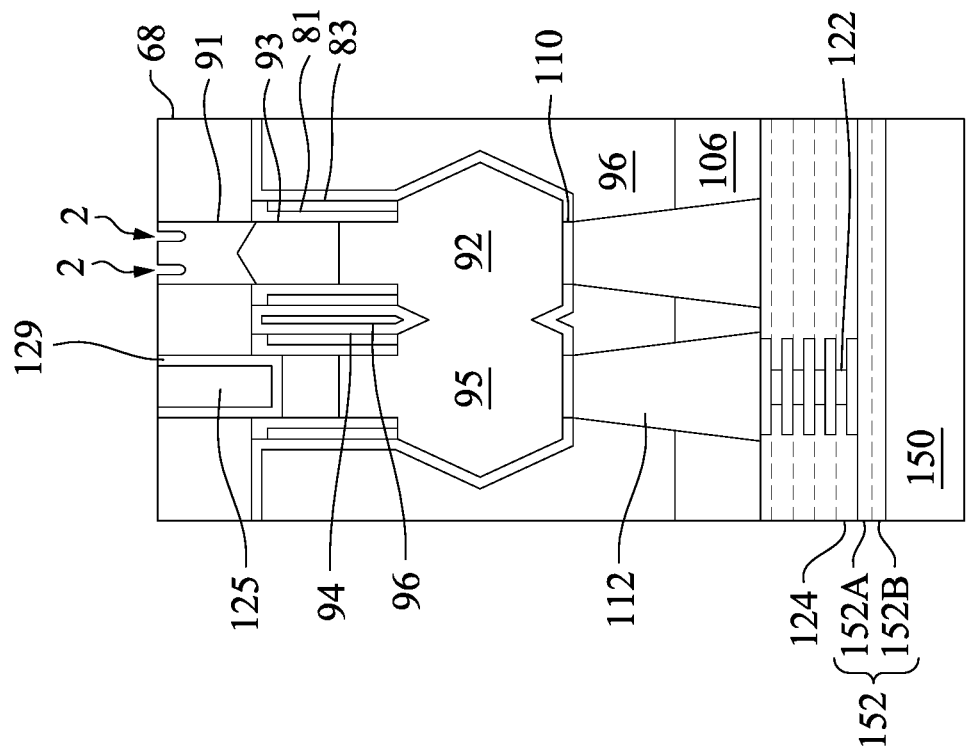
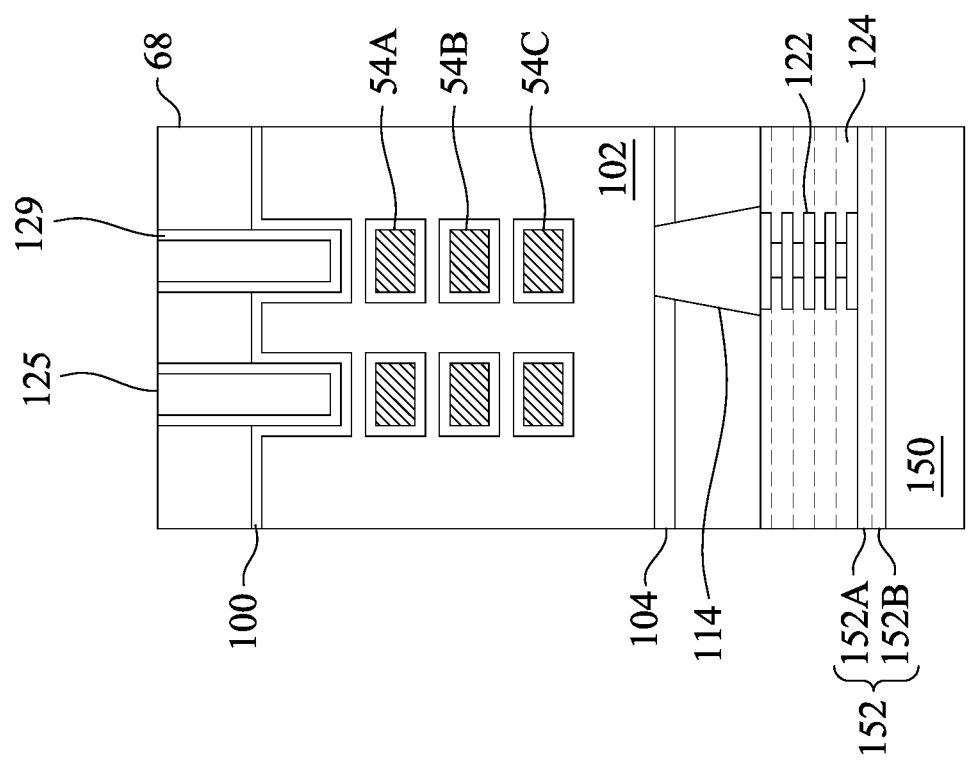
Fig. 30B
Fig. 30A

US 11,799,002 B2

SEMICONDUCTOR DEVICES AND METHODS OF FORMING THE SAME

PRIORITY CLAIM AND CROSS-REFERENCE

This application claims priority to U.S. Provisional Application No. 63/031,641, filed on May 29, 2020, which applications is hereby incorporated by reference herein as if reproduced in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 6C, 7A, 7B, 7C, 8A, 8B, 8C, 9A, 9B, 9C, 10, 11A, 11B, 12A, 12B, 12C, 13A, 13B, 13C, 13D, 13E, 14A, 14B, 14C, 15A, 15B, 15C, 16A, 16B, 16C, 17A, 17B, 17C, 18A, 18B, 18C, 19A, 19B, 19C, 20A, 20B, 20C, 21A, 21B, 21C, 22A, 22B, 22C, 23A, 23B, 23C, 24A, 24B, 24C, 25A, 25B, 25C, 26A, 26B, 26C, 27A, 27B, 27C, 28A, 28B, 28C, 28D, 29A, 29B, 29C, 29D, 30A, 30B, 30C, 31A, 31B, 31C, 32A, 32B, 32C, 33A, 33B, 33C, 34A, 34B, 34C, 35A, 35B, and 35C are cross-sectional views of intermediate stages in the manufacturing of nano-FETs, in accordance with some embodiments.

DETAILED DESCRIPTION

Figure 1:
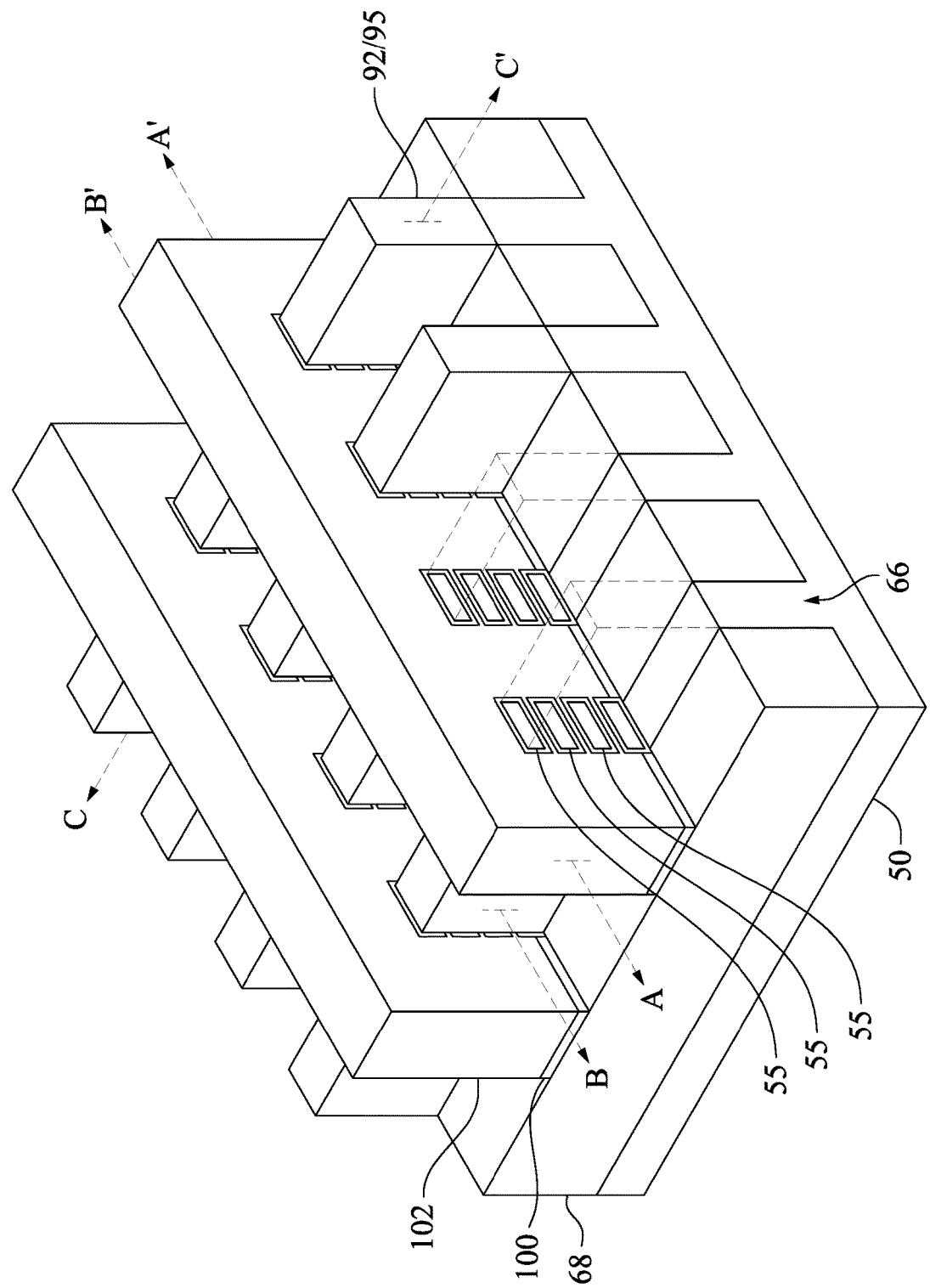
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods applied to, but not limited to, the formation of a backside via in a semiconductor device and a semiconductor device including the same. The methods include forming a dummy semiconductor layer on a topmost layer of a nanosheet stack. The dummy semiconductor layer is formed between sidewall spacers. The dummy semiconductor layer is etched through such that end portions of the topmost layer of the nanosheet stack remain covered by the sidewall spacers. Middle portions of the topmost layer of the nanosheet stack are then removed while using the sidewall spacers to mask the end portions of the topmost layer. Advantageous features of one or more embodiments disclosed herein may include reducing damage to interfaces between epitaxial source/drain regions and layers of the nanosheet stack underlying the topmost layer of the nanosheet stack during an etch process. In addition, during the etch process, the topmost layer of the nanosheet can be etched along preferential directions that leave end portions of the topmost layer of the nanosheet stack. The remaining end portions of the topmost layer of the nanosheet stack protect against damage caused by over etching to interfaces between epitaxial source/drain regions and underlying layers of the nanosheet stack. Embodiments disclosed herein may allow for a larger process window and therefore allow for more process variability during the formation of the backside via, resulting in an increase in manufacturing yield. Further, because of reduced damage to interfaces between epitaxial source/drain regions and channel layers of the nanosheet stack underlying the topmost layer of the nanosheet stack, the embodiments described herein have a reduced vulnerability to electrostatic discharge and can be incorporated in electrostatic-sensitive devices (ESDs).

Some embodiments discussed herein are described in the context of IC dies including nano-FETs. However, various embodiments may be applied to IC dies including other types of transistors (e.g., fin field effect transistors (FinFETs), planar transistors, or the like) in lieu of or in combination with the nano-FETs.

FIG. 1 illustrates an example of nano-FETs (e.g., nanowire FETs, nanosheet FETs, or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Shallow trench isolation (STI) regions 68 are disposed between adjacent fins 66, which may protrude above and from between neighboring STI regions 68. Although the STI regions 68 are described/illustrated as being separate from the substrate 50, as used herein, the term "substrate" may refer to the semiconductor substrate alone or a combination of the semiconductor substrate and the STI regions. Additionally, although bottom portions of the fins 66 are illustrated as being single, continuous materials with the substrate 50, the bottom portions of the fins 66 and/or the substrate 50 may comprise a single material or a plurality of materials. In this context, the fins 66 refer to the portion extending between the neighboring STI regions 68.

Gate dielectric layers 100 are over top surfaces of the fins 66 and along top surfaces, sidewalls, and bottom surfaces of the nanostructures 55. Gate electrodes 102 are over the gate dielectric layers 100. First epitaxial source/drain regions 92 and second epitaxial regions 95 are disposed on the fins 66 on opposing sides of the gate dielectric layers 100 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between the first epitaxial source/drain regions 92 or the second epitaxial source/drain regions 95 of a nano-FET. Cross-section B-B' is parallel to cross-section A-A' and extends through first epitaxial source/drain regions 92 or second epitaxial source/drain regions 95 of multiple nano-FETs. Cross-section C-C' is perpendicular to cross-section A-A' and is parallel to a longitudinal axis of a fin 66 of the nano-FET and in a direction of, for example, a current flow between the first epitaxial source/drain regions 92 or the second epitaxial source/drain regions 95 of the nano-FET. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 35C are cross-sectional views of intermediate stages in the manufacturing of nano-FETs, in accordance with some embodiments. FIGS. 2 through 5, 6A, 7A, 8A, 9A, 12A, 13A, 14A, 15A, 16A, 17A, 18A, 19A, 20A, 21A, 22A, 23A, 24A, 25A, 26A, 27A, 28A, 29A, 30A, 31A, 32A, 33A, 34A, and 35A illustrate reference cross-section A-A' illustrated in FIG. 1. FIGS. 6B, 7B, 8B, 9B, 12B, 13B, 13D, 14B, 15B, 16B, 17B, 18B, 19B, 20B, 21B, 22B, 23B, 24B, 25B, 26B, 27B, 28B, 29B, 30B, 31B, 32B, 33B, 34B, and 35B illustrate reference cross-section B-B' illustrated in FIG. 1. FIGS. 6C, 7C, 8C, 9C, 10, 11A, 11B, 12C, 13C, 13E, 14C, 15C, 16C, 17C, 18C, 19C, 20C, 21C, 22C, 23C, 24C, 25C, 26C, 27C, 28C, 28D, 29C, 29D, 30C, 31C, 32C, 33C, 34C, and 35C illustrate reference cross-section C-C' illustrated in FIG. 1.

Figure 2:
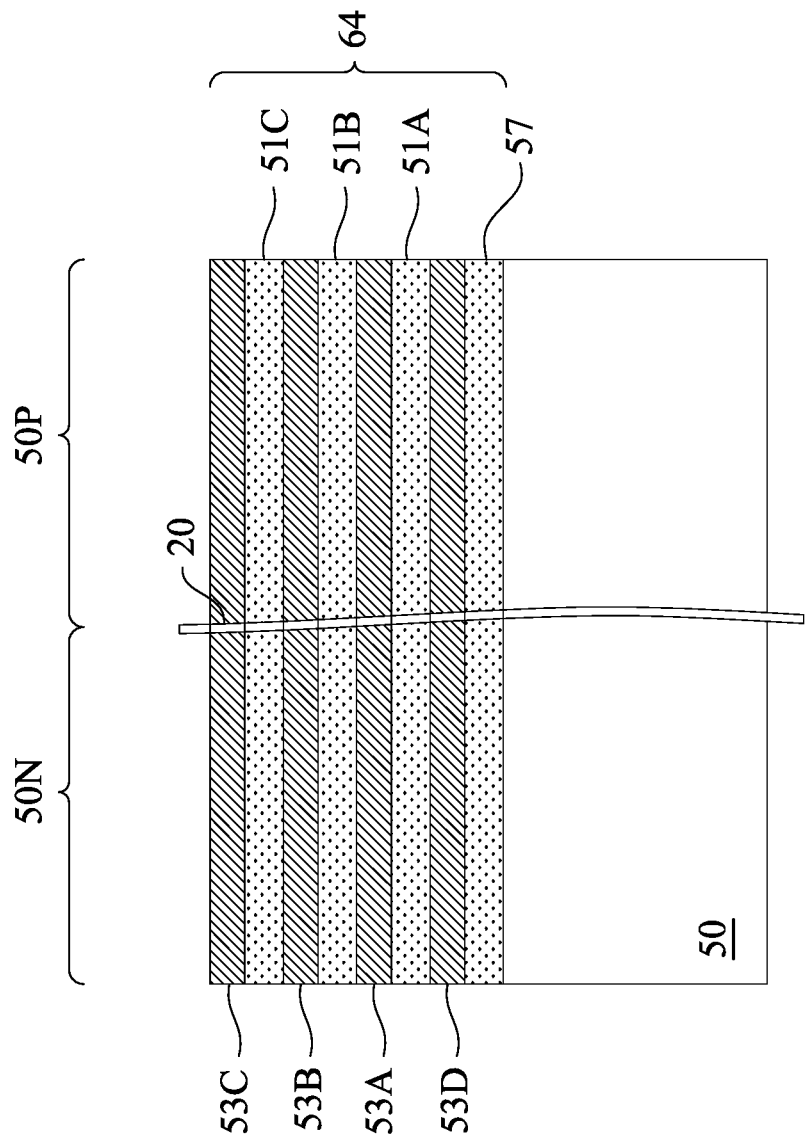

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-51C (collectively referred to as first semiconductor layers 51) and second semiconductor layers 53A-53D (collectively referred to as second semiconductor layers 53). The multi-stack layer also includes a dummy semiconductor layer 57. For purposes of illustration and as discussed in greater detail below, the first semiconductor layers 51A, 51B, and 51C will be removed and the second semiconductor layers 53A, 53B, and 53C will be patterned to form channel regions of nano-FETs in the n-type region 50N and the p-type region 50P. However, in some embodiments the first semiconductor layers 51A, 51B, and 51C may be removed and the second semiconductor layers 53A, 53B, and 53C may be patterned to form channel regions of nano-FETs in the n-type region 50N, and the second semiconductor layers 53A, 53B, and 53C may be removed and the first semiconductor layers 51A, 51B, and 51C may be patterned to form channel regions of nano-FETs in the p-type region 50P. In some embodiments the second semiconductor layers 53A, 53B, and 53C may be removed and the first semiconductor layers 51A, 51B, and 51C may be patterned to form channel regions of nano-FETs in the n-type region 50N, and the first semiconductor layers 51A, 51B, and 51C may be removed and the second semiconductor layers 53A, 53B, and 53C may be patterned to form channel regions of nano-FETs in the p-type region 50P. In some embodiments, the second semiconductor layers 53A, 53B, and 53C may be removed and the first semiconductor layers 51A, 51B, and 51C may be patterned to form channel regions of nano-FETs in both the n-type region 50N and the p-type region 50P.

The multi-layer stack 64 is illustrated as including three layers of the first semiconductor layers 51 and four layers of the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 and the dummy semiconductor layer 57 may be formed of a first semiconductor material suitable for p-type nano-FETs, such as silicon germanium or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high etch selectivity to one another. As such, the first semiconductor layers 51 and the dummy semiconductor layer 57 of the first semiconductor material may be removed without significantly removing the second semiconductor layers 53 of the second semiconductor material thereby allowing the second semiconductor layers 53A, 53B, and 53C to be patterned to form channel regions of nano-FETs. Similarly, in embodiments in which the second semiconductor layers 53 are removed and the first semiconductor layers 51A, 51B, and 51C are patterned to form channel regions, the second semiconductor layers 53 of the second semiconductor material may be removed without significantly removing the first semiconductor layers 51 of the first semiconductor material, thereby allowing the first semiconductor layers 51A, 51B, and 51C to be patterned to form channel regions of nano-FETs.

Figure 3:
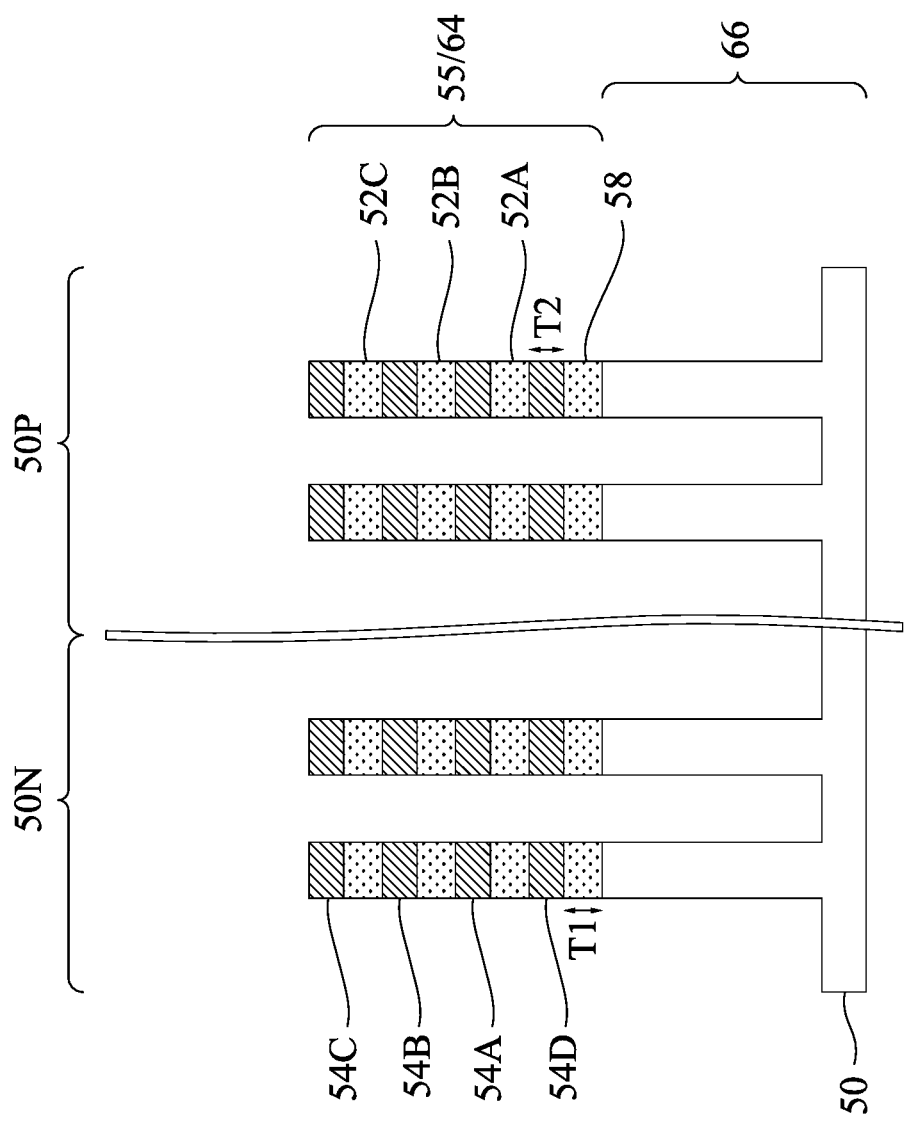

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define dummy nanostructure 58 from the dummy semiconductor layer 57, first nanostructures 52A-52C (collectively referred to as the first nanostructures 52) from the first semiconductor layers 51 and define second nanostructures 54A-54D (collectively referred to as the second nanostructures 54) from the second semiconductor layers 53. The first nanostructures 52, the dummy nanostructure 58, and the second nanostructures 54 may be collectively referred to as nanostructures 55. In some embodiments, the dummy nanostructure 58 may have a thickness T1 in a range from about 3 nm to about 5 nm and the second nanostructure 54D may have a thickness T2 in a range from about 6 nm to about 7 nm.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
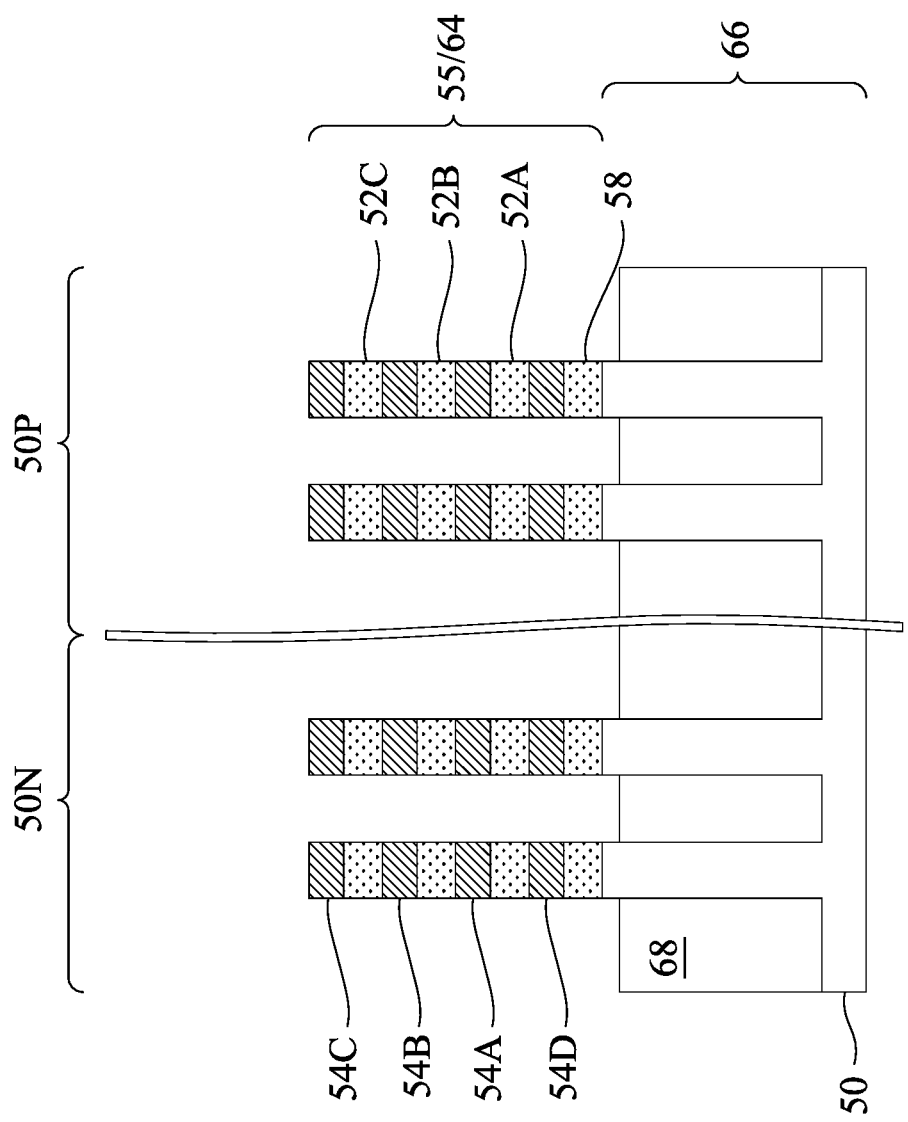

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
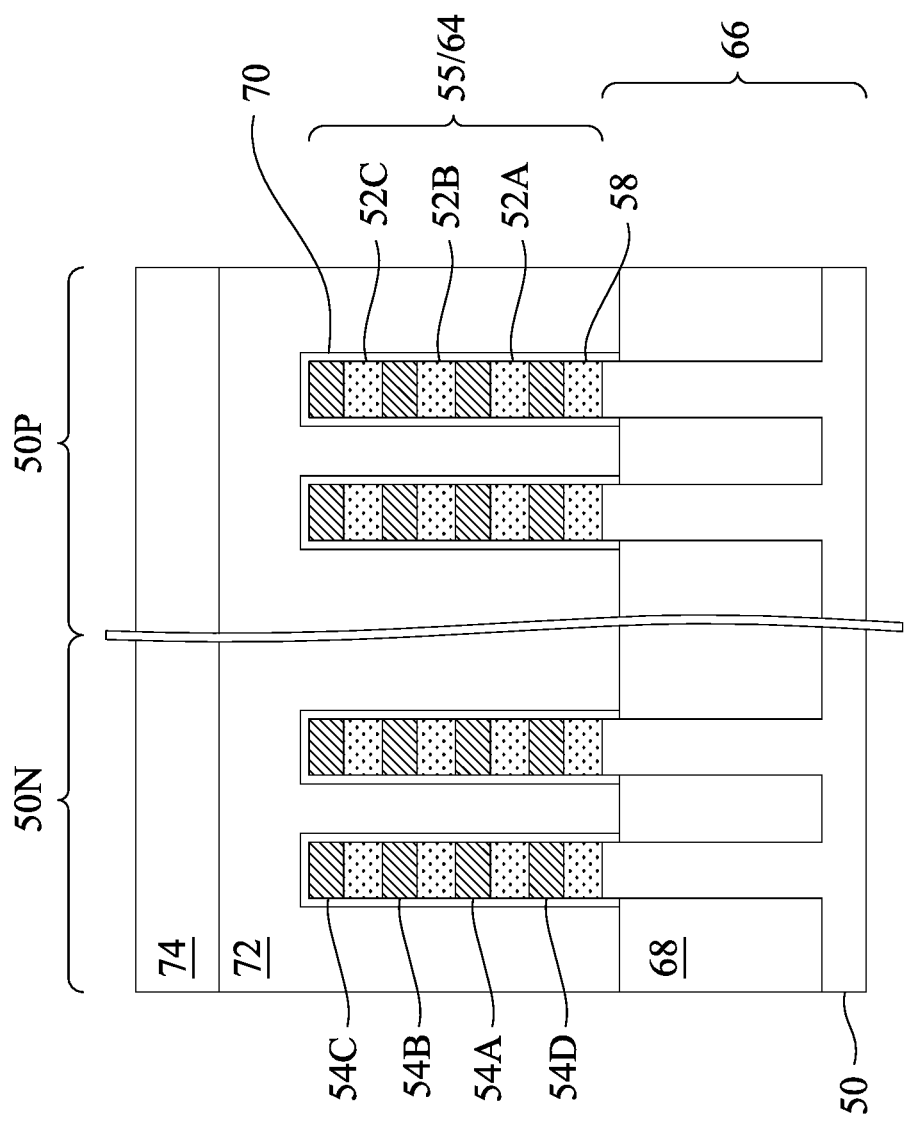

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6B:
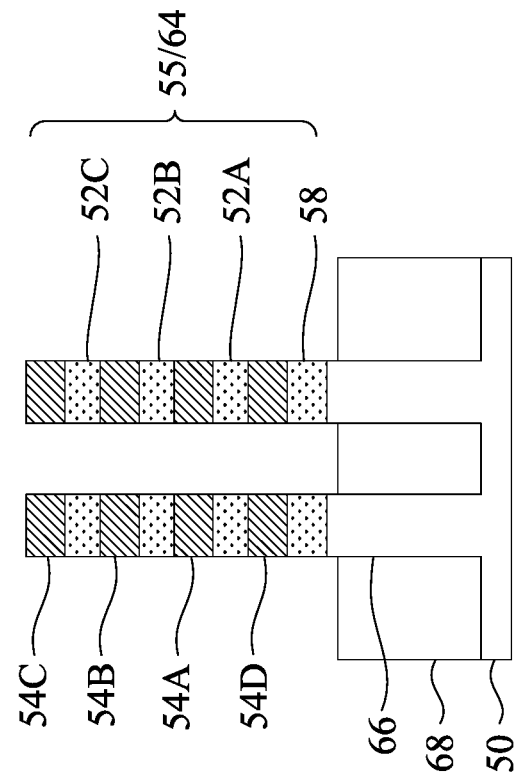
Figure 6A:
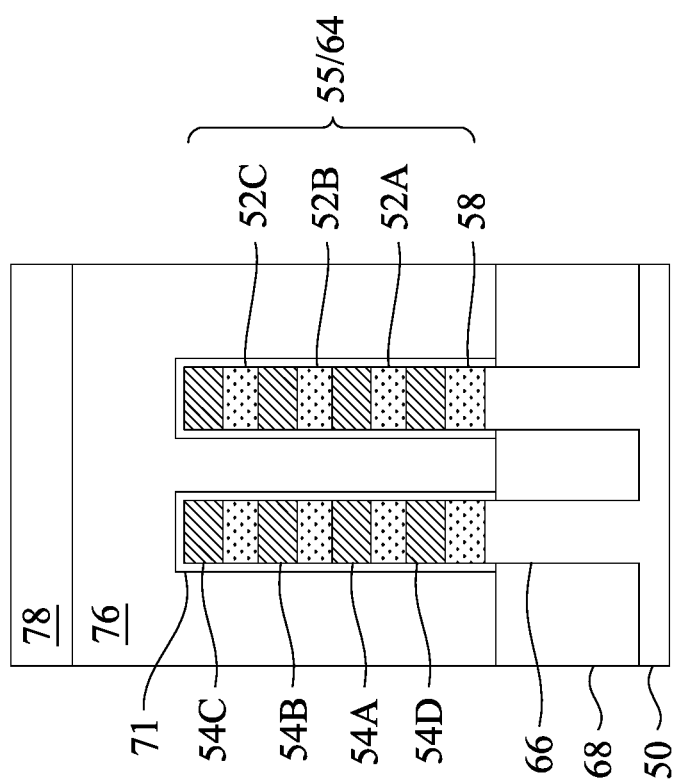

FIGS. 6A through 21C illustrate various additional steps in the manufacturing of embodiment devices. FIGS. 6A through 21C illustrate features in either the n-type region 50N or the p-type region 50P. In FIGS. 6A through 6C, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7B:
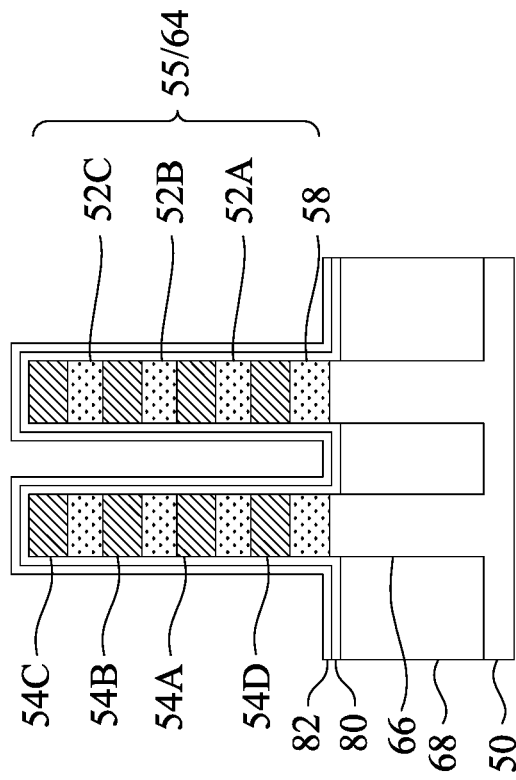
Figure 7A:
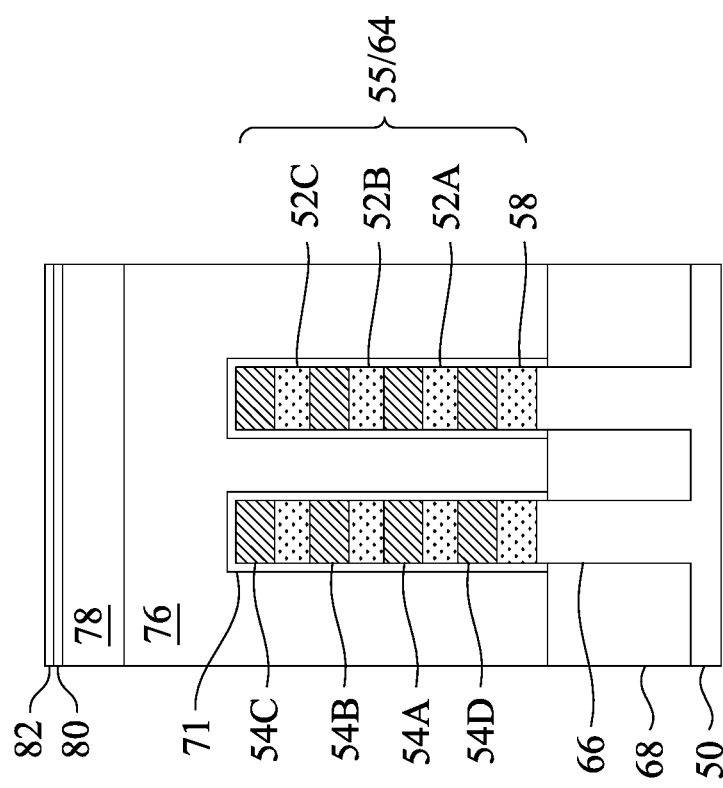

In FIGS. 7A through 7C, a first spacer layer 80 and a second spacer layer 82 are formed over the structures illustrated in FIGS. 6A through 6C. The first spacer layer 80 and the second spacer layer 82 will be subsequently patterned to act as spacers for forming self-aligned source/drain regions. In FIGS. 7A through 7C, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1 \times 10^{15}$ atoms/cm$^3$ to about $1 \times 10^{19}$ atoms/cm$^3$. An anneal may be used to repair implant damage and to activate the implanted impurities.

Figure 8B:
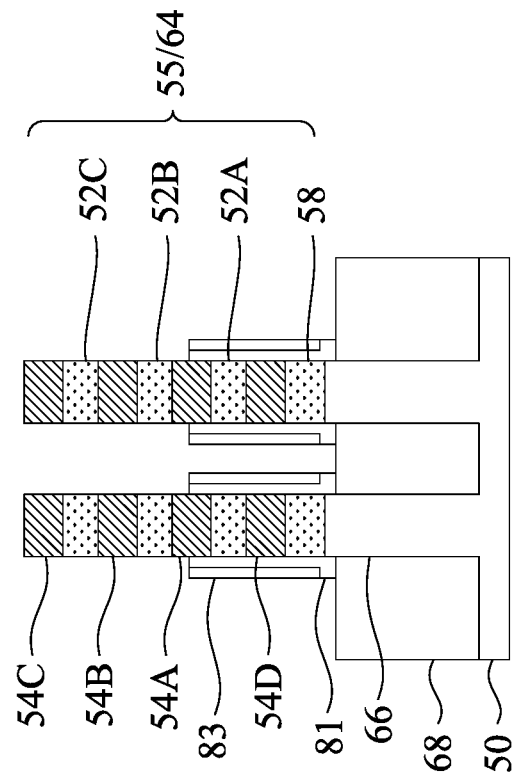
Figure 8A:
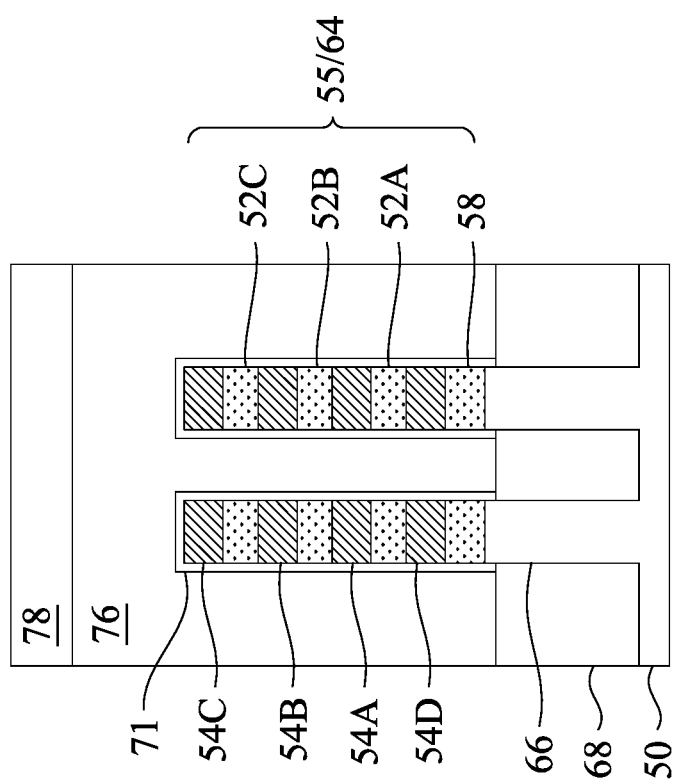
Figure 8C:
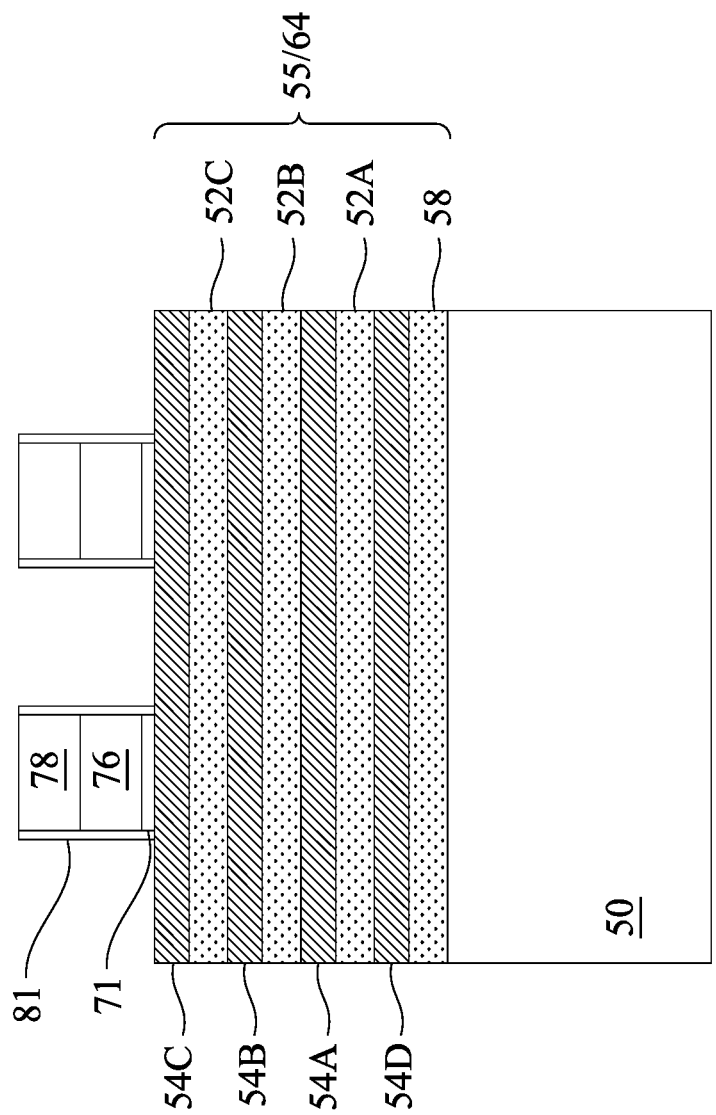

In FIGS. 8A through 8C, the first spacer layer 80 and the second spacer layer 82 are etched to form first spacers 81 and second spacers 83. As will be discussed in greater detail below, the first spacers 81 and the second spacers 83 act to self-aligned subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8B. Thereafter, the second spacers 83 acts as a mask while etching exposed portions of the first spacer layer 80, thereby forming first spacers 81 as illustrated in FIGS. 8B and 8C.

As illustrated in FIG. 8B, the first spacers 81 and the second spacers 83 are disposed on sidewalls of the fins 66 and/or nanostructures 55. As illustrated in FIG. 8C, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 71. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9C:
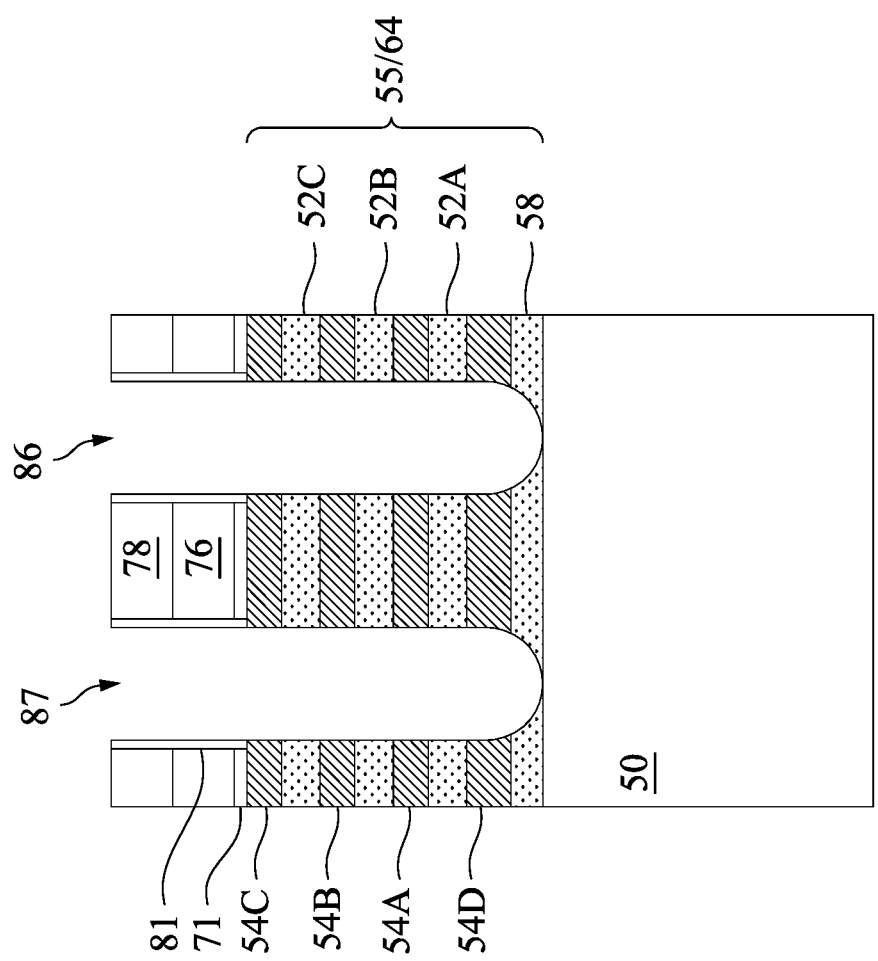

In FIGS. 9A through 9C, first recesses 86 and second recesses 87 are formed in the nanostructures 55, in accordance with some embodiments. Epitaxial materials and epitaxial source/drain regions will be subsequently formed in the first recesses 86 and the second recesses 87. The first recesses 86 and the second recesses 87 may extend through the first nanostructures 52, the dummy nanostructure 58 and the second nanostructures 54. As illustrated in FIG. 9B, top surfaces of the STI regions 68 may be level with bottom surfaces of the first recesses 86 and the second recesses 87. In various embodiments, the nanostructures 55 may be etched such that bottom surfaces of the first recesses 86 and the second recesses 87 are disposed below the top surfaces of the STI regions 68 or the like.

The first recesses 86 and the second recesses 87 may be formed by etching the nanostructures 55 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86 and the second recesses 87. A single etch process or multiple etch processes may be used to etch each layer of the nanostructures 55. Timed etch processes may be used to stop the etching after the first recesses 86 and the second recesses 87 reach desired depths. The second recesses 87 may be etched by the same processes used to etch the first recesses 86.

Figure 10:
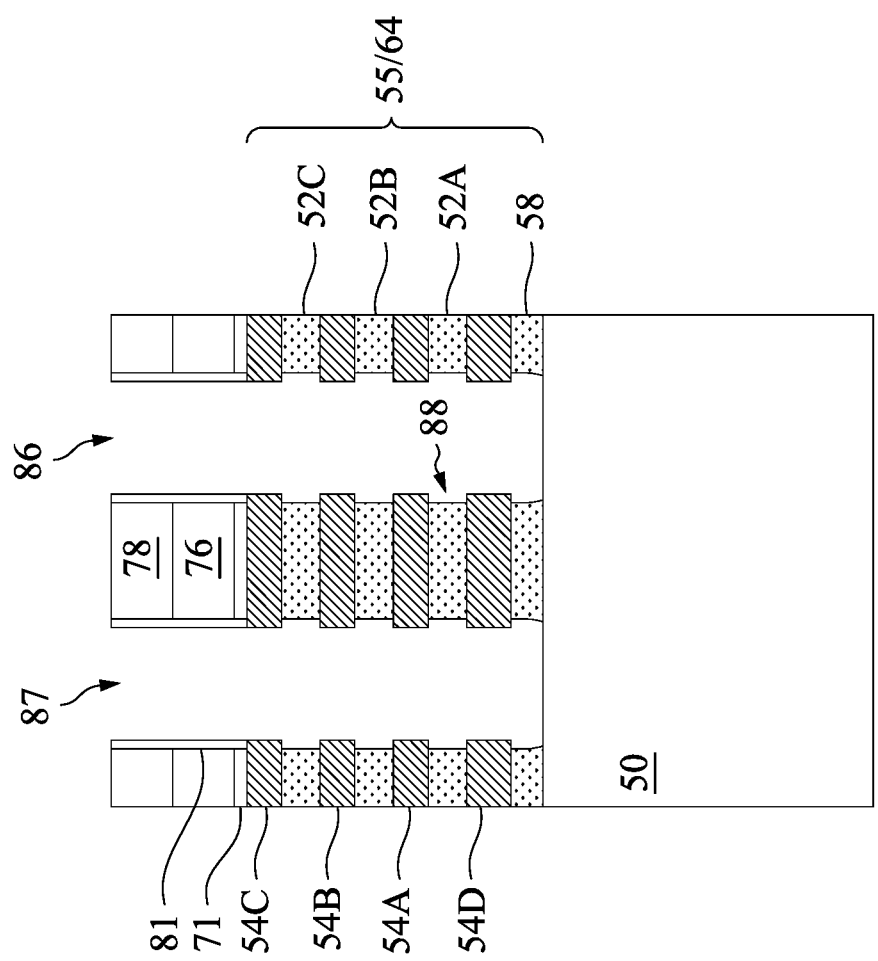

In FIG. 10, portions of sidewalls of the layers of the multi-layer stack 64 formed of the first semiconductor materials (e.g., the first nanostructures 52 and the dummy nanostructure 58) exposed by the first recesses 86 and the second recesses 87 are etched to form sidewall recesses 88. Although sidewalls of the first nanostructures 52 and the dummy nanostructure 58 adjacent the sidewall recesses 88 are illustrated as being straight in FIG. 10, the sidewalls may be concave or convex. The sidewalls may be etched using isotropic etching processes, such as wet etching or the like. In an embodiment in which the first nanostructures 52 and the dummy nanostructure 58 include, e.g., SiGe, and the second nanostructures 54 include, e.g., Si or SiC, a dry etch process with tetramethylammonium hydroxide (TMAH), ammonium hydroxide (NH$_4$OH), or the like may be used to etch sidewalls of the first nanostructures 52 and the dummy nanostructure 58. As illustrated in FIG. 10, the first recesses 86 and the second recesses 87 may have a bottom surface level with a bottom surface of the dummy nanostructure 58.

Figure 11A:
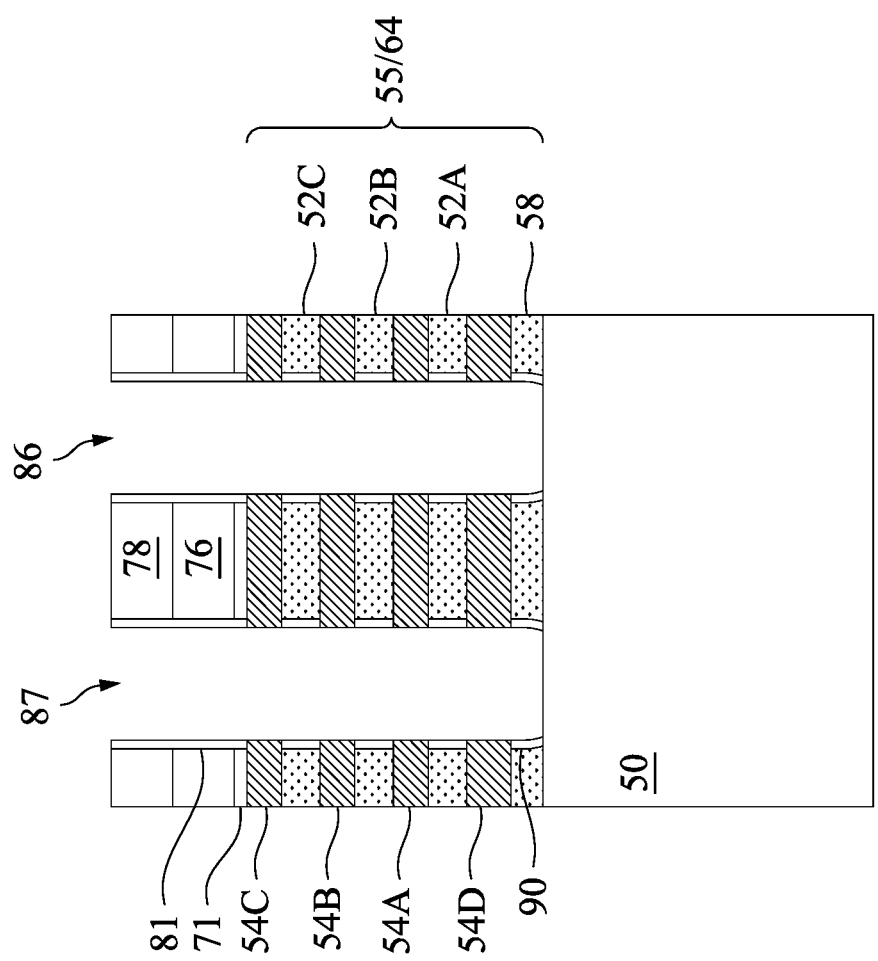

In FIG. 11A, first inner spacers 90 are formed in the sidewall recess 88. The first inner spacers 90 may be formed by depositing an inner spacer layer (not separately illustrated) over the structures illustrated in FIG. 10. The first inner spacers 90 act as isolation features between subsequently formed source/drain regions and a gate structure. As will be discussed in greater detail below, epitaxial source/ drain regions and epitaxial materials will be formed in the first recesses 86 and the second recesses 87, while the first nanostructures 52A, 52B, and 52C will be replaced with corresponding gate structures. In addition, the first inner spacers 90 formed on the sidewalls of the dummy nanostructure 58 serve as an etch mask to protect end portions of the second nanostructure 54D during an etching process described in FIGS. 27A through 28D.

The inner spacer layer may be deposited by a conformal deposition process, such as CVD, ALD, or the like. The inner spacer layer may comprise a material such as silicon carbonitride (SiCN) or silicon oxycarbonitride (SiOCN). In other embodiments, silicon nitride or silicon oxynitride, or any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54, the outer sidewalls of the first inner spacers 90 may extend beyond or be recessed from sidewalls of the second nanostructures 54.

Figure 11B:
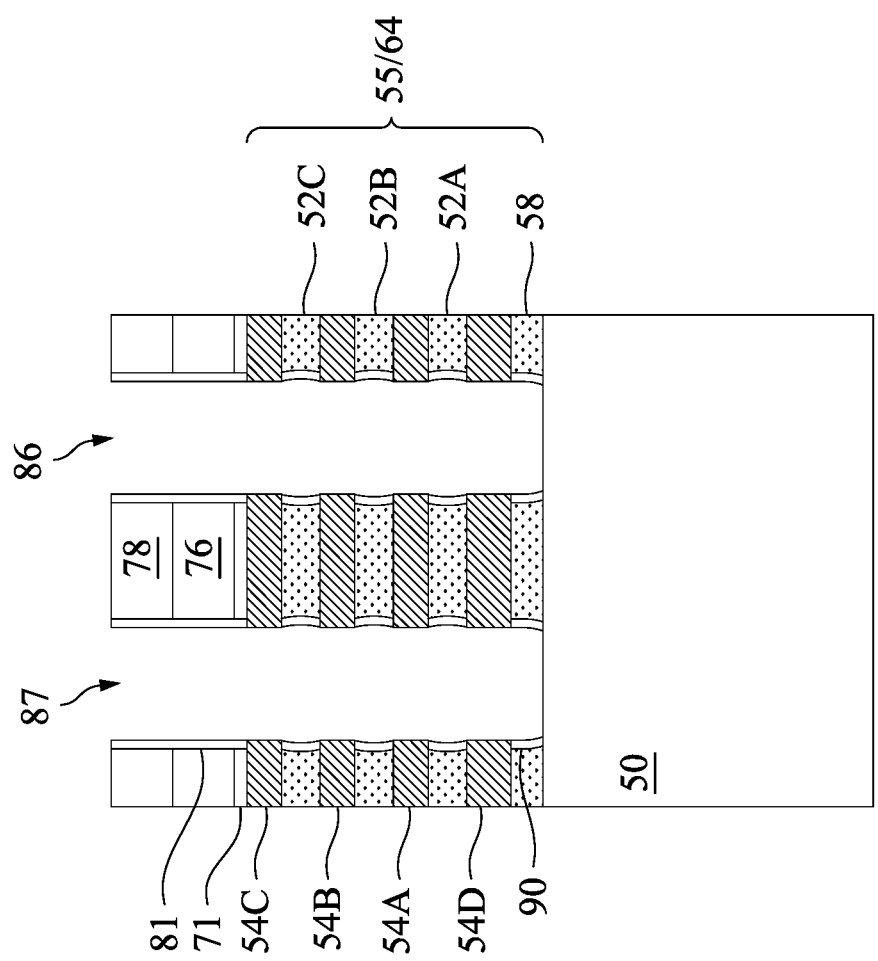

Moreover, although the outer sidewalls of the first inner spacers 90 are illustrated as being straight in FIG. 11A, the outer sidewalls of the first inner spacers 90 may be concave or convex. As an example, FIG. 11B illustrates an embodiment in which sidewalls of the first nanostructures 52 and the dummy nanostructure 58 are concave, outer sidewalls of the first inner spacers 90 are concave, and the first inner spacers 90 are recessed from sidewalls of the second nanostructures 54. The inner spacer layer may be etched by an anisotropic etching process, such as RIE, NBE, or the like. The first inner spacers 90 may be used to prevent damage to subsequently formed source/drain regions (discussed below with respect to FIGS. 13A through 13E) by subsequent etching processes, such as etching processes used to form gate structures.

Figure 12B:
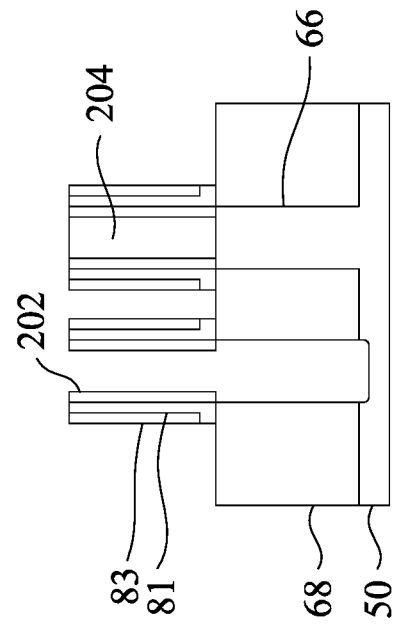
Figure 12A:
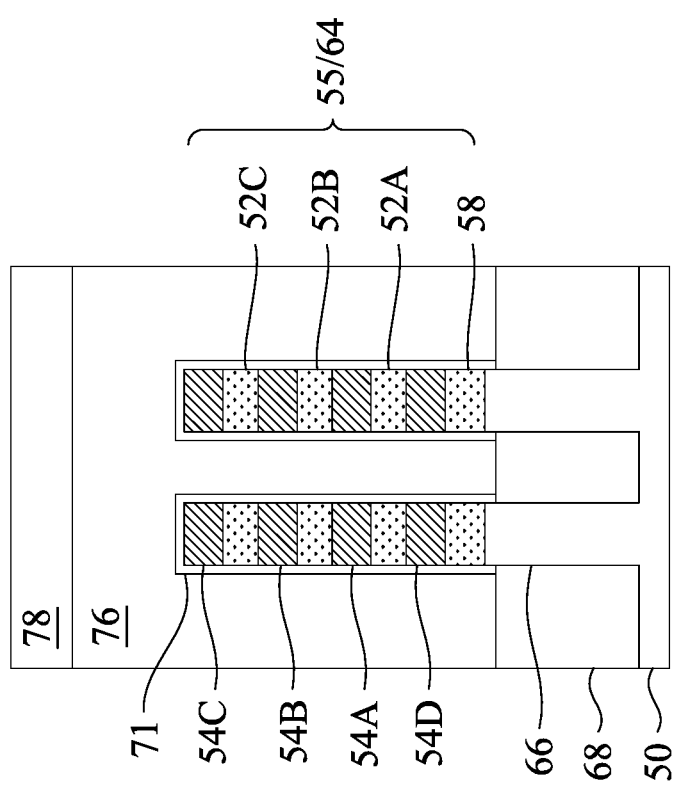
Figure 12C:
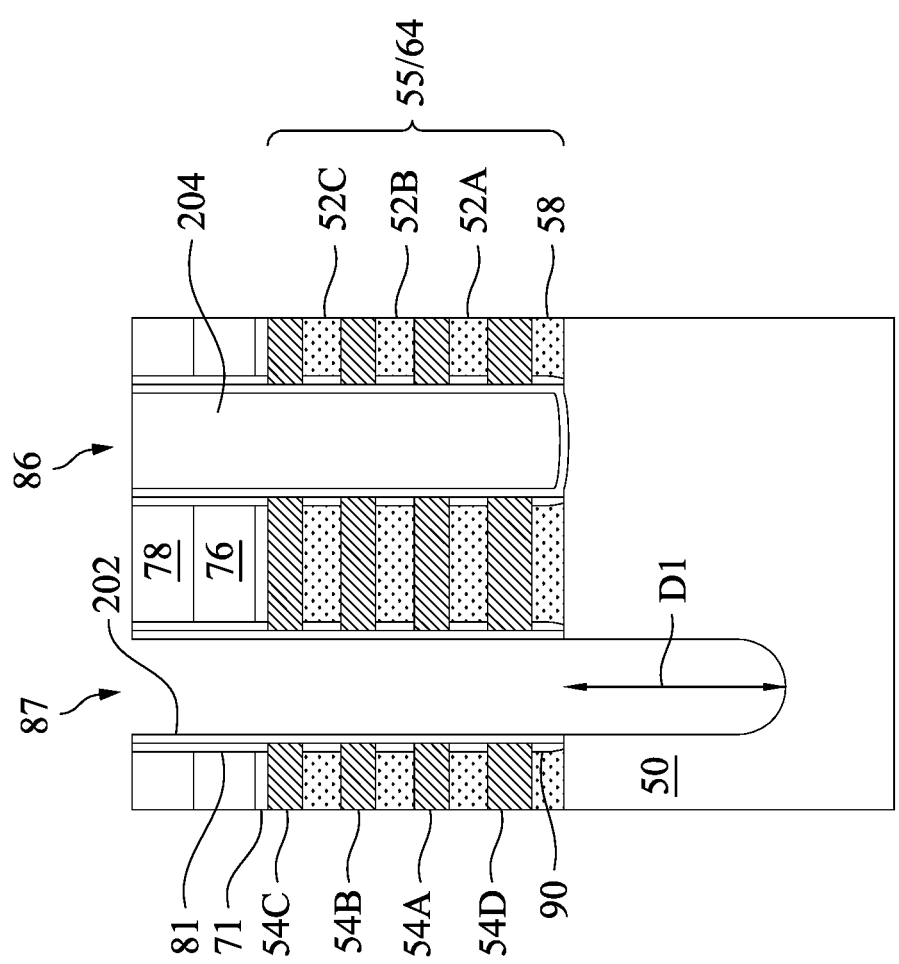

In FIGS. 12A through 12C, a dielectric liner 202 is formed in the first recesses 86 and second recesses 87. In some embodiments, the dielectric liner 202 is formed over the structure shown in FIG. 11A, and comprises silicon nitride, silicon oxide, silicon oxynitride, or the like. The dielectric liner 202 may be formed by an ALD, CVD, or the like process. Lateral portions of the dielectric liner 202 may then be etched using a suitable etching process, such as an isotropic etching process (e.g., a wet etching process), an anisotropic etching process (e.g., a dry etching process), or the like. A Bottom Anti-Reflective Coating (BARC) layer 204 may then be formed in the first recesses 86 to mask the first recesses 86 while the second recesses 87 are etched further using anisotropic etching processes, such as RIE, NBE, or the like, to extend the second recesses 87 to a desired depth. A single etch process or multiple etch processes may be used to etch the fins 66 and/or the substrate 50 to extend the second recesses 87. Timed etch processes may be used to stop the etching after the second recesses 87 reaches desired depths. The second recesses 87 may have a depth D1 below bottom surfaces of the dummy nanostructure 58 and the first recesses 86. The depth of the second recesses 87 may be selected to control the dimensions of subsequently formed backside vias. The dielectric liner 202 protects sidewalls of the first nanostructures 52, the dummy nanostructure 58, the second nanostructures 54, and the first inner spacers 90 from damage during the etching processes described in FIG. 12A through 12C.

Figure 13B:
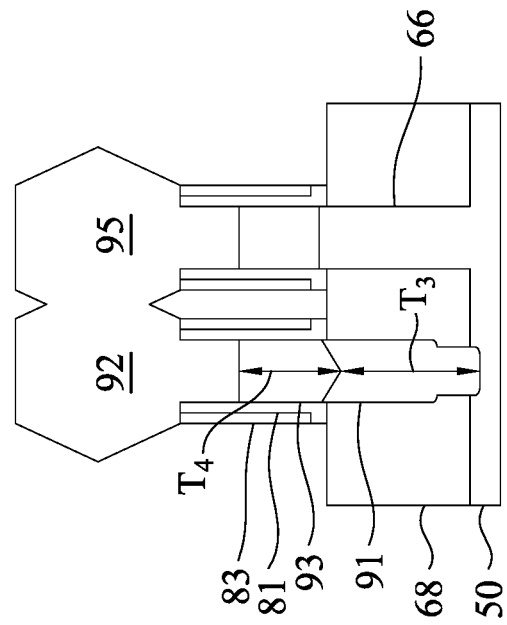
Figure 13A:
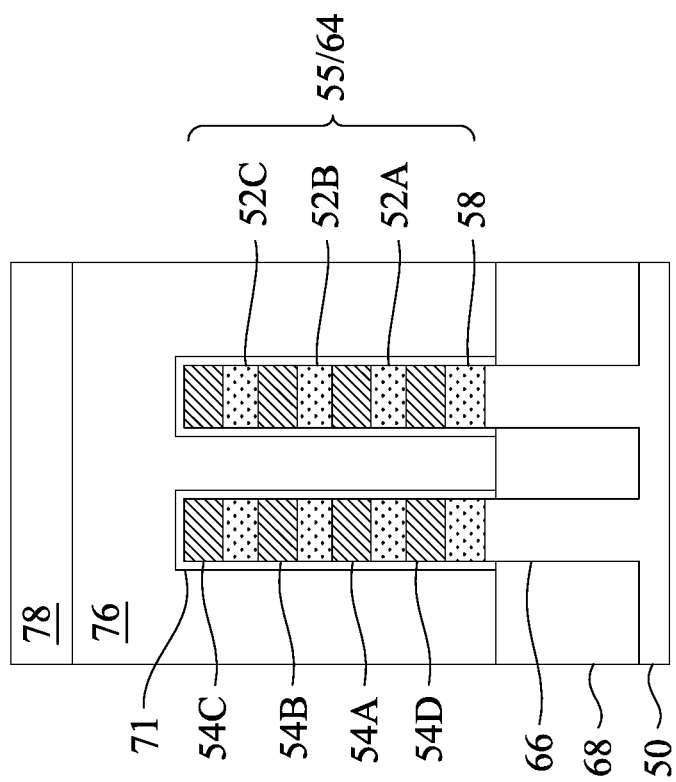
Figures 13C, 13D:
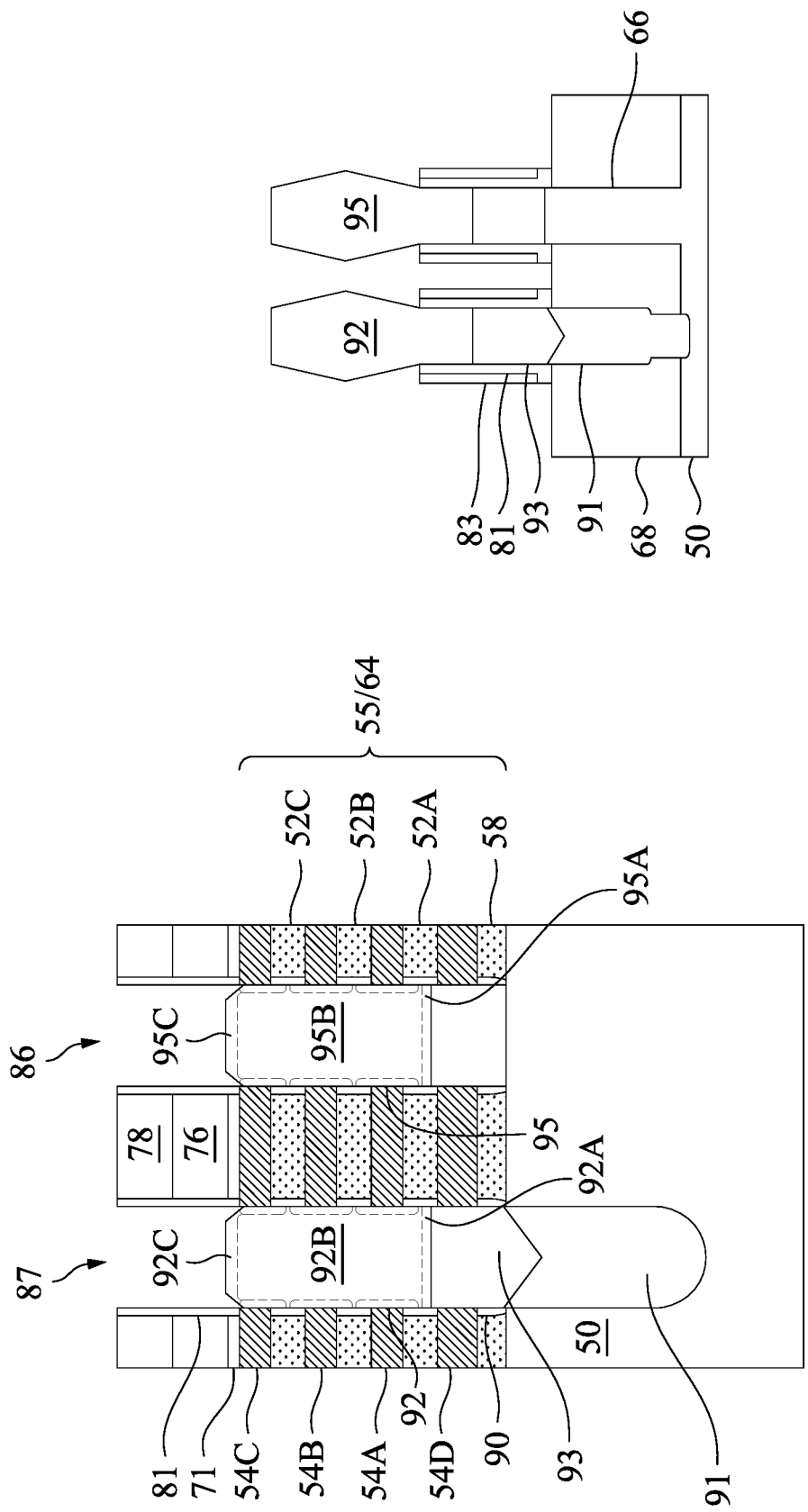

In FIGS. 13A through 13C, first epitaxial materials 91 are formed in the second recesses 87 while the BARC layer 204 is used to mask the first recesses 86. Once the first epitaxial materials 91 are formed to a desired height in the second recesses 87, the dielectric liner 202 is removed from the second recesses 87 by a suitable etching process and the BARC layer 204 and the dielectric liner 202 are removed from the first recesses 86 by a suitable etching process. Second epitaxial materials 93 are formed over the first epitaxial materials 91 in the second recesses 87, and second epitaxial materials 93 are formed in the first recesses 86. First epitaxial source/drain regions 92 are formed in the second recesses 87, and second epitaxial source/drain regions 95 are formed in the first recesses 86. In some embodiments, the first epitaxial materials 91 and the second epitaxial materials 93 in the second recesses 87 may be sacrificial materials, which are subsequently removed to form backside vias (such as the backside vias 130, discussed below with respect to FIGS. 32A through 32C). The first epitaxial materials 91 and the second epitaxial materials 93 may be epitaxially grown using a process such as chemical vapor deposition (CVD), atomic layer deposition (ALD), vapor phase epitaxy (VPE), molecular beam epitaxy (MBE), or the like. The first epitaxial materials 91 and the second epitaxial materials 93 may include any acceptable material, such as silicon germanium or the like.

The first epitaxial materials 91 and the second epitaxial materials 93 may be formed of materials having high etch selectivity to materials of the first epitaxial source/drain regions 92, the second epitaxial source/drain regions 95, the substrate 50, and dielectric layers (such as the STI regions 68). As such, the first epitaxial materials 91 and the second epitaxial materials 93 in the second recesses 87 may be removed and replaced with the backside vias without significantly removing the first epitaxial source/drain regions 92, the second epitaxial source/drain regions 95, the substrate 50, and the dielectric layers.

In some embodiments, the second epitaxial materials 93 may be formed of materials having a lower germanium concentration than the materials of the first epitaxial materials 91, and the dummy nanostructure 58 may be formed of materials having a lower germanium concentration than the second epitaxial materials 93. For example, an atomic concentration of germanium in the second epitaxial materials 93 may range from about 20% to about 25%, an atomic concentration of germanium in the first epitaxial materials 91 may range from about 20% to about 25%, and an atomic concentration of germanium in the dummy nanostructure 58 may range from about 20% to about 25%. The materials having the higher germanium concentrations may be etched at a higher rate as compared to the materials having the lower germanium concentrations. Forming the second epitaxial materials 93 of the materials having lower germanium concentrations and the first epitaxial materials 91 of the materials having higher germanium concentrations allows for the first epitaxial materials 91 to be etched at a higher etch rate than the second epitaxial materials 93, and the second epitaxial materials 93 may protect the epitaxial source/drain regions during a subsequent etching process used to remove the first epitaxial materials 91 and the second epitaxial materials 93 (discussed below with respect to FIGS. 31A through 31C) from the second recesses 87. In some embodiments, forming the first epitaxial materials 91 which are separated from the first epitaxial source/drain regions 92 (e.g., having higher germanium concentrations) provides efficiency benefits due to the high etch rate of the first epitaxial materials 91 with an intervening protective layer (e.g., the second epitaxial materials 93). Forming the second epitaxial materials 93 with a lower germanium concentration adjacent to the first epitaxial source/drain regions provides greater etch precision due to its lower etch rate. Providing both the first epitaxial materials 91 and the second epitaxial materials 93 allows for the first epitaxial materials 91 and the second epitaxial materials 93 to be removed quickly from the second recesses 87, while also preventing damage to the first epitaxial source/drain regions 92.

The thicknesses of the first epitaxial materials 91 and the second epitaxial materials 93 may be selected to control the dimensions of subsequently formed backside vias (such as the backside vias 130, discussed below with respect to FIGS. 32A through 32C). The first epitaxial source/drain regions 92 are then formed in the second recesses 87 and over the second epitaxial materials 93, and the second epitaxial source/drain regions 95 are formed in the first recesses 86 and over the second epitaxial materials 93. In some embodiments, the first epitaxial source/drain regions 92 and the second epitaxial source/drain regions 95 may exert stress on the second nanostructures 54A, 54B, and 54C thereby improving performance. As illustrated in FIG. 13C, the first epitaxial source/drain regions 92 are formed in the second recesses 87 and the second epitaxial source/drain regions 95 are formed in the first recesses 86 such that each dummy gate 76 is disposed between respective neighboring pairs of the first epitaxial source/drain regions 92/second epitaxial source/drain regions 95. In some embodiments, the first spacers 81 are used to separate the first epitaxial source/drain regions 92 and the second epitaxial source/drain regions 95 from the dummy gates 76 and the first inner spacers 90 are used to separate the first epitaxial source/drain regions 92 and the second epitaxial source/drain regions 95 from the first nanostructures 52A, 52B, and 52C by an appropriate lateral distance so that the first epitaxial source/drain regions 92 and the second epitaxial source/drain regions 95 do not short out with subsequently formed gates of the resulting nano-FETs. As illustrated in FIGS. 13B through 13E, bottom surfaces of the first epitaxial source/drain regions 92 may be disposed level with bottom surfaces of the second epitaxial source/drain regions 95.

The first epitaxial source/drain regions 92 and the second epitaxial source/drain regions 95 in the n-type region 50N, e.g., the NMOS region, may be formed by masking the p-type region 50P, e.g., the PMOS region. Then, the first epitaxial source/drain regions 92 and the second epitaxial source/drain regions 95 are epitaxially grown in the second recesses 87 and the first recesses 86, respectively, in the n-type region 50N. The first epitaxial source/drain regions 92 and the second epitaxial source/drain regions 95 may include any acceptable material appropriate for n-type nano-FETs. For example, if the second nanostructures 54 are silicon, the first epitaxial source/drain regions 92 and the second epitaxial source/drain regions 95 may include materials exerting a tensile strain on the second nanostructures 54A, 54B, and 54C, such as silicon, silicon carbide, phosphorous doped silicon carbide, silicon phosphide, or the like. The first epitaxial source/drain regions 92 and the second epitaxial source/drain regions 95 may have surfaces raised from respective upper surfaces of the nanostructures 55 and may have facets.

Moreover, the first epitaxial source/drain regions 92 in the n-type region 50N may include materials having a high etch selectivity to the materials of the first epitaxial materials 91 and the second epitaxial materials 93. For example, the first epitaxial source/drain regions 92 may have lower germanium concentrations than the first epitaxial materials 91 and the second epitaxial materials 93, such that the first epitaxial materials 91 and the second epitaxial materials 93 may be removed without significantly removing the first epitaxial source/drain regions 92.

The first epitaxial source/drain regions 92 and the second epitaxial source/drain regions 95 in the p-type region 50P, e.g., the PMOS region, may be formed by masking the n-type region 50N, e.g., the NMOS region. Then, the first epitaxial source/drain regions 92 and the second epitaxial source/drain regions 95 are epitaxially grown in the second recesses 87 and the first recesses 86, respectively, in the p-type region 50P. The first epitaxial source/drain regions 92 and the second epitaxial source/drain regions 95 may include any acceptable material appropriate for p-type nano-FETs. For example, if the first nanostructures 52 are silicon germanium, the first epitaxial source/drain regions 92 and the second epitaxial source/drain regions 95 may comprise materials exerting a compressive strain on the first nanostructures 52A, 52B, and 52C, such as silicon-germanium, boron doped silicon-germanium, germanium, germanium tin, or the like. The first epitaxial source/drain regions 92 and the second epitaxial source/drain regions 95 may also have surfaces raised from respective surfaces of the nanostructures 55 and may have facets.

Moreover, the first epitaxial source/drain regions 92 in the p-type region 50P may include materials having a high etch selectivity to the materials of the first epitaxial materials 91 and the second epitaxial materials 93. For example, the first epitaxial source/drain regions 92 may have lower germanium concentrations than the first epitaxial materials 91 and the second epitaxial materials 93. In some embodiments, an atomic concentration of germanium in the first epitaxial source/drain regions 92 may range from about 15% to about 50%. In some embodiments, portions of the first epitaxial source/drain regions 92 adjacent the second epitaxial materials 93 (such as the first semiconductor material layer 92A, discussed in further detail below) may have lower concentrations of germanium and a remainder of the first epitaxial source/drain regions 92 may have higher germanium concentrations. For example, the portions of the first epitaxial source/drain regions 92 adjacent the second epitaxial materials 93 may have atomic concentrations of germanium ranging from about 10% to about 30%, while remaining portions of the first epitaxial source/drain regions 92 have atomic concentrations of germanium ranging from about 15% to about 50%. As such, the first epitaxial materials 91 and the second epitaxial materials 93 may be removed without significantly removing the first epitaxial source/drain regions 92.

The first epitaxial source/drain regions 92, the second epitaxial source/drain regions 95, the first nanostructures 52, the second nanostructures 54, the dummy nanostructure 58, and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed. In some embodiments, the first epitaxial source/drain regions 92 and the second epitaxial source/drain regions 95 may be in situ doped during growth.

As a result of the epitaxy processes used to form the first epitaxial source/drain regions 92 and the second epitaxial source/drain regions 95 in the n-type region 50N and the p-type region 50P, upper surfaces of the first epitaxial source/drain regions 92 and the second epitaxial source/drain regions 95 have facets which expand laterally outward beyond sidewalls of the nanostructures 55. In some embodiments, these facets cause adjacent first epitaxial source/drain regions 92 and the second epitaxial source/drain regions 95 of a same nano-FET to merge as illustrated by FIG. 13B. In other embodiments, adjacent first epitaxial source/drain regions 92 and the second epitaxial source/drain regions 95 remain separated after the epitaxy process is completed as illustrated by FIG. 13D. In the embodiments illustrated in FIGS. 13B and 13D, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 68.

The first epitaxial source/drain regions 92 and the second epitaxial source/drain regions 95 may comprise one or more semiconductor material layers. For example, the first epitaxial source/drain regions 92 may comprise a first semiconductor material layer 92A, a second semiconductor material layer 92B, and a third semiconductor material layer 92C. The second epitaxial source/drain regions 95 may comprise a first semiconductor material layer 95A, a second semiconductor material layer 95B, and a third semiconductor material layer 95C. Any number of semiconductor material layers may be used for the first epitaxial source/drain regions 92 and the second epitaxial source/drain regions 95. Each of the first semiconductor material layers 92A/95A, the second semiconductor material layers 92B/95B, and the third semiconductor material layers 92C/95C may be formed of different semiconductor materials and may be doped to different dopant concentrations. In some embodiments, the first semiconductor material layers 92A/95A may have a dopant concentration less than the second semiconductor material layers 92B/95B and greater than the third semiconductor material layers 92C/95C. In some embodiments, the first semiconductor material layer 92A may have a lower germanium concentration than the second semiconductor material layer 92B and the third semiconductor material layer 92C in order to provide good etch selectivity between the first semiconductor material layer 92A and the first epitaxial materials 91 and the second epitaxial materials 93. In embodiments in which the first epitaxial source/drain regions 92 and the second epitaxial source/drain regions 95 comprise three semiconductor material layers, the first semiconductor material layers 92A/95A may be deposited, the second semiconductor material layers 92B/95B may be deposited over the first semiconductor material layers 92A/95A, and the third semiconductor material layers 92C/95C may be deposited over the second semiconductor material layers 92B/95B.

Figure 13E:
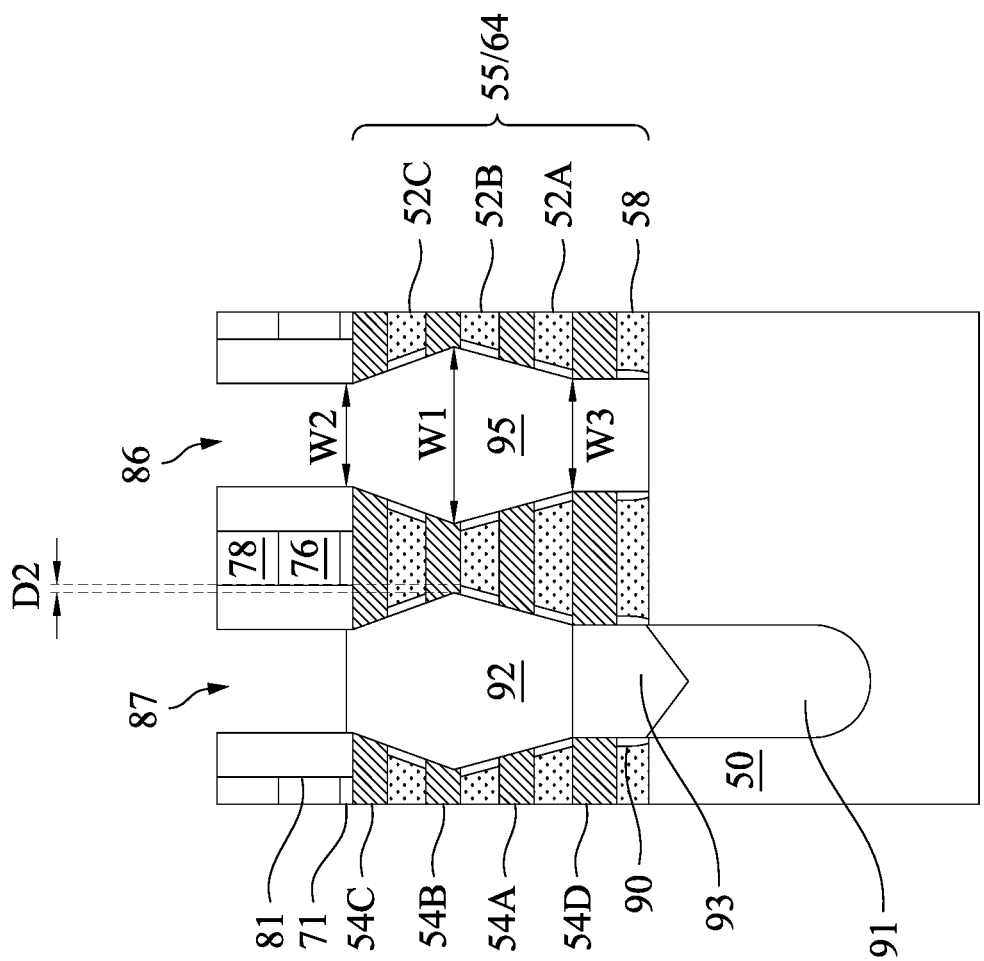

FIG. 13E illustrates an embodiment with enlarged first epitaxial source/drain regions 92 and enlarged second epitaxial source/drain regions 95 to allow for a reduced tip proximity. The tip proximity may refer to a minimum lateral distance between a particular epitaxial source/drain region 92/95 and an adjacent dummy gate 76 (e.g., distance D2 in FIG. 13E). To form the enlarged first epitaxial source/drain regions 92 and enlarged second epitaxial source/drain regions 95, first recesses 86 and second recesses 87 are formed in the nanostructures 55 in the structures of FIGS. 8A through 8C, in accordance with some embodiments. Upper portions of the first recesses 86 and the second recesses 87 may be expanded compared to lower portions of the first recesses 86 and the second recesses 87. The upper portions of the first recesses 86 and the second recesses 87 may be formed by an etching process using tetramethyl ammonium hydroxide (TMAH), or the like. Epitaxial materials and epitaxial source/drain regions are then subsequently formed in the first recesses 86 and the second recesses 87. The enlarged first epitaxial source/drain regions 92 and the enlarged second epitaxial source/drain regions 95 are formed in the upper portions of the second recesses 87 and the first recesses 86. In some embodiments the enlarged first epitaxial source/drain regions 92 and enlarged second epitaxial source/drain regions 95 may have facets. In some embodiments, a width W1 of each of the enlarged first epitaxial source/drain regions 92 and the enlarged second epitaxial source/drain regions 95 may be larger than a width W2 of a topmost portion of each of the enlarged first epitaxial source/drain regions 92 and the enlarged second epitaxial source/drain regions 95. The width W1 of each of the enlarged first epitaxial source/drain regions 92 and the enlarged second epitaxial source/drain regions 95 may also be larger than a width W3 of a bottommost portion of each of the enlarged first epitaxial source/drain regions 92 and the enlarged second epitaxial source/drain regions 95.

Figure 14B:
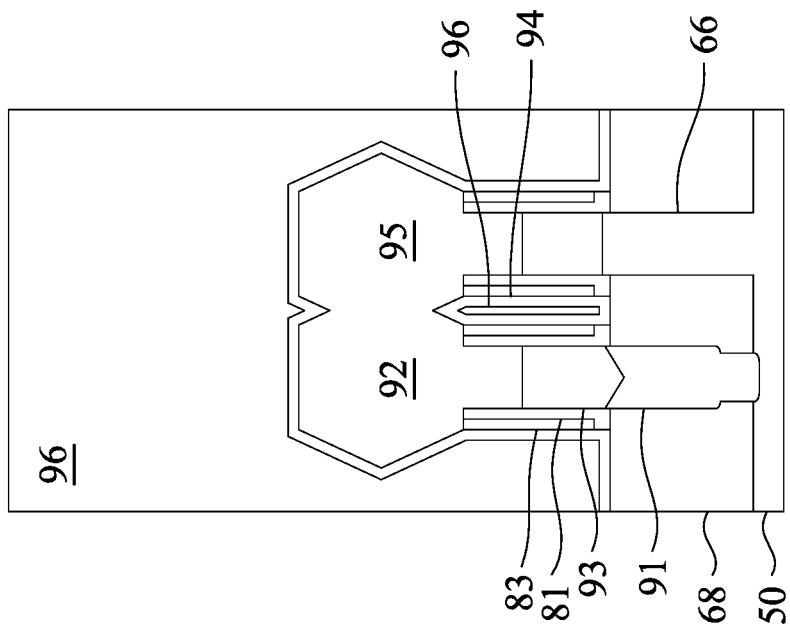
Figure 14A:
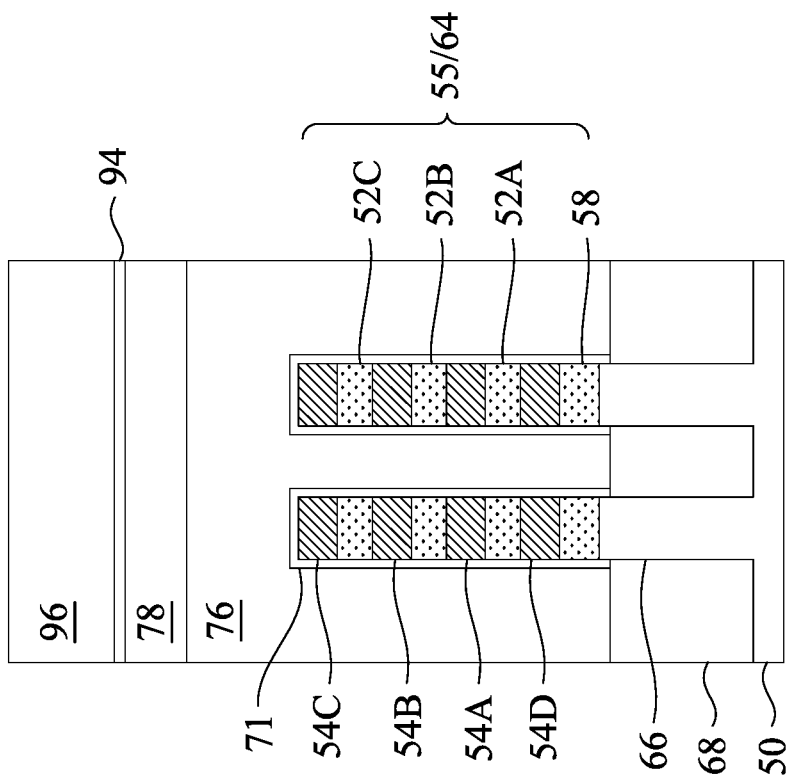
Figure 14C:
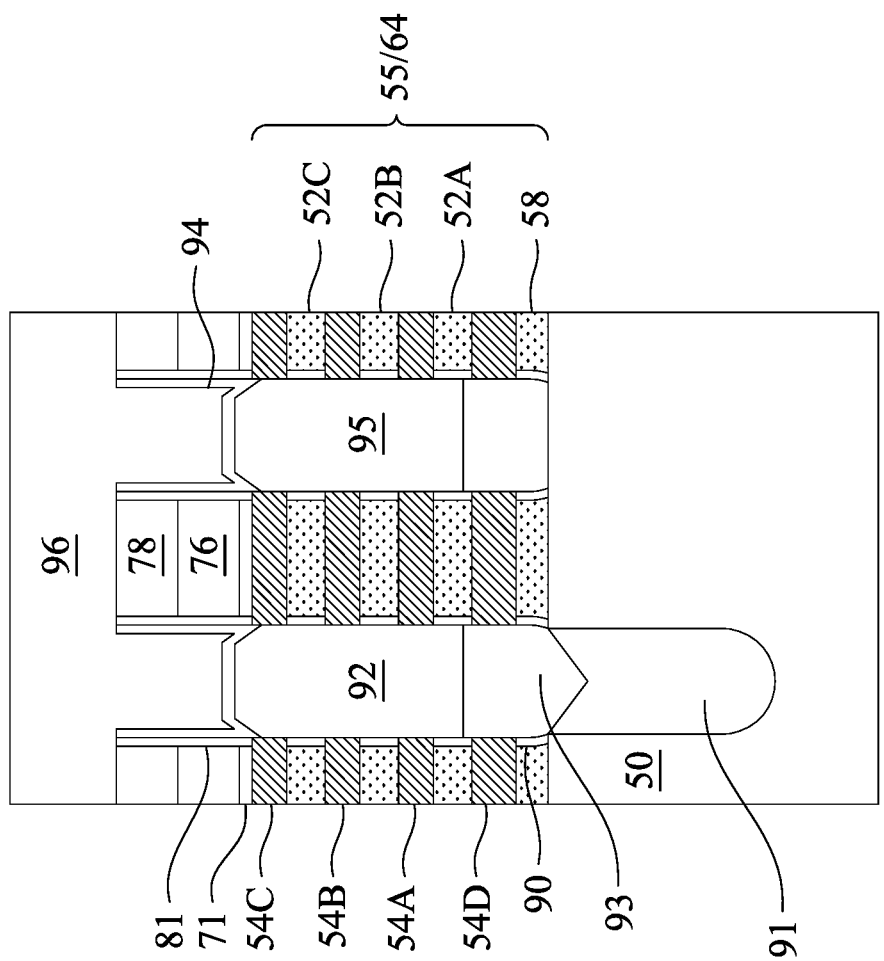

In FIGS. 14A through 14C, a first interlayer dielectric (ILD) 96 is deposited over the structure illustrated in FIGS. 13A through 13C. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the first epitaxial source/drain regions 92, the second epitaxial source/drain regions 95, the masks 78, and the first spacers 81. The CESL 94 may comprise a dielectric material, such as, silicon nitride, silicon oxide, silicon oxynitride, or the like, having a different etch rate than the material of the overlying first ILD 96.

Figure 15B:
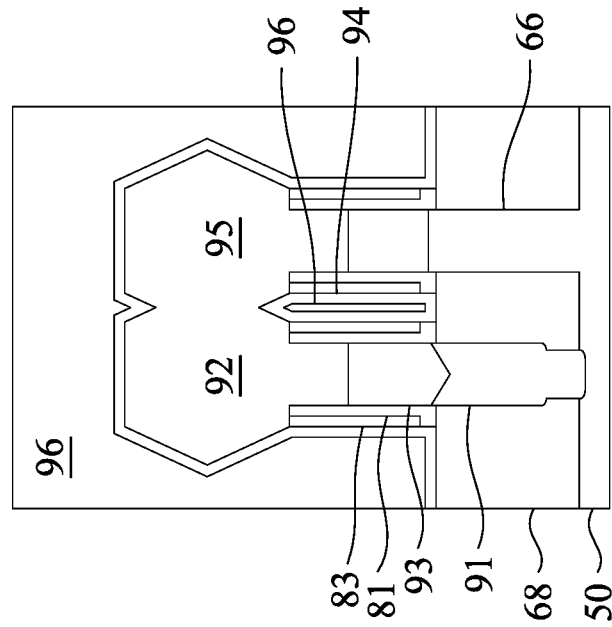
Figure 15A:
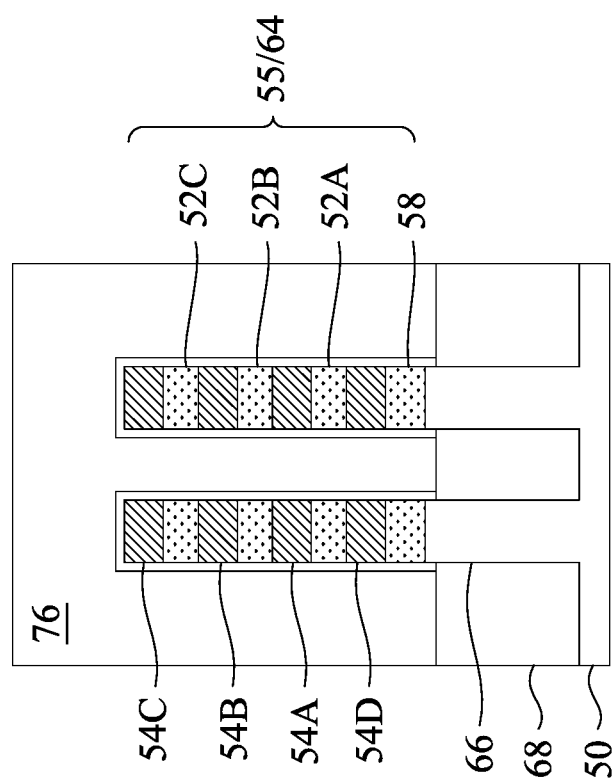
Figure 15C:
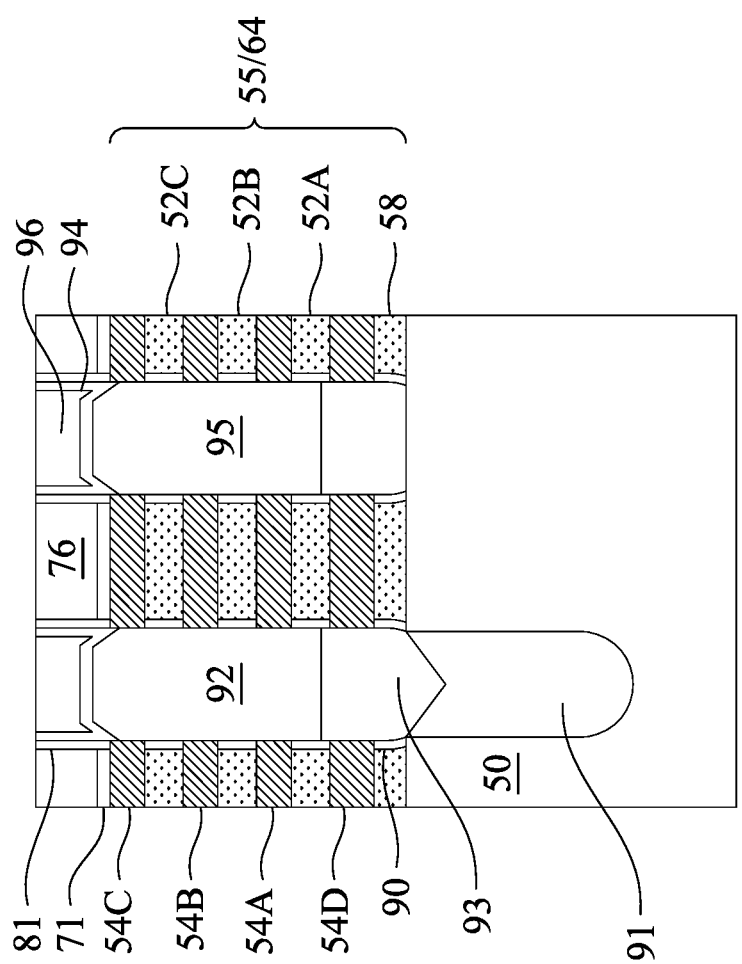

In FIGS. 15A through 15C, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with top surface of the masks 78 and the first spacers 81.

Figure 16B:
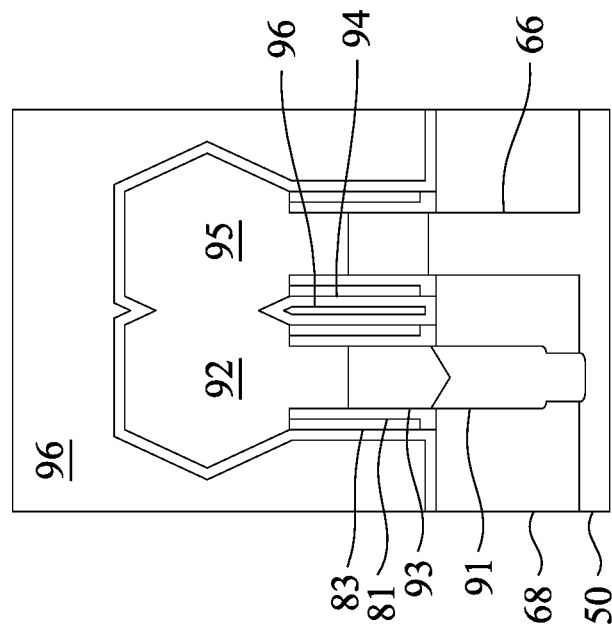
Figure 16A:
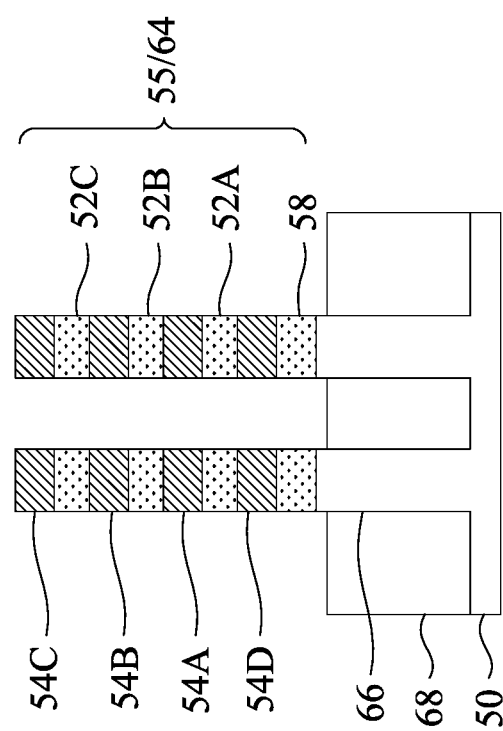
Figure 16C:
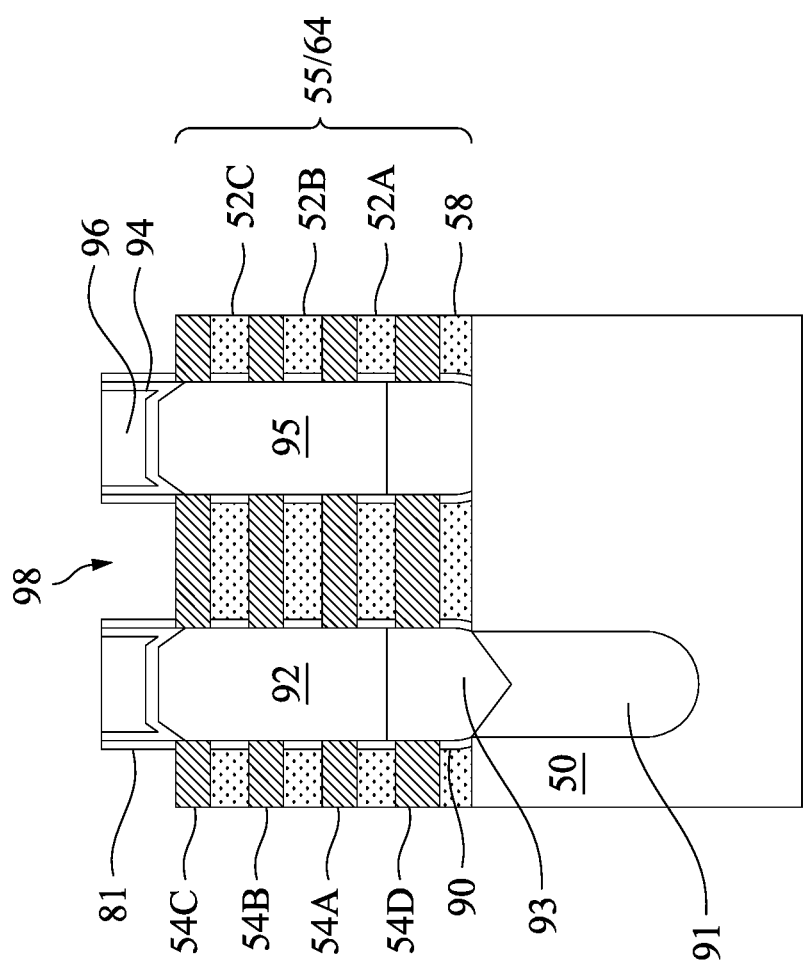

In FIGS. 16A through 16C, the dummy gates 76, and the masks 78 if present, are removed in one or more etching steps, so that third recesses 98 are formed. Portions of the dummy gate dielectrics 71 in the third recesses 98 are also be removed. In some embodiments, the dummy gates 76 and the dummy gate dielectrics 71 are removed by an anisotropic dry etch process. For example, the etching process may include a dry etch process using reaction gas(es) that selectively etch the dummy gates 76 at a faster rate than the first ILD 96 or the first spacers 81. Each of the third recess 98 exposes and/or overlies portions of nanostructures 55, which act as channel regions in subsequently completed nanoFETs. Portions of the nanostructures 55 which act as the channel regions are disposed between neighboring pairs of the first epitaxial source/drain regions 92 and the second epitaxial source/drain regions 95. During the removal, the dummy gate dielectrics 71 may be used as etch stop layers when the dummy gates 76 are etched. The dummy gate dielectrics 71 may then be removed after the removal of the dummy gates 76.

Figure 17B:
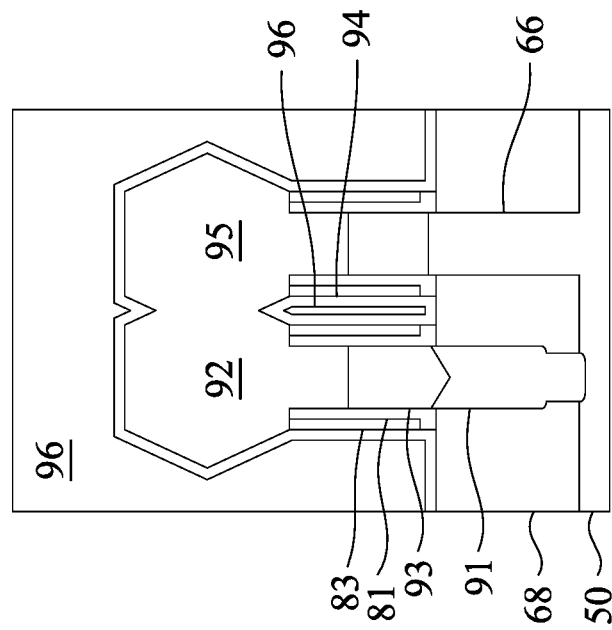
Figure 17A:
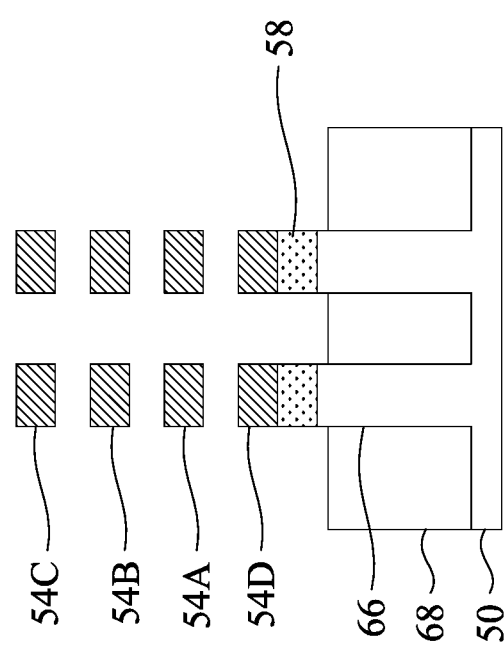
Figure 17C:
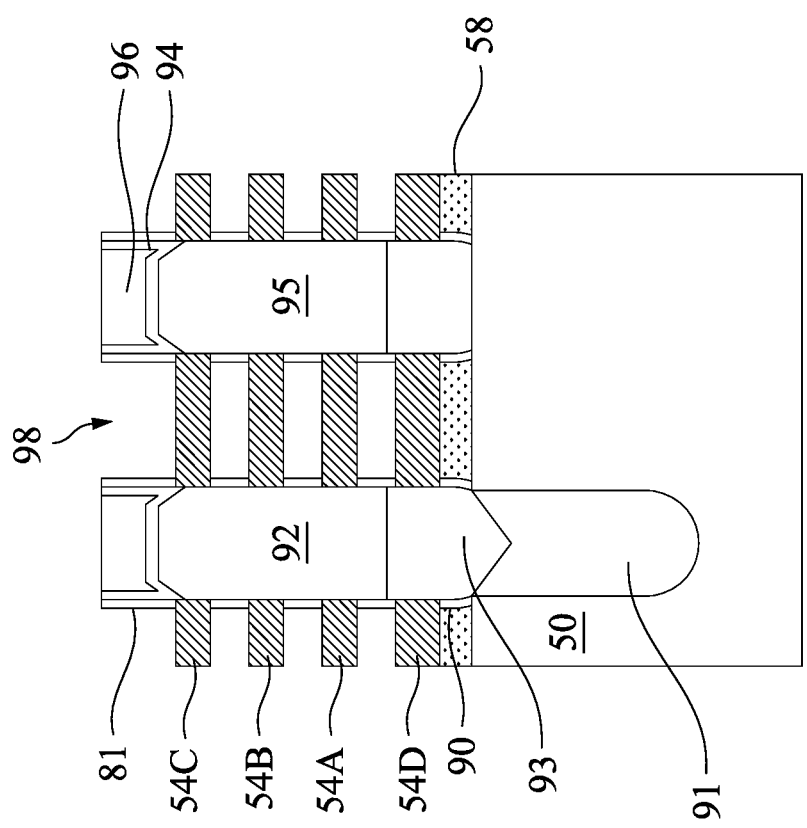

In FIGS. 17A through 17C, the first nanostructures 52A, 52B, and 52C are removed extending the third recesses 98. The first nanostructures 52A, 52B, and 52C may be removed by performing an isotropic etching process such as wet etching or the like using etchants which are selective to the materials of the first nanostructures 52A, 52B, and 52C while the dummy nanostructure 58, second nanostructures 54, the substrate 50, the STI regions 68 remain relatively unetched as compared to the first nanostructures 52A, 52B, and 52C. In embodiments in which the first nanostructures 52 include, e.g., SiGe, and the dummy nanostructure 58 has a germanium concentration that is lower than a germanium concentration of the first nanostructures 52A, 52B, and 52C, and the second nanostructures 54 include, e.g., Si or SiC, tetramethylammonium hydroxide (TMAH), ammonium hydroxide (NH$_4$OH), or the like may be used to remove the first nanostructures 52A, 52B, 52C.

Figure 18B:
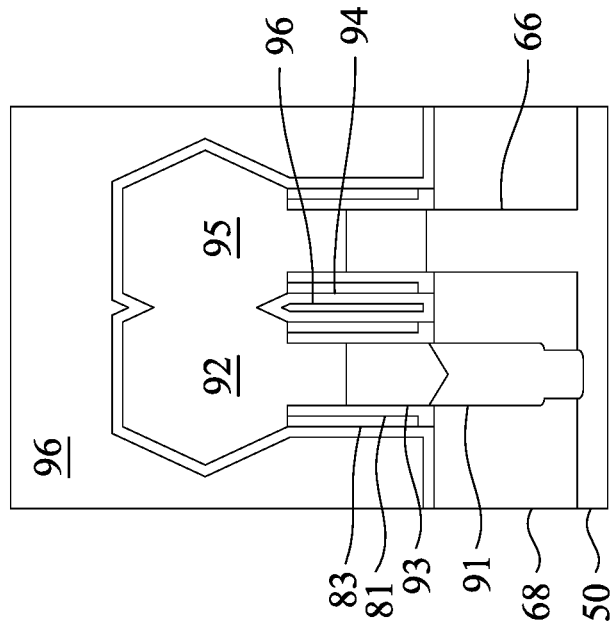
Figure 18A:
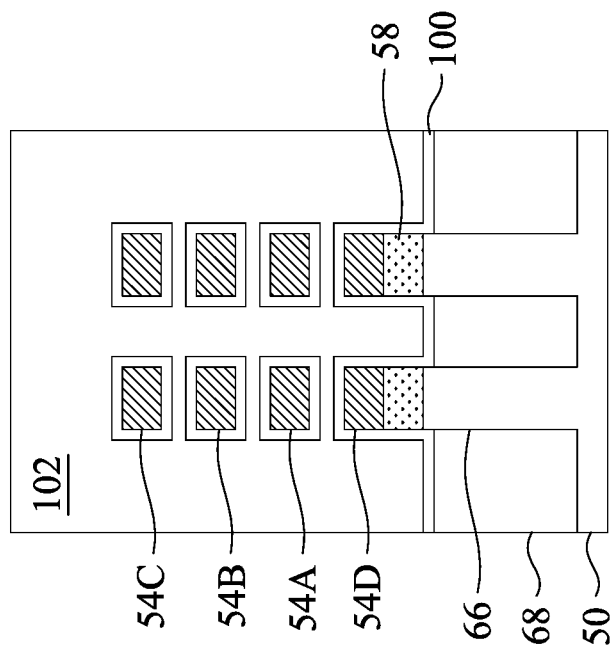
Figure 18C:
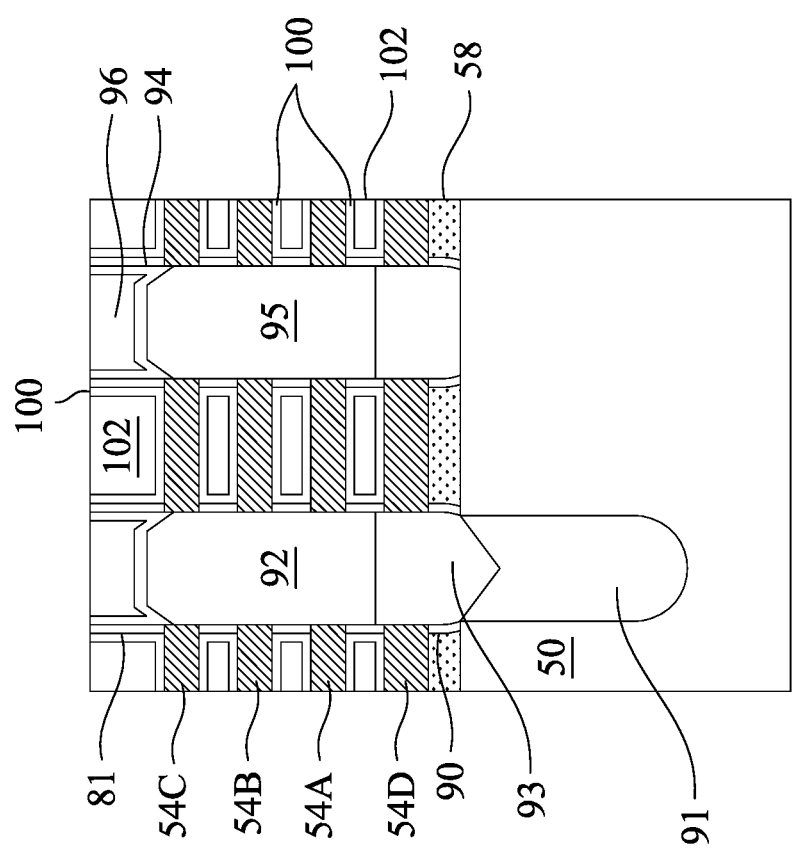

In FIGS. 18A through 18C, gate dielectric layers 100 and gate electrodes 102 are formed for replacement gates. The gate dielectric layers 100 are deposited conformally in the third recesses 98. The gate dielectric layers 100 may be formed on top surfaces, sidewalls, and bottom surfaces of the second nanostructures 54A, 54B, and 54C, top surfaces and sidewalls of the second nanostructures 54D, as well as sidewalls of the dummy nanostructure 58. The gate dielectric layers 100 may also be deposited on top surfaces of the first ILD 96, the CESL 94, the first spacers 81, and the STI regions 68 and on sidewalls of the first spacers 81 and the first inner spacers 90.

In accordance with some embodiments, the gate dielectric layers 100 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 100 include a high-k dielectric material, and in these embodiments, the gate dielectric layers 100 may have a k-value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the third recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 18A and 18C, the gate electrodes 102 may comprise any number of liner layers, any number of work function tuning layers, and a fill material. Any combination of the layers which make up the gate electrodes 102 may be deposited between adjacent ones of the second nanostructures 54.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the third recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Figure 19B:
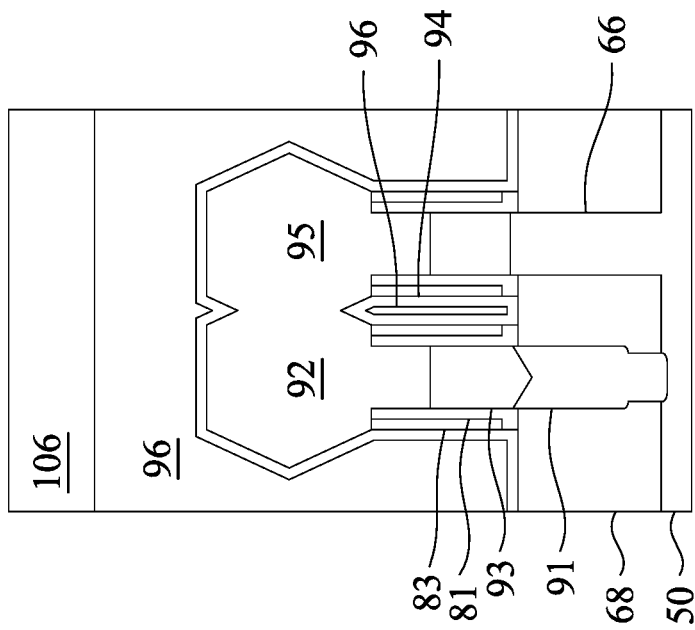
Figure 19A:
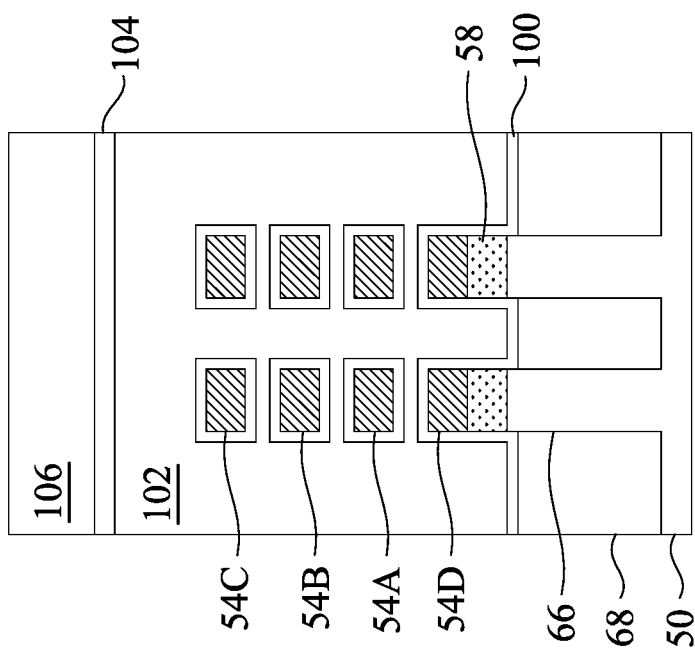
Figure 19C:
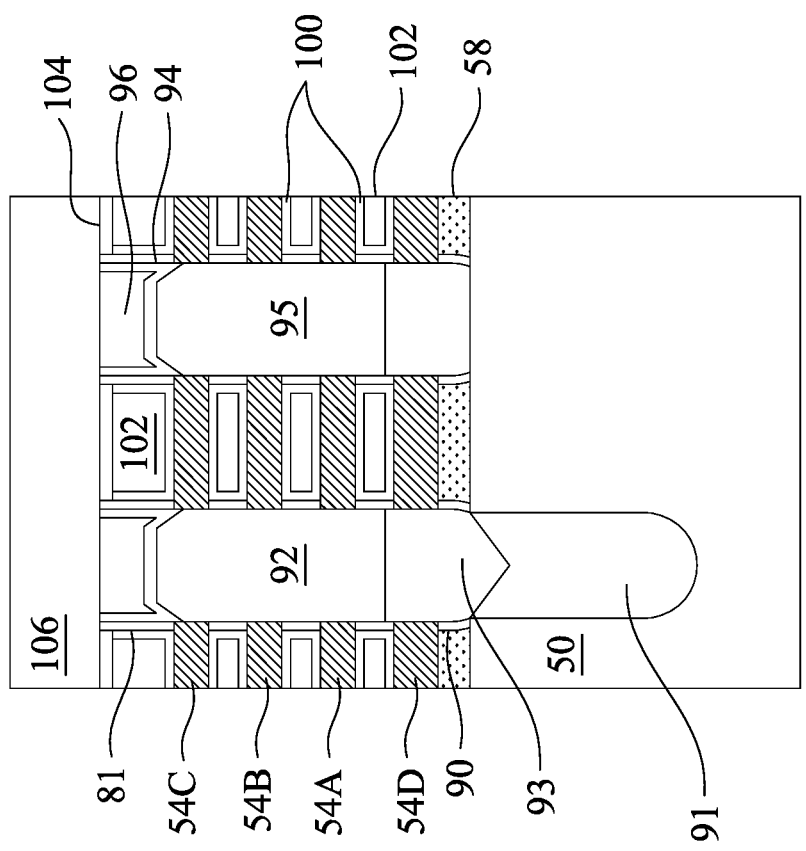

In FIGS. 19A through 19C, the gate structures (including the gate dielectric layers 100 and the corresponding overlying gate electrodes 102) are recessed, so that recess are formed directly over the gate structures and between opposing portions of first spacers 81. Gate masks 104 comprising one or more layers of dielectric material, such as silicon nitride, silicon oxynitride, or the like, are filled in the recesses, followed by a planarization process to remove excess portions of the dielectric material extending over the first ILD 96. Subsequently formed gate contacts (such as the gate contacts 114, discussed below with respect to FIGS. 21A through 21C) penetrate through the gate masks 104 to contact the top surfaces of the recessed gate electrodes 102.

As further illustrated by FIGS. 19A through 19C, a second ILD 106 is deposited over the first ILD 96 and over the gate masks 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 20B:
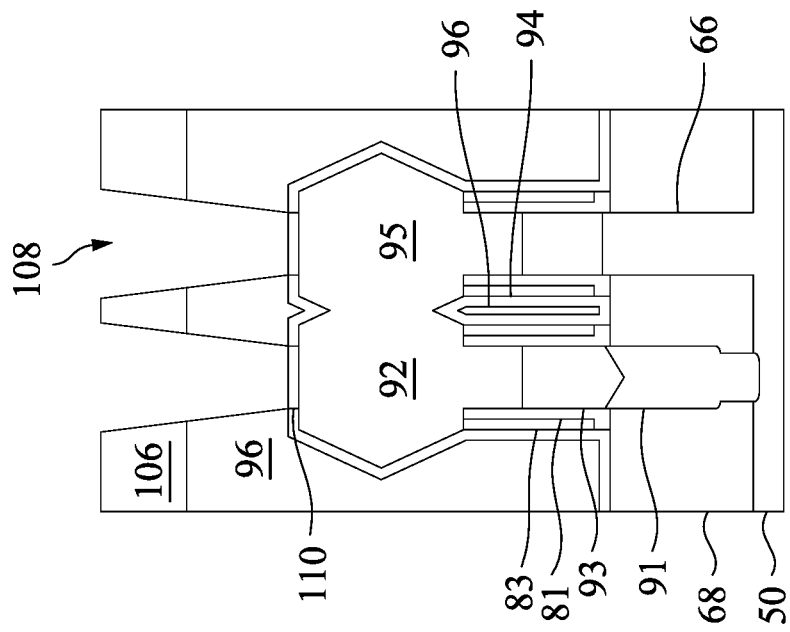
Figure 20A:
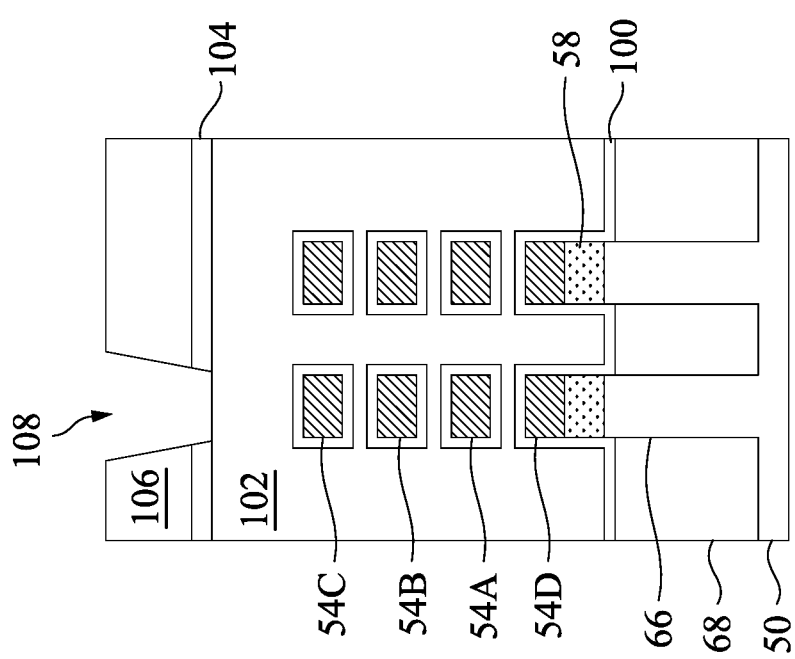
Figure 20C:
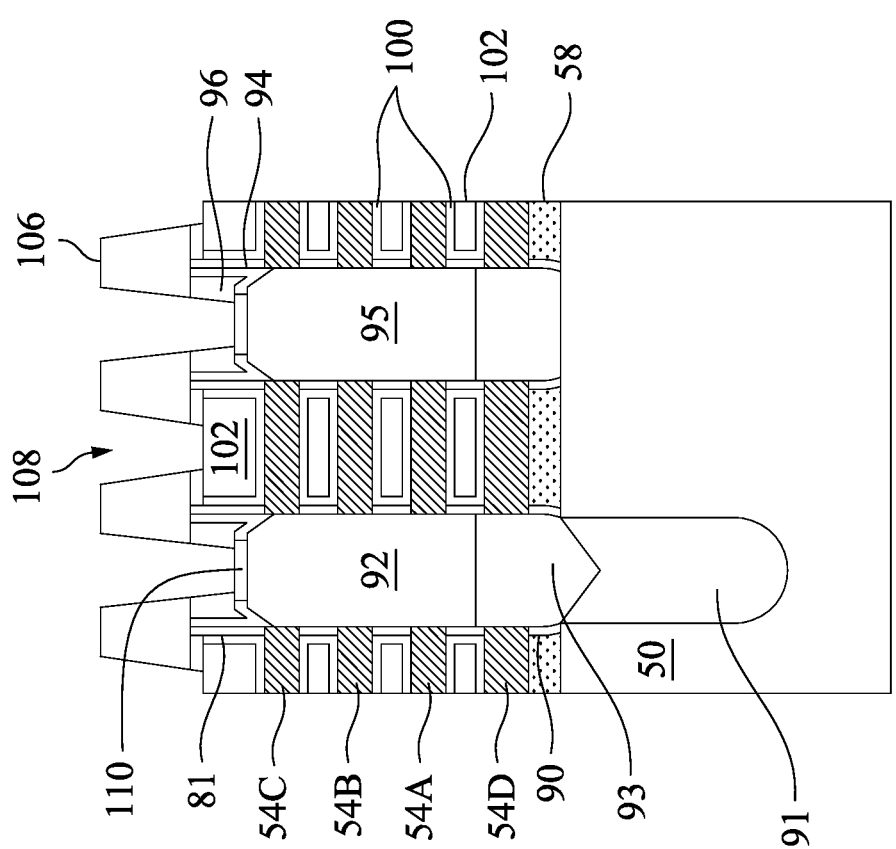

In FIGS. 20A through 20C, the second ILD 106, the first ILD 96, the CESL 94, and the gate masks 104 are etched to form fourth recesses 108 exposing surfaces of the first epitaxial source/drain regions 92, the second epitaxial source/drain regions 95, and/or the gate structures. The fourth recesses 108 may be formed by etching using an anisotropic etching process, such as RIE, NBE, or the like. In some embodiments, the fourth recesses 108 may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the fourth recesses 108 extend into the first epitaxial source/drain regions 92, the second epitaxial source/drain regions 95, and/or the gate structures, and a bottom of the fourth recesses 108 may be level with (e.g., at a same level, or having a same distance from the substrate 50), or lower than (e.g., closer to the substrate 50) the first epitaxial source/drain regions 92, the second epitaxial source/drain regions 95, and/or the gate structures. Although FIG. 20C illustrates the fourth recesses 108 as exposing the first epitaxial source/drain regions 92, the second epitaxial source/drain regions 95, and the gate structures in a same cross-section, in various embodiments, the first epitaxial source/drain regions 92, the second epitaxial source/drain regions 95, and the gate structures may be exposed in different cross-sections, thereby reducing the risk of shorting subsequently formed contacts.

After the fourth recesses 108 are formed, first silicide regions 110 are formed over the first epitaxial source/drain regions 92 and the second epitaxial source/drain regions 95. In some embodiments, the first silicide regions 110 are formed by first depositing a metal (not separately illustrated) capable of reacting with the semiconductor materials of the underlying first epitaxial source/drain regions 92 and the second epitaxial source/drain regions 95 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the first epitaxial source/drain regions 92 and the second epitaxial source/drain regions 95, then performing a thermal anneal process to form the first silicide regions 110. The un-reacted portions of the deposited metal are then removed, e.g., by an etching process. Although the first silicide regions 110 are referred to as silicide regions, the first silicide regions 110 may also be germanide regions, or silicon germanide regions (e.g., regions comprising silicide and germanide). In an embodiment, the first silicide regions 110 comprise TiSi and have thicknesses ranging from about 2 nm to about 10 nm.

Figure 21B:
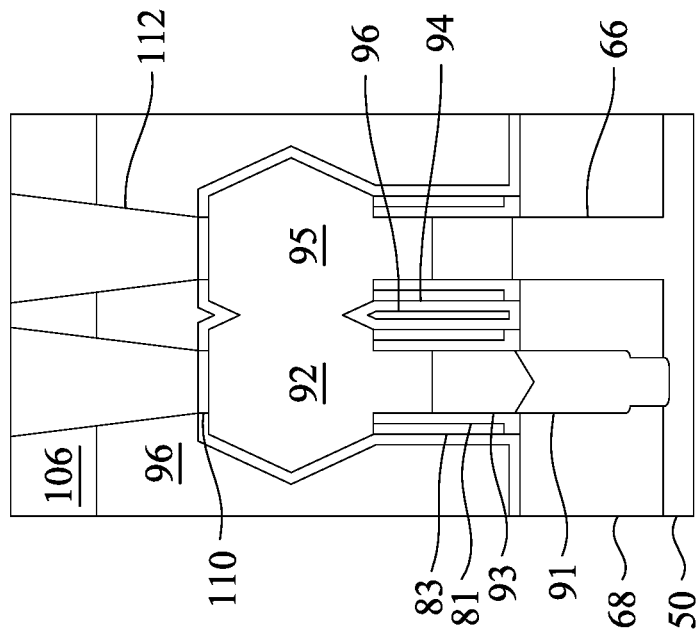
Figure 21A:
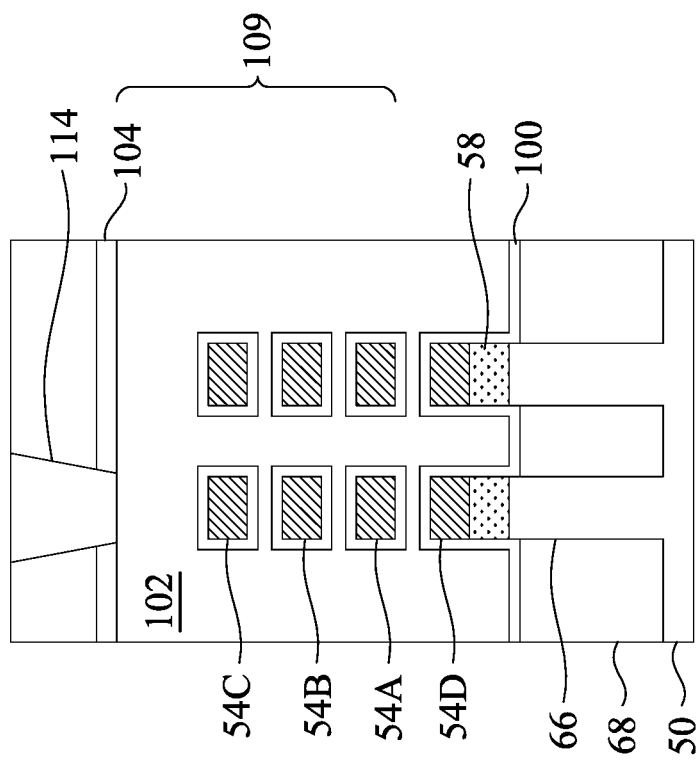
Figure 21C:
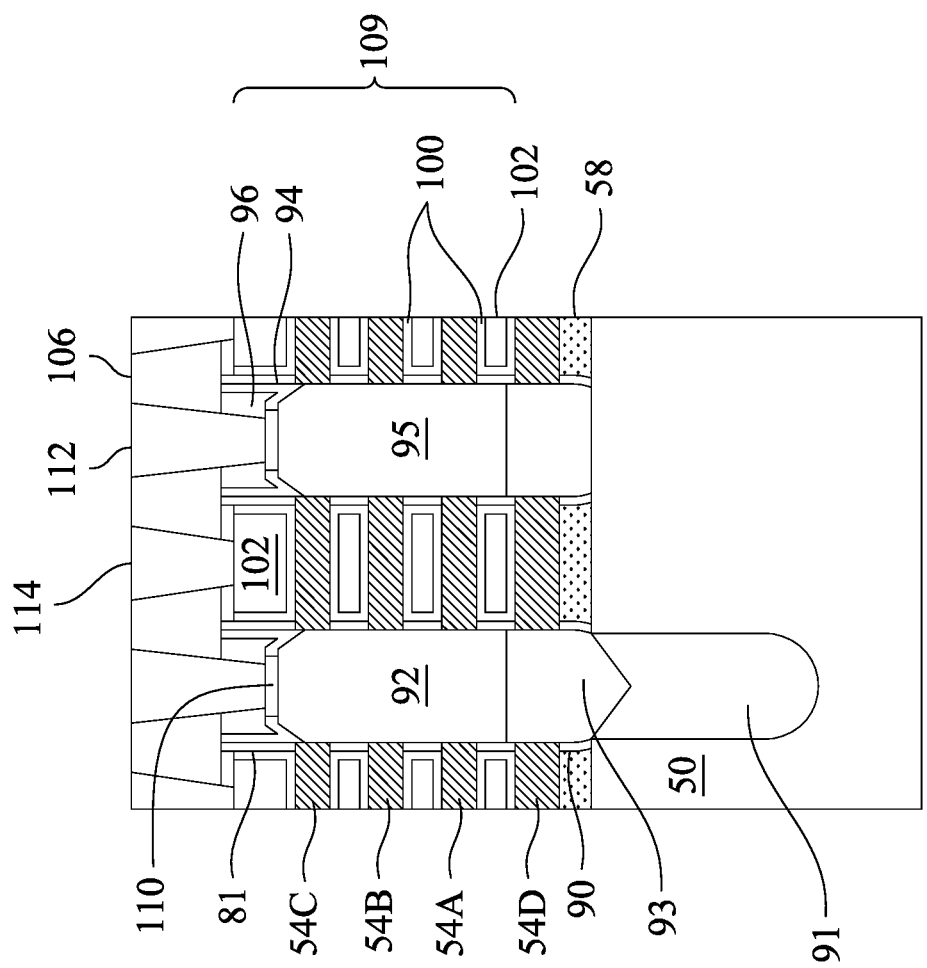

In FIGS. 21A through 21C, source/drain contacts 112 and gate contacts 114 (also referred to as contact plugs) are formed in the fourth recesses 108. The source/drain contacts 112 and the gate contacts 114 may each comprise one or more layers, such as barrier layers, diffusion layers, and fill materials. For example, in some embodiments, the source/drain contacts 112 and the gate contacts 114 each include a barrier layer and a conductive material, and are each electrically coupled to an underlying conductive feature (e.g., a gate electrode 102 and/or a first silicide region 110). The gate contacts 114 are electrically coupled to the gate electrodes 102 and the source/drain contacts 112 are electrically coupled to the first epitaxial source/drain regions 92 and the second epitaxial source/drain regions 95 through the first silicide regions 110. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from surfaces of the second ILD 106. The first epitaxial source/drain regions 92, the second epitaxial source/drain regions 95, the second nanostructures 54A, 54B, and 54C, and the gate structures (including the gate dielectric layers 100 and the gate electrodes 102) may collectively be referred to as transistor structures 109. The transistor structures 109 may be formed in a device layer, with a first interconnect structure (such as the front-side interconnect structure 120, discussed below with respect to FIGS. 22A through 22C) being formed over a front-side thereof and a second interconnect structure (such as the backside interconnect structure 136, discussed below with respect to FIGS. 34A through 34C) being formed over a backside thereof. Although the device layer is described as having nano-FETs, other embodiments may include a device layer having different types of transistors (e.g., planar FETs, finFETs, thin film transistors (TFTs), or the like).

Although FIGS. 21A through 21C illustrate a source/drain contact 112 extending to each of the first epitaxial source/drain regions 92 and the second epitaxial source/drain regions 95, the source/drain contacts 112 may be omitted from certain ones of the first epitaxial source/drain regions 92. For example, as explained in greater detail below, conductive features (e.g., backside vias or power rails) may be subsequently attached through a backside of one or more of the first epitaxial source/drain regions 92. For these particular first epitaxial source/drain regions 92, the source/drain contacts 112 may be omitted or may be dummy contacts that are not electrically connected to any overlying conductive lines (such as the first conductive features 122, discussed below with respect to FIGS. 22A through 22C).

FIGS. 22A through 35C illustrate intermediate steps of forming front-side interconnect structures and backside interconnect structures on the transistor structures 109. The front-side interconnect structures and the backside interconnect structures may each comprise conductive features that are electrically connected to the nano-FETs formed on the substrate 50. FIGS. 22A, 23A, 24A, 25A, 26A, 27A, 28A, 29A, 30A, 31A, 32A, 33A, 34A, and 35A illustrate reference cross-section A-A' illustrated in FIG. 1. FIGS. 22B, 23B, 24B, 25B, 26B, 27B, 28B, 29B, 30B, 31B, 32B, 33B, 34B and 35B illustrate reference cross-section B-B' illustrated in FIG. 1. FIGS. 22C, 23C, 24C, 25C, 26C, 27C, 28C, 28D, 29C, 29D, 30C, 31C, 32C, 33C, 34C, and 35C illustrate reference cross-section C-C' illustrated in FIG. 1. The process steps described in FIGS. 22A through 35C may be applied to both the n-type region 50N and the p-type region 50P. As noted above, a back-side conductive feature (e.g., a backside via, a power rail, or the like) may be connected to one or more of the first epitaxial source/drain regions 92. As such, the source/drain contacts 112 may be optionally omitted from the first epitaxial source/drain regions 92.

Figure 22C:
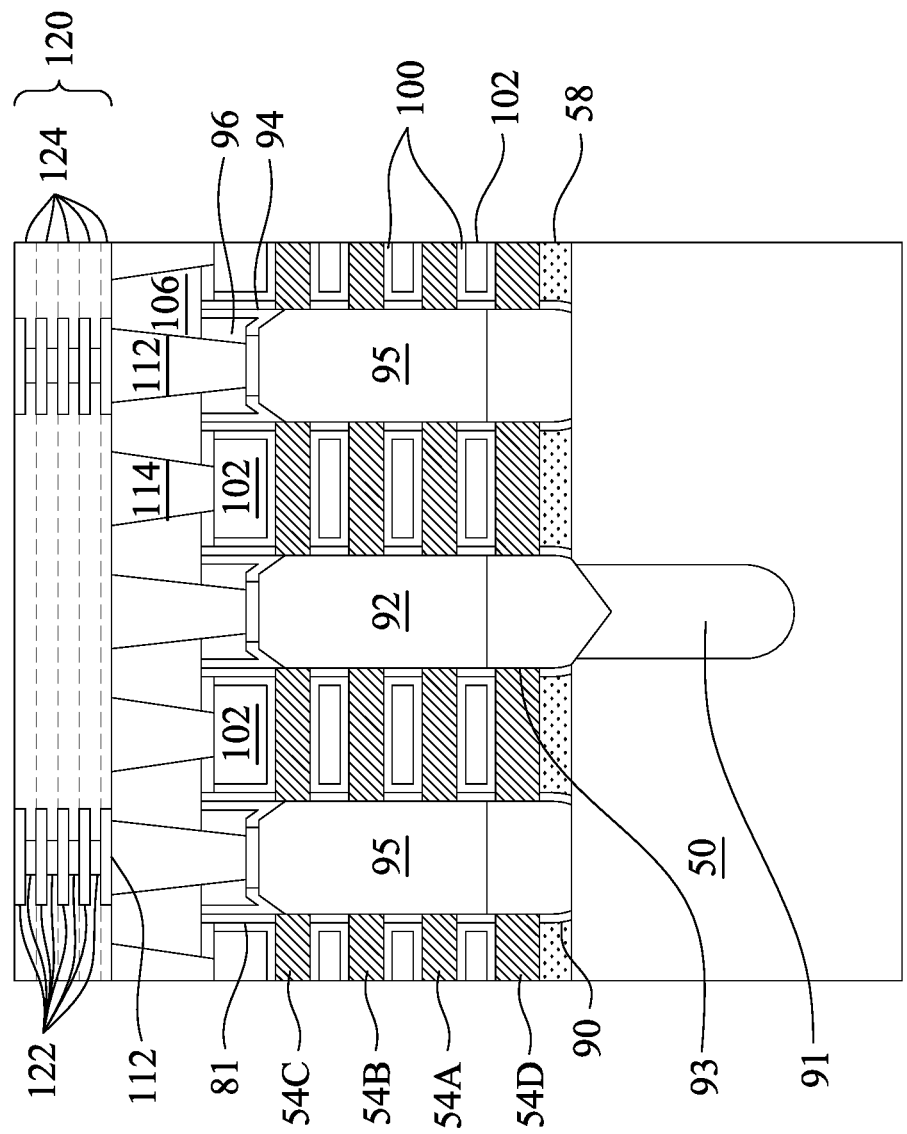

In FIGS. 22A through 22C, a front-side interconnect structure 120 is formed on the second ILD 106. The front-side interconnect structure 120 may be referred to as a front-side interconnect structure because it is formed on a front-side of the transistor structures 109 (e.g., a side of the transistor structures 109 on which active devices are formed).

The front-side interconnect structure 120 may comprise one or more layers of first conductive features 122 formed in one or more stacked first dielectric layers 124. Each of the stacked first dielectric layers 124 may comprise a dielectric material, such as a low-k dielectric material, an extra low-k (ELK) dielectric material, or the like. The first dielectric layers 124 may be deposited using an appropriate process, such as, CVD, ALD, PVD, PECVD, or the like.

The first conductive features 122 may comprise conductive lines and conductive vias interconnecting the layers of conductive lines. The conductive vias may extend through respective ones of the first dielectric layers 124 to provide vertical connections between layers of the conductive lines. The first conductive features 122 may be formed through any acceptable process, such as, a damascene process, a dual damascene process, or the like.

In some embodiments, the first conductive features 122 may be formed using a damascene process in which a respective first dielectric layer 124 is patterned utilizing a combination of photolithography and etching techniques to form trenches corresponding to the desired pattern of the first conductive features 122. An optional diffusion barrier and/or optional adhesion layer may be deposited and the trenches may then be filled with a conductive material. Suitable materials for the barrier layer include titanium, titanium nitride, titanium oxide, tantalum, tantalum nitride, titanium oxide, combinations thereof, or the like, and suitable materials for the conductive material include copper, silver, gold, tungsten, aluminum, combinations thereof, or the like. In an embodiment, the first conductive features 122 may be formed by depositing a seed layer of copper or a copper alloy, and filling the trenches by electroplating. A chemical mechanical planarization (CMP) process or the like may be used to remove excess conductive material from a surface of the respective first dielectric layer 124 and to planarize surfaces of the first dielectric layer 124 and the first conductive features 122 for subsequent processing.

FIGS. 22A through 22C illustrate five layers of the first conductive features 122 and the first dielectric layers 124 in the front-side interconnect structure 120. However, it should be appreciated that the front-side interconnect structure 120 may comprise any number of first conductive features 122 disposed in any number of first dielectric layers 124. The front-side interconnect structure 120 may be electrically connected to the gate contacts 114 and the source/drain contacts 112 to form functional circuits. In some embodiments, the functional circuits formed by the front-side interconnect structure 120 may comprise logic circuits, memory circuits, image sensor circuits, or the like.

Figure 23C:
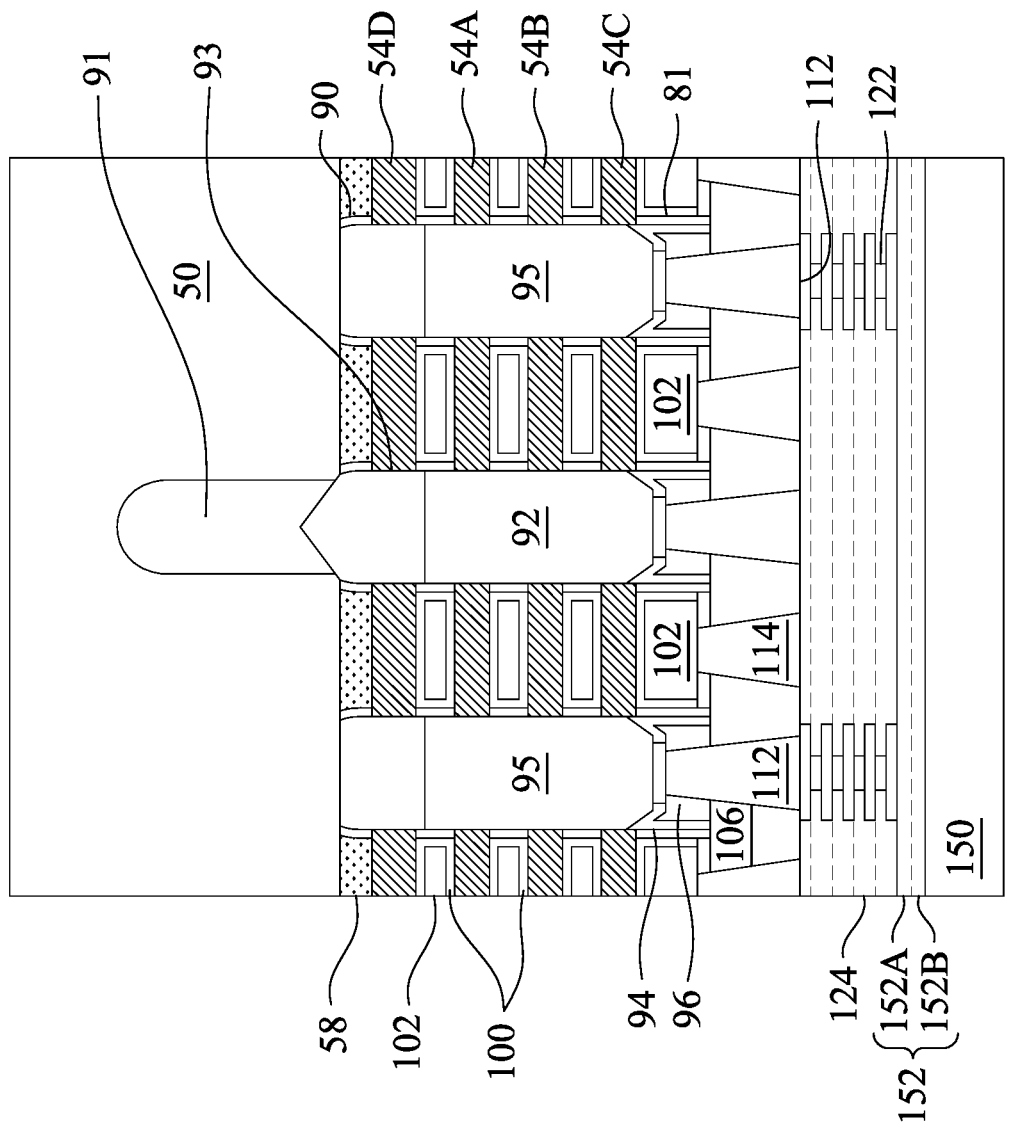

In FIGS. 23A through 23C, a first carrier substrate 150 is bonded to a top surface of the front-side interconnect structure 120 by a first bonding layer 152A and a second bonding layer 152B (collectively referred to as a bonding layer 152). The first carrier substrate 150 may be a glass carrier substrate, a ceramic carrier substrate, a wafer (e.g., a silicon wafer), or the like. The first carrier substrate 150 may provide structural support during subsequent processing steps and in the completed device.

In various embodiments, the first carrier substrate 150 may be bonded to the front-side interconnect structure 120 using a suitable technique, such as dielectric-to-dielectric bonding, or the like. The dielectric-to-dielectric bonding may comprise depositing the first bonding layer 152A on the front-side interconnect structure 120. In some embodiments, the first bonding layer 152A comprises silicon oxide (e.g., a high-density plasma (HDP) oxide or the like) that is deposited by CVD, ALD, PVD, or the like. The second bonding layer 152B may likewise be an oxide layer that is formed on a surface of the first carrier substrate 150 prior to bonding using, for example, CVD, ALD, PVD, thermal oxidation, or the like. Other suitable materials may be used for the first bonding layer 152A and the second bonding layer 152B.

The dielectric-to-dielectric bonding process may further include applying a surface treatment to one or more of the first bonding layer 152A and the second bonding layer 152B. The surface treatment may include a plasma treatment. The plasma treatment may be performed in a vacuum environment. After the plasma treatment, the surface treatment may further include a cleaning process (e.g., a rinse with deionized water or the like) that may be applied to one or more of the bonding layers 152. The first carrier substrate 150 is then aligned with the front-side interconnect structure 120 and the two are pressed against each other to initiate a pre-bonding of the first carrier substrate 150 to the front-side interconnect structure 120. The pre-bonding may be performed at room temperature (e.g., from about 21° C. to about 25° C.). After the pre-bonding, an annealing process may be applied by, for example, heating the front-side interconnect structure 120 and the first carrier substrate 150 to a temperature of about 170° C.

Further in FIGS. 23A through 23C, after the first carrier substrate 150 is bonded to the front-side interconnect structure 120, the device may be flipped such that a backside of the transistor structures 109 faces upwards. The backside of the transistor structures 109 may refer to a side opposite to the front-side of the transistor structures 109 on which the active devices are formed.

Figure 24B:
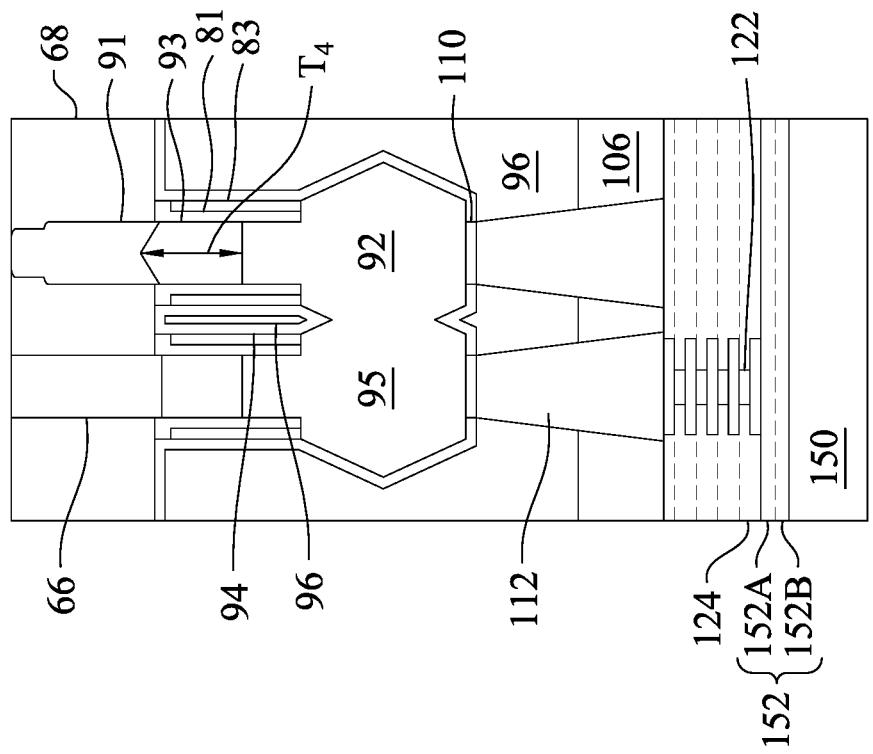
Figure 24A:
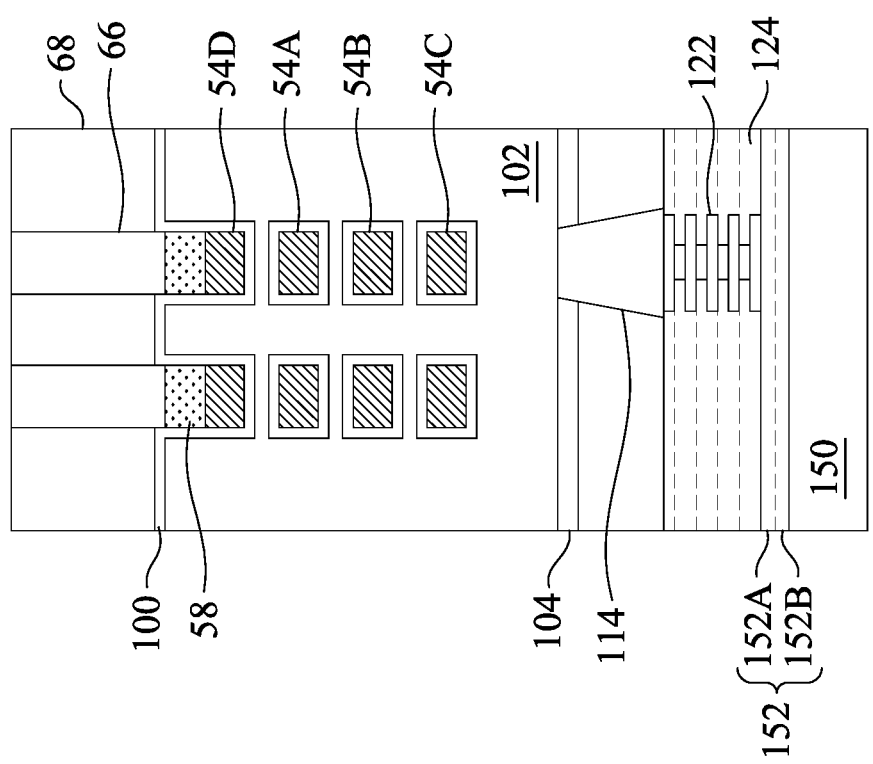
Figure 24C:
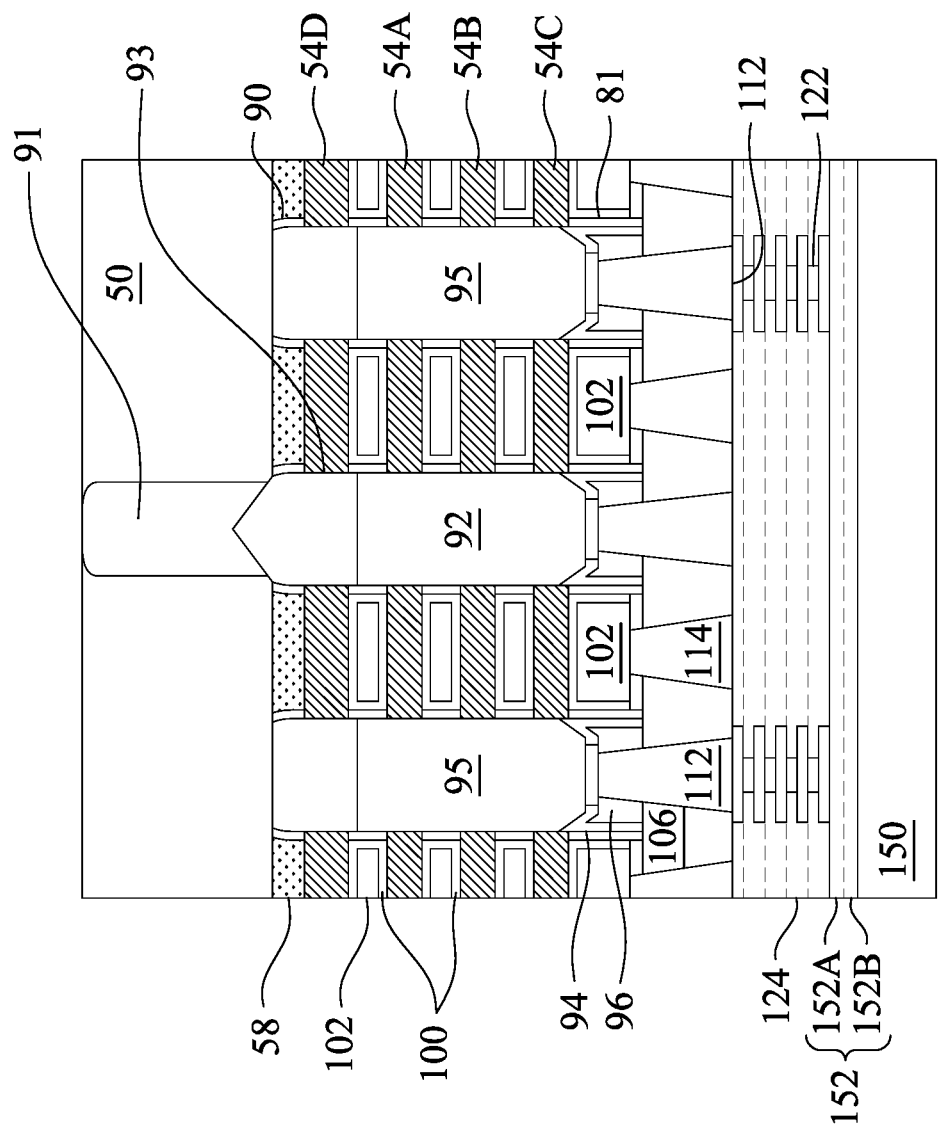

In FIGS. 24A through 24C, a thinning process may be applied to the backside of the substrate 50. The thinning process may comprise a planarization process (e.g., a mechanical grinding, a CMP, or the like), an etch-back process, a combination thereof, or the like. As a result of thinning of the substrate 50, backside surfaces of the STI regions 68 and the first epitaxial materials 91 may be exposed. After the thinning process, top surfaces of the STI regions 68, the first epitaxial materials 91, and the substrate 50 may be level.

Figure 25C:
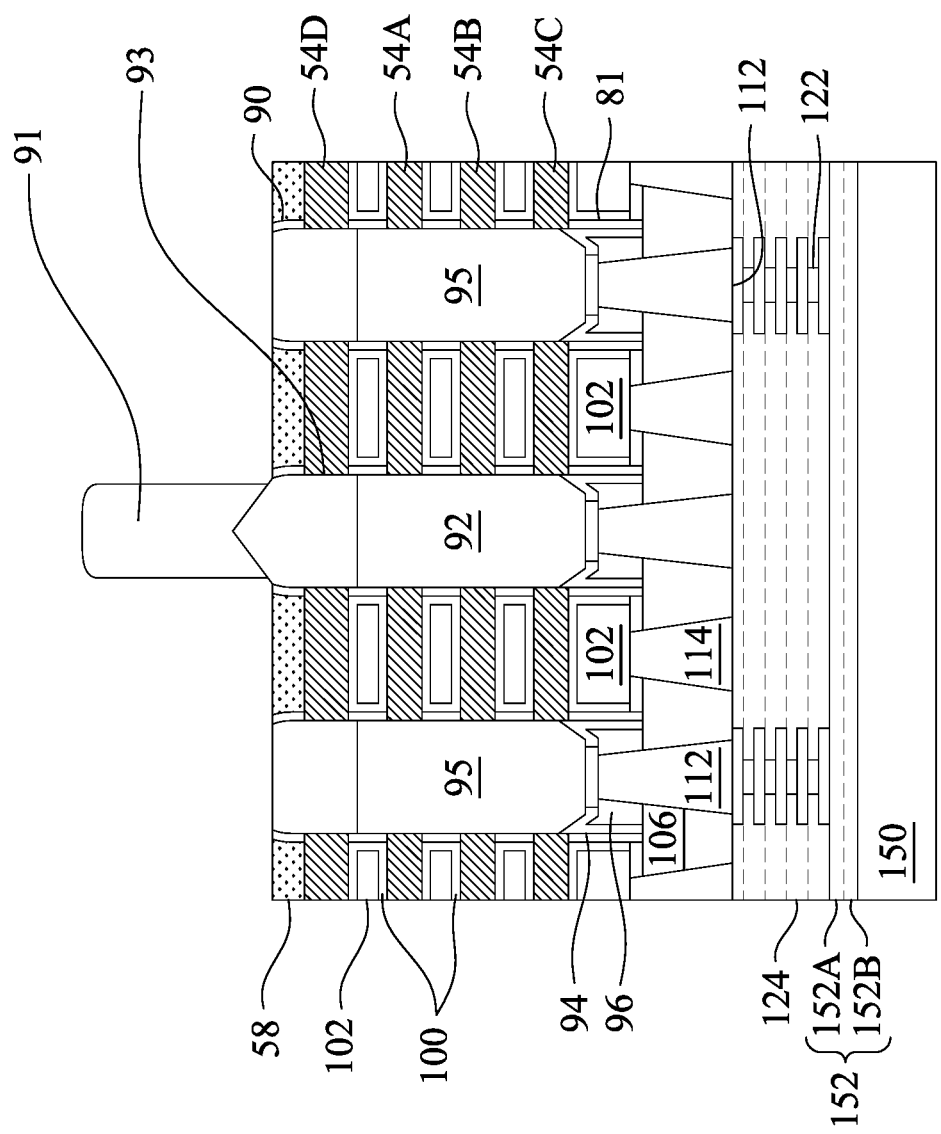

In FIGS. 25A through 25C, the substrate 50 and the fins 66 may be etched using a suitable etching process, such as an isotropic etching process (e.g., a wet etching process), an anisotropic etching process (e.g., a dry etching process), or the like. The substrate 50 and fins 66 may be completely removed by an etching process which is selective to the material of the substrate 50/fins 66 (e.g., etches the material of the substrate 50/fins 66 at a faster rate than the material of the STI regions 68 and the first epitaxial materials 91). As a result of the etching process, the substrate 50/fins 66 are removed and portions of sidewalls of the STI regions 68 may be exposed. In some embodiments, the first epitaxial materials 91 may also have portions of sidewalls exposed through gaps 97 as a result of damage to the first epitaxial materials 91 during the etching process. For example, portions of the first epitaxial materials 91 at an interface with the STI regions 68 may be damaged and removed to form the gaps 97 as a result of the etching process. In addition, dummy nanostructure 58 and the second nanostructure 54D may remain over the gate structure (e.g., the gate electrodes 102 and the gate dielectric layers 100) after the etching process.

Figure 26B:
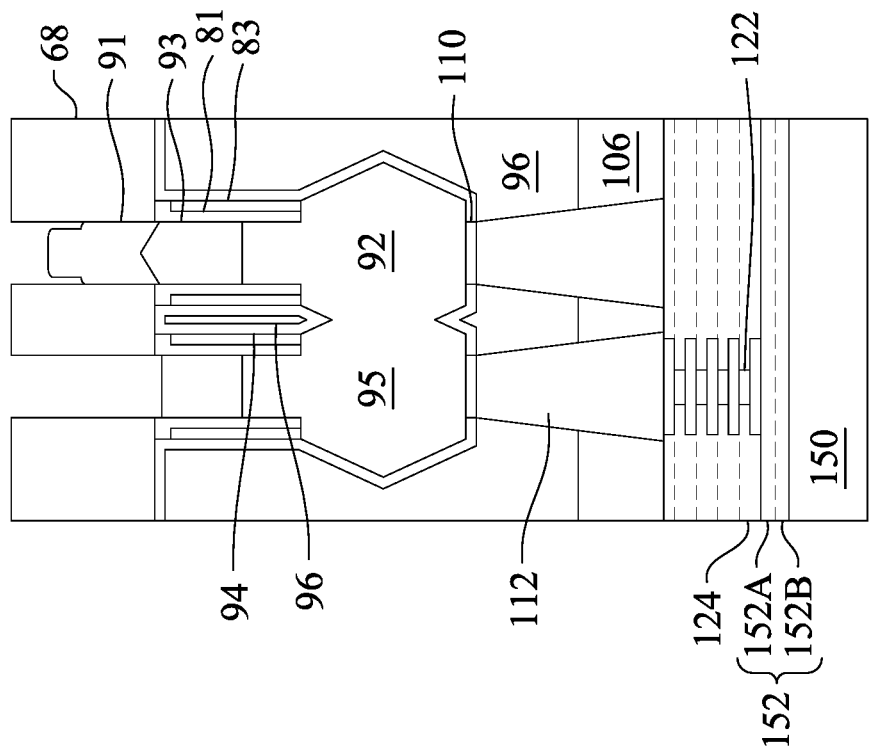
Figure 26A:
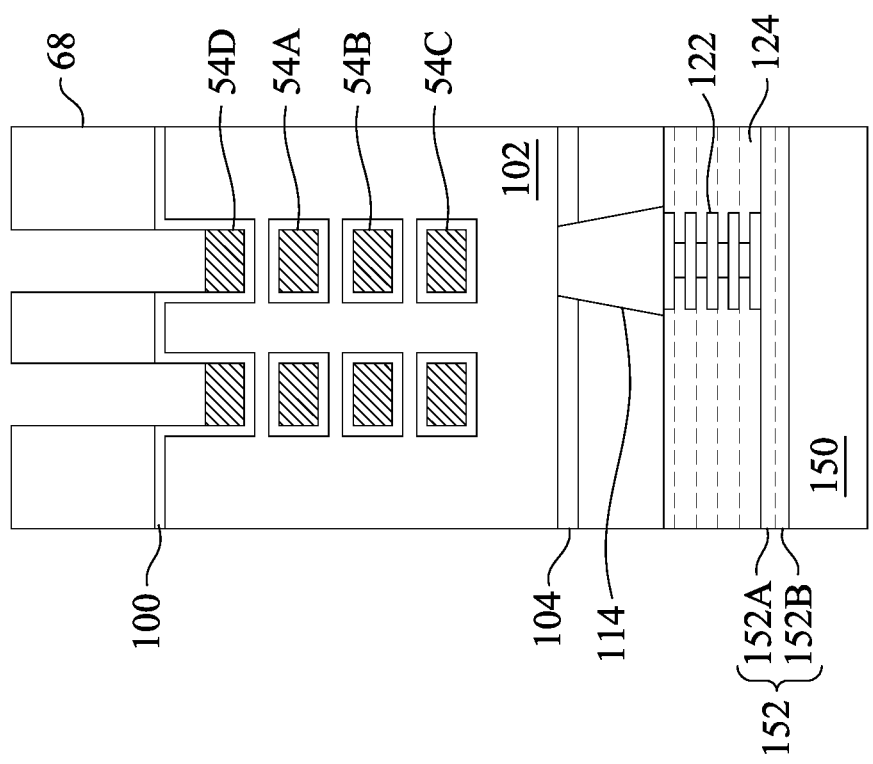
Figure 26C:
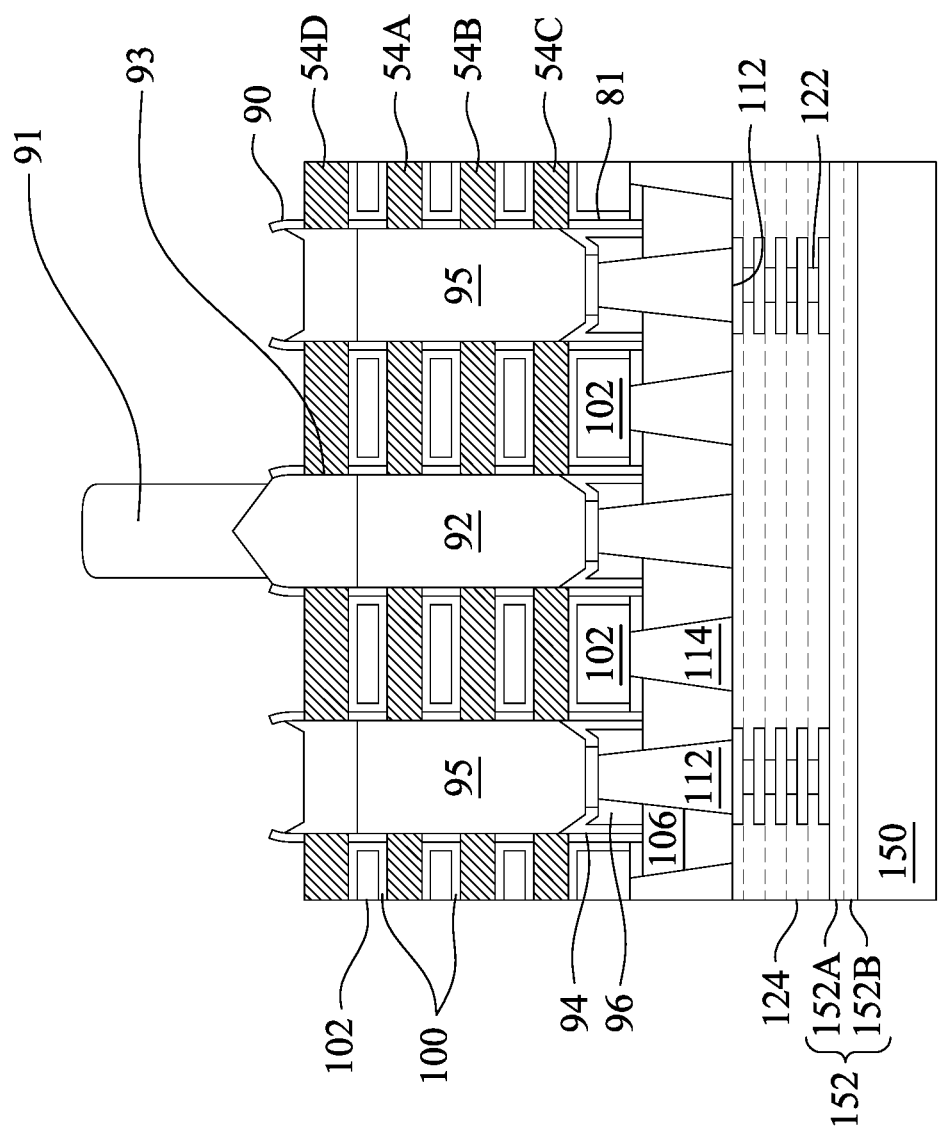

In FIGS. 26A through 26C, the dummy nanostructures 58 are removed by a suitable etching process, which may be an isotropic etching process, such as a wet etching process. The etching process may have a high etch selectivity to materials of the dummy nanostructures 58. As such, the dummy nanostructures 58 may be removed without significantly removing materials of the STI regions 68, the second nanostructures 54D, or the gate dielectric layers 100. In embodiments in which the dummy nanostructure 58 includes, e.g., SiGe, and the second nanostructure 54D includes, e.g., Si or SiC, tetramethylammonium hydroxide (TMAH), ammonium hydroxide ($NH_4OH$), or the like may be used to remove the dummy nanostructure 58. During the etching process, exposed portions of the first epitaxial materials 91 and the second epitaxial materials 93 may also be recessed. However, the first inner spacers 90 and the first epitaxial materials 91 may mask portions of the second epitaxial materials 93 during the etching such that these portions of the second epitaxial materials 93 remain. The remaining portions of the second epitaxial materials 93 may correspond to portions that are under the first epitaxial source/drain regions 92 and that are in contact with the first inner spacers 90.

Figure 27B:
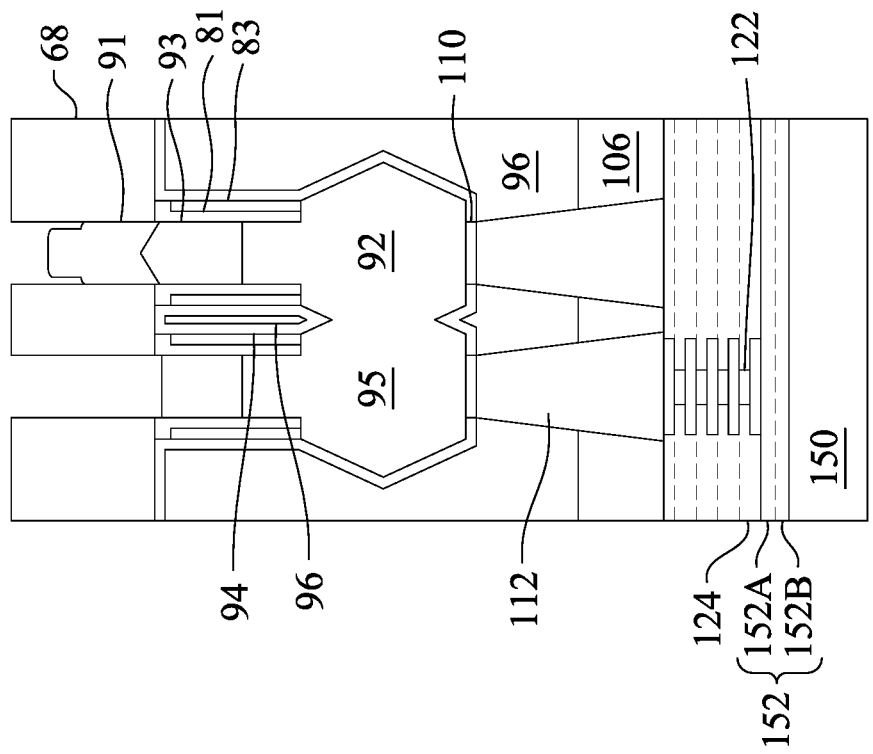
Figure 27A:
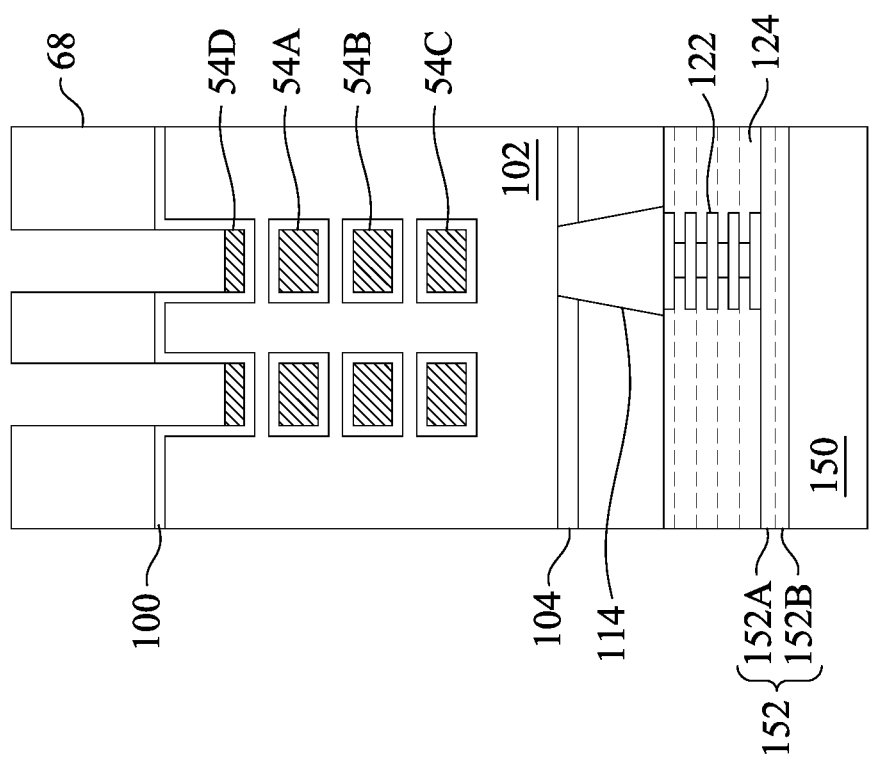
Figure 27C:
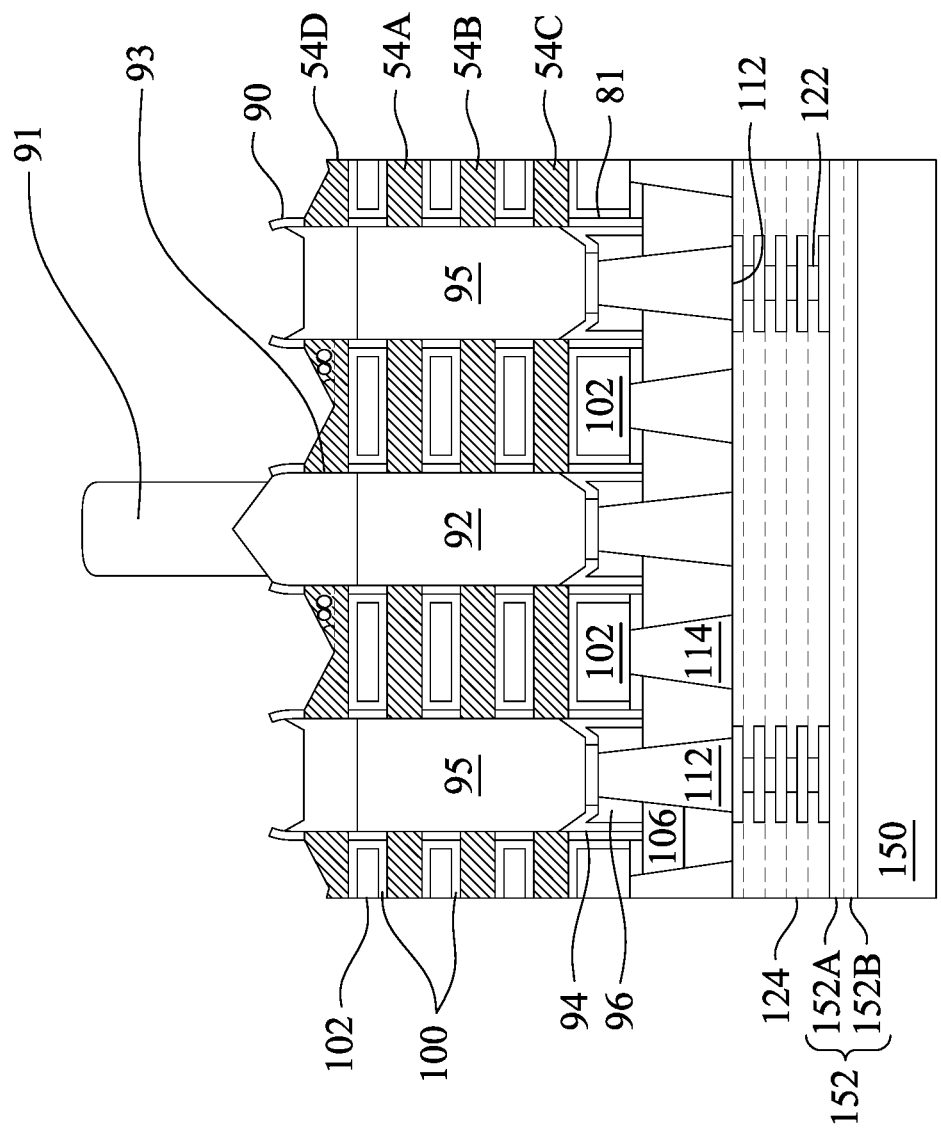
Figure 28B:
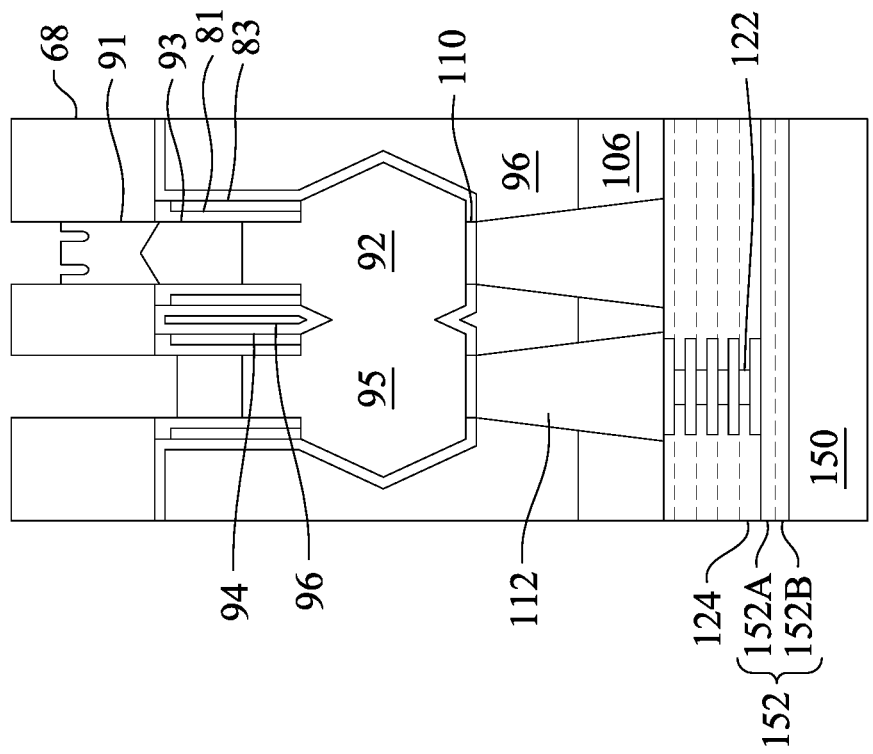
Figure 28A:
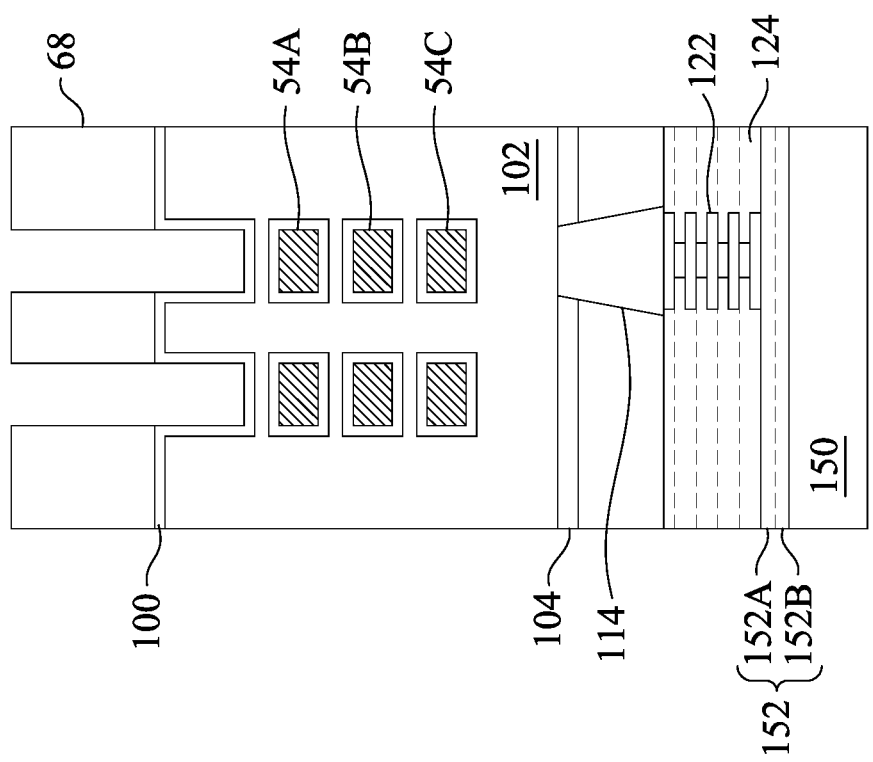
Figure 28C:
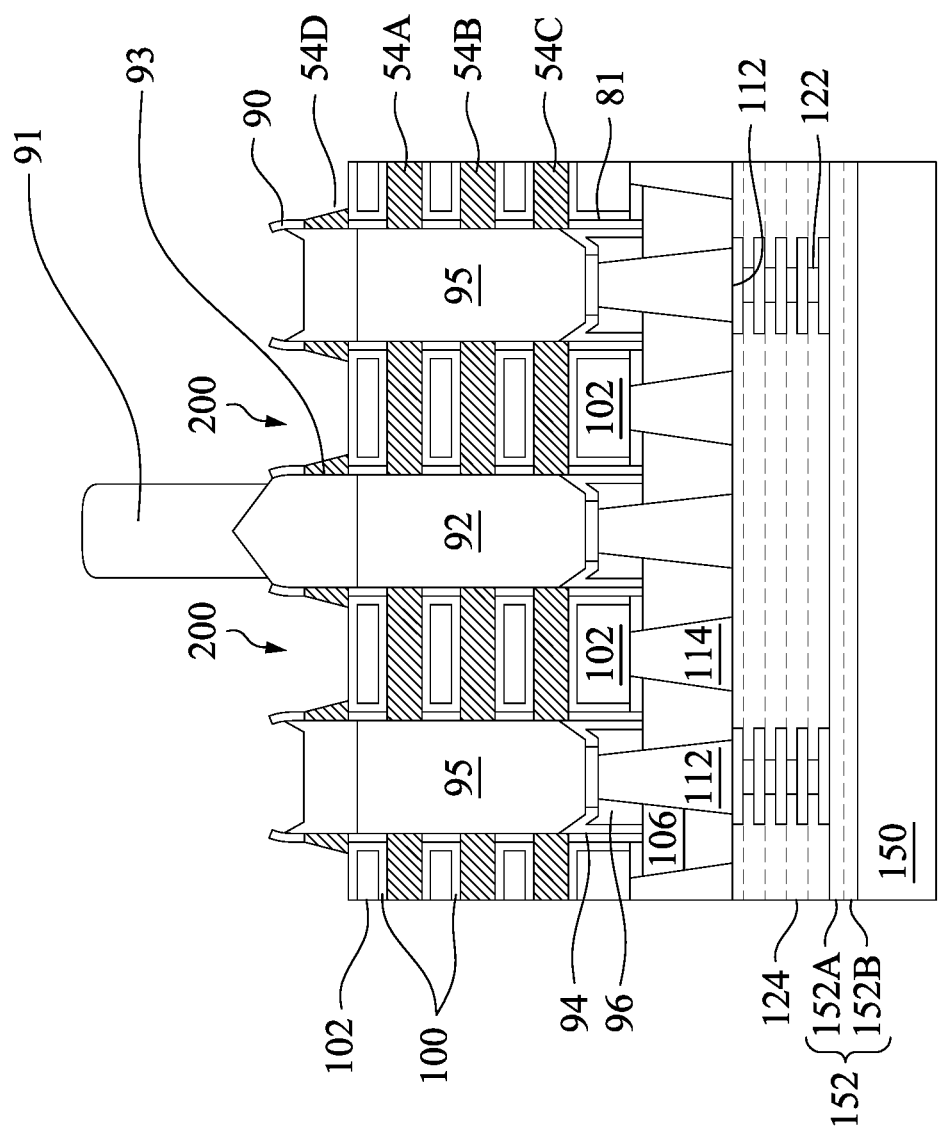

In FIGS. 27A through 28C an etching process is performed to etch through the second nanostructures 54D to form cavities 200 (shown in FIG. 28C). In accordance with some embodiments, FIGS. 27A through 27C show cross-sectional views of an intermediate stage in the manufacturing of nano-FETs, during the etching process. In accordance with some embodiments, FIGS. 28A through 28C show cross-sectional views of an intermediate stage in the manufacturing of nano-FETs, after the completion of the etching process. During the etching process, portions of the second nanostructures 54D are removed while the first inner spacers 90 mask the end portions of the second nanostructures 54D. As a result, the end portions of the second nanostructures 54D remain after the etching process. In embodiments in which the second nanostructure 54D includes, e.g., Si or SiC, the etching process may include an anisotropic wet etching process that includes exposing the second nanostructures 54D to an etchant that comprises tetramethylammonium hydroxide (TMAH), or the like. The etching process may be selective to the material of the second nanostructure 54D (e.g., etches the material of the second nanostructure 54D at a faster rate than the material of the STI regions 68, the second epitaxial materials 93 and the first epitaxial materials 91). FIG. 27C illustrates that the etching process is an anisotropic etching process that directionally etches the second nanostructure 54D to form cavities 200 (shown subsequently in FIG. 28C) that have sidewalls with a profile angle α between each sidewall and a plane that is parallel to a top surface of the first carrier substrate 150. The profile angle α of the cavities 200 formed may dependent on the crystal orientation of the material of the second nanostructure 54D. In an embodiment in which the second nanostructure 54D comprises silicon having a crystal orientation that is in a <110> family of crystal directions, the profile angle α may be in a range of 49.7° to 59.7°. FIG. 28C illustrates that after the etching process, cavities 200 formed may have a trapezoidal shape.

It has been observed that there are advantageous features in the forming of a multi-layer stack 64 that comprises the dummy nanostructure 58 and etching the dummy nanostructure 58 such that end portions of the second nanostructure 54D are covered by the first inner spacers 90. During the formation of a backside via, middle portions of the second nanostructure 54D are removed while leaving end portions of the second nanostructure 54D in physical contact with sidewalls of the second epitaxial materials 93 that are directly above the first epitaxial source/drain regions 92 and second epitaxial regions 95. For example, forming the dummy nanostructure 58 allows for improved protection of interfaces between the first epitaxial source/drain regions 92, the second epitaxial regions 95 and the topmost channel layers of the multi-layer stack 64 from etchants used while forming the backside vias. Accordingly, manufacturing defects can be reduced, device performance degradation can be avoided, process window may be increased, and manufacturing yield may be improved. Further, the improved protection of interfaces between the first epitaxial source/drain regions 92, the second epitaxial regions 95 and the topmost channel layers of the multi-layer stack 64 results in devices that may have a reduced vulnerability to electrostatic discharge.

Figure 28D:
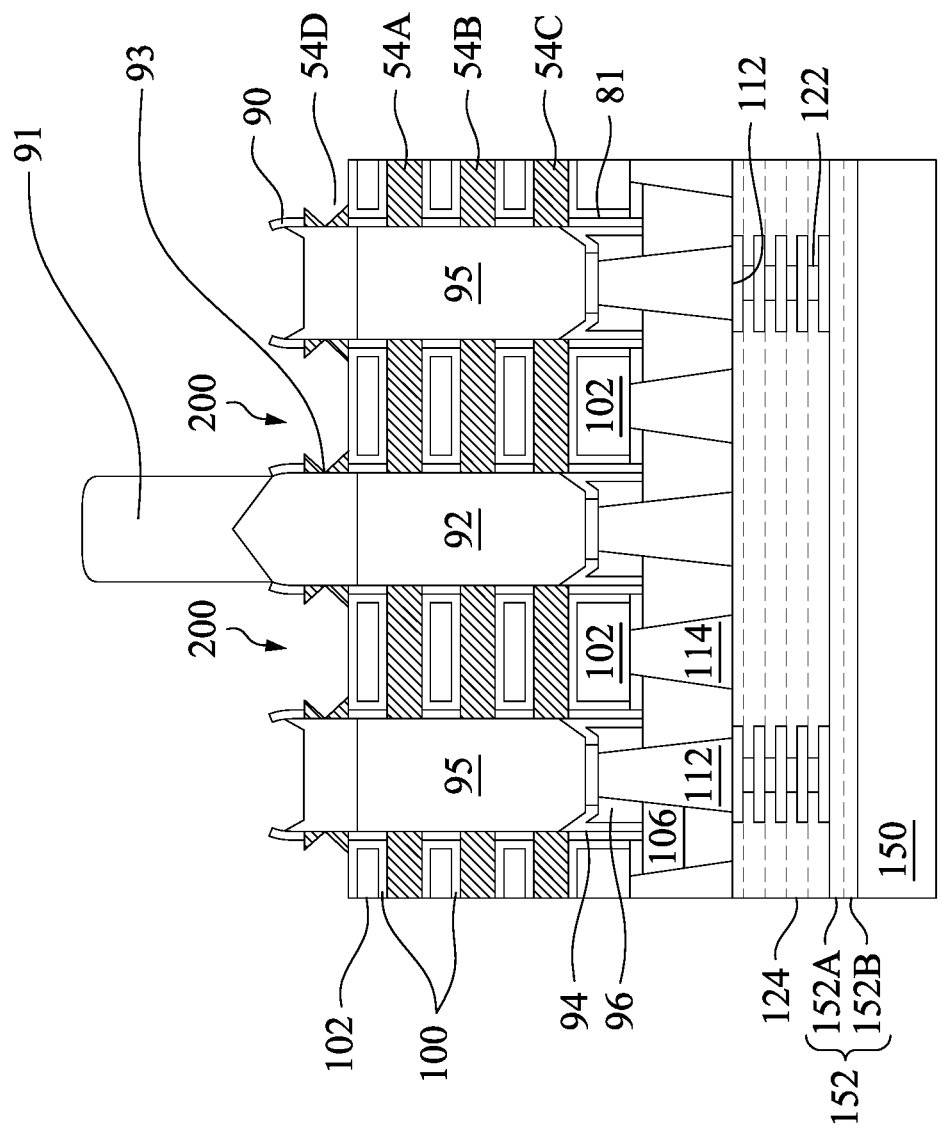

FIG. 28D illustrates an embodiment in which the second nanostructure 54D comprises silicon having a crystal orientation that is in a <100> family of crystal directions. In FIG. 28D, the cavities 200 are formed having a diamond shape after the etching process. The etching process may include an anisotropic wet etching process that includes exposing the second nanostructures 54D to an etchant that comprises tetramethylammonium hydroxide (TMAH), or the like that is present at a concentration in a range from about 1 percent to about 10 percent, at a temperature in a range that is between about 25° C. to about 70° C. and at a flowrate in a range between about 1000 cc/min to about 2000 cc/min.

Figure 29B:
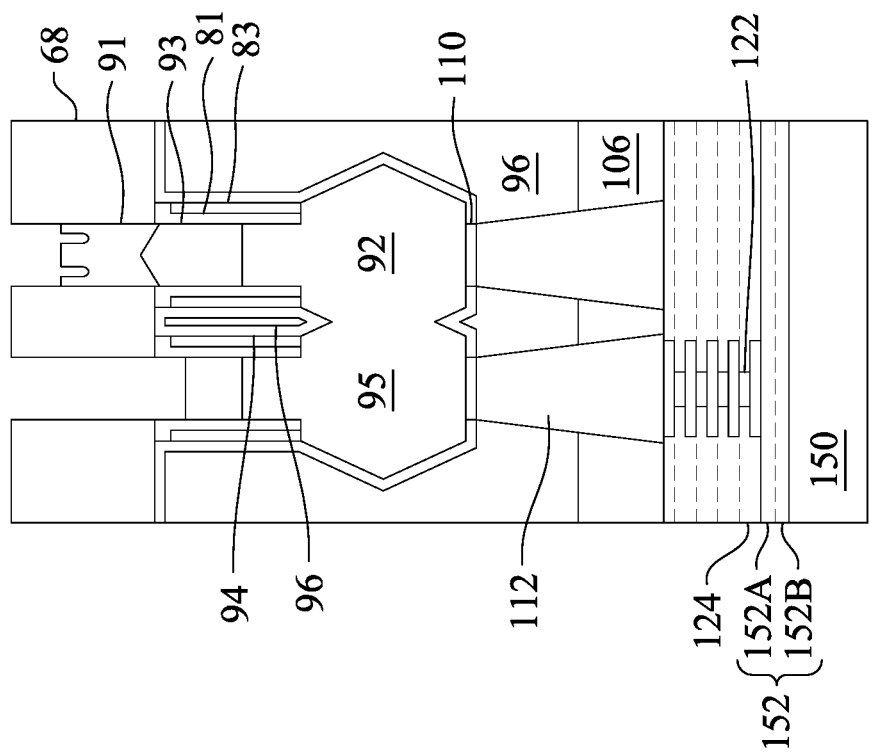
Figure 29A:
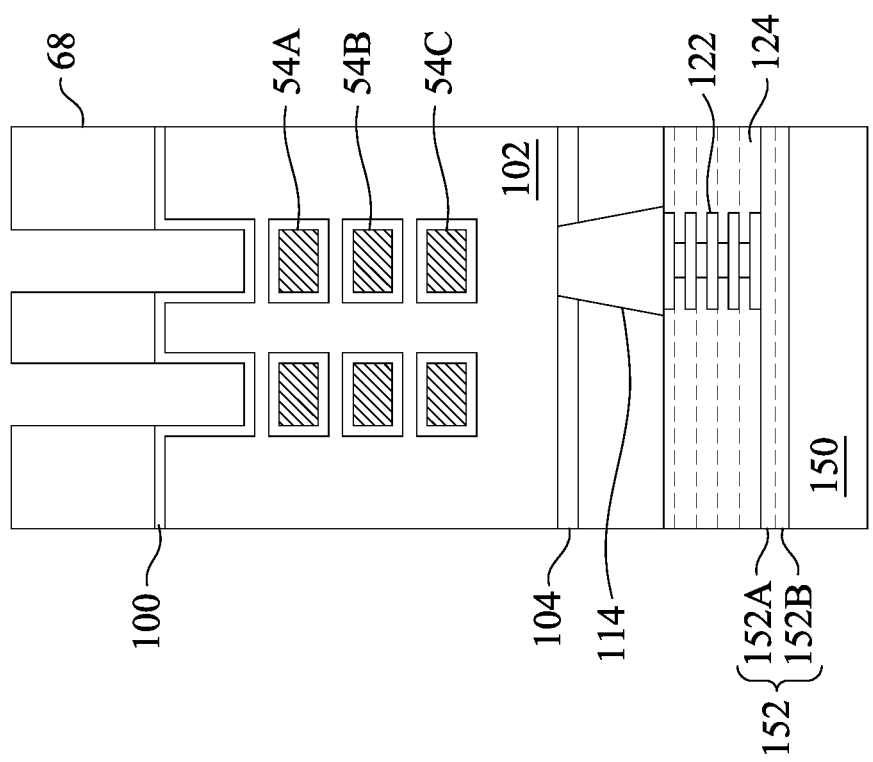
Figure 29C:
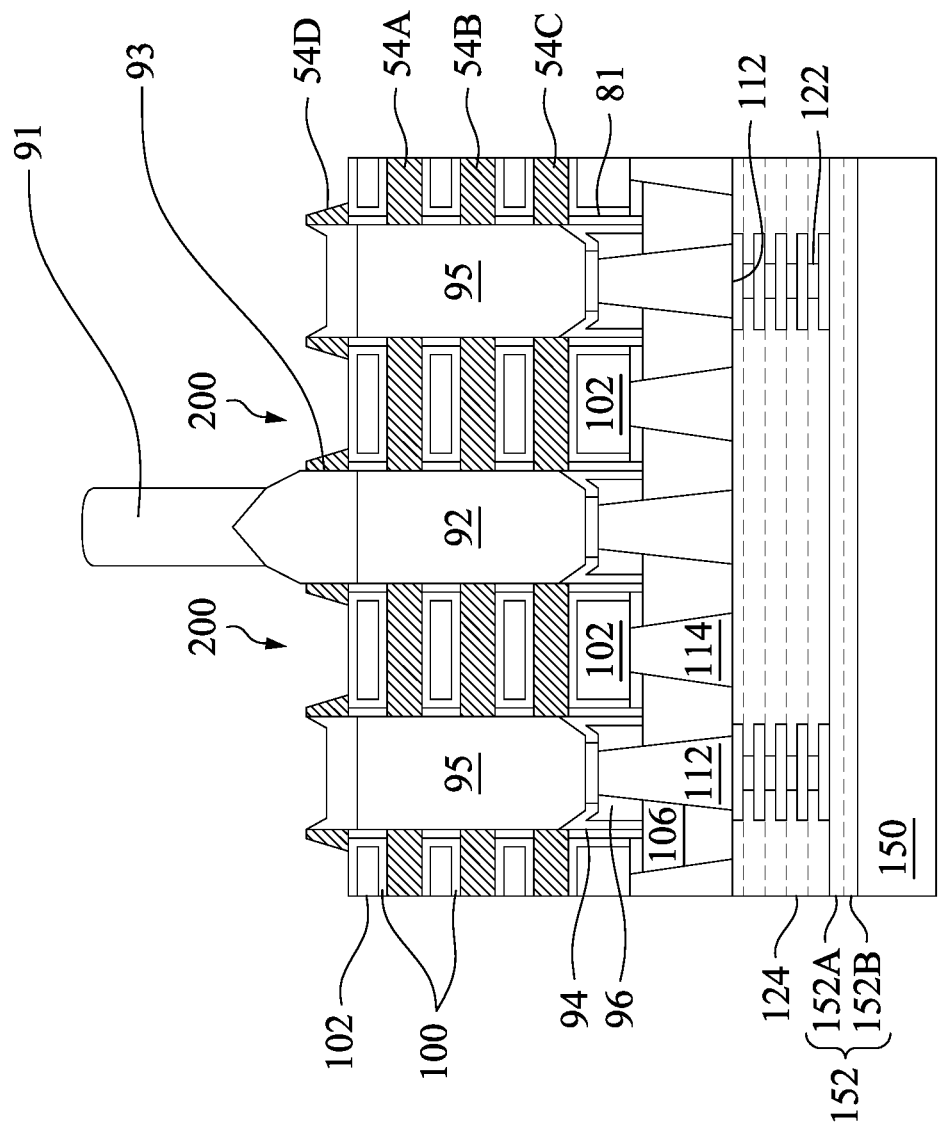
Figure 29D:
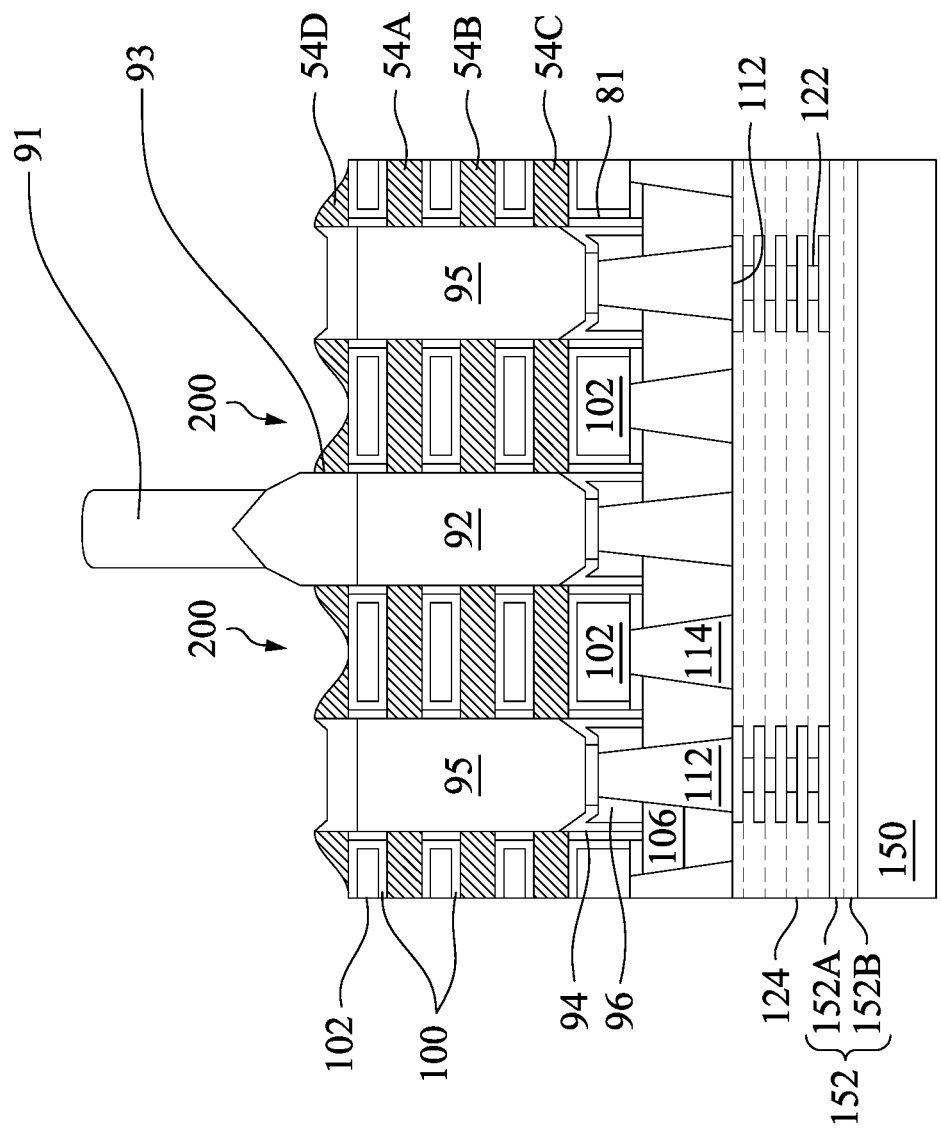

In FIGS. 29A through 29C, the first inner spacers 90 may be removed using a suitable etching process, such as an anisotropic etching process (e.g., a wet etching process), or the like using an etchant that comprises an ammonia solution (NH$_4$OH), hydrogen peroxide (H$_2$O$_2$), hydrochloric acid (HCl), or the like. During the etching process, portions of the second nanostructure 54D, first epitaxial materials 91, and the second epitaxial materials 93 may also be etched. In accordance with an embodiment, after the etching process, each of the cavities 200 may have curved sidewalls and/or a curved bottom (shown in FIG. 29D).

Figure 30C:
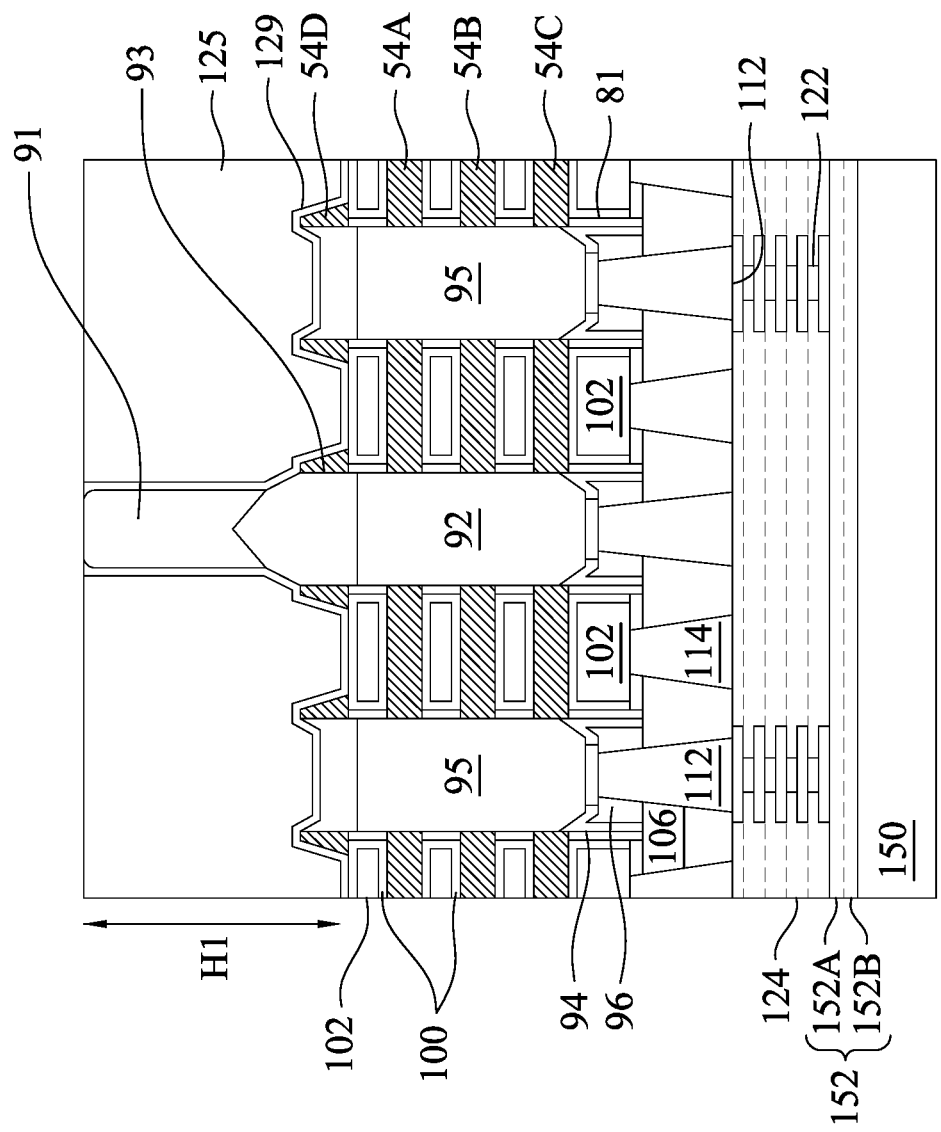

In FIGS. 30A through 30C, a dielectric liner 129 is deposited over the structure of FIGS. 29A through 29C. The dielectric liner 129 may include a nitride (e.g., silicon nitride or the like), combinations thereof, or the like. The dielectric liner 129 may be deposited by CVD, ALD or the like. The dielectric liner 129 may physically contact sidewalls and backside surfaces of the STI regions 68, sidewalls and backside surfaces of the first epitaxial materials 91, and sidewalls and backside surfaces of the second epitaxial materials 93.

Next, a dielectric layer 125 is deposited on the backside of the device. As illustrated in FIGS. 30A through 30C, the dielectric layer 125 may be deposited over the dielectric liner 129. The dielectric layer 125 may be deposited by a process such as CVD, ALD, or the like The dielectric layer 125 may comprise a material such silicon oxide or the like, although any suitable material, such as low-dielectric constant (low-k) materials having a k-value less than about 3.5, may be utilized. Next, a planarization process, such as a CMP, may be performed to level the top surface of the dielectric layer 125 and the dielectric liner 129 with the top surfaces of the STI regions 68. After the planarization process, top surfaces of the STI regions 68, the dielectric layer 125, the dielectric liner 129, and the first epitaxial materials 91 are level within process variations. Accordingly, the top surfaces of the epitaxial materials 91 are exposed through the dielectric layer 125. The dielectric layer 125 may have a thickness H1 which may be used to control the length of subsequently formed backside vias extending through the dielectric layer 125. After the planarization, the gaps 2 may be filled with residue from the dielectric liner 129 and/or the dielectric layer 125, in accordance with an embodiment.

Figure 31B:
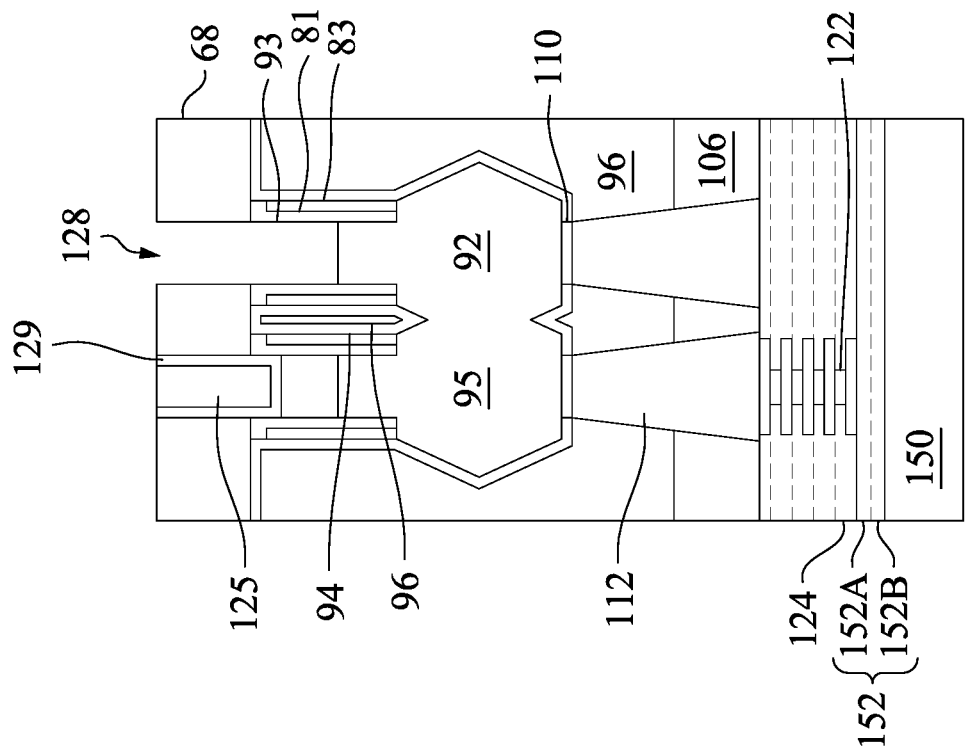
Figure 31A:
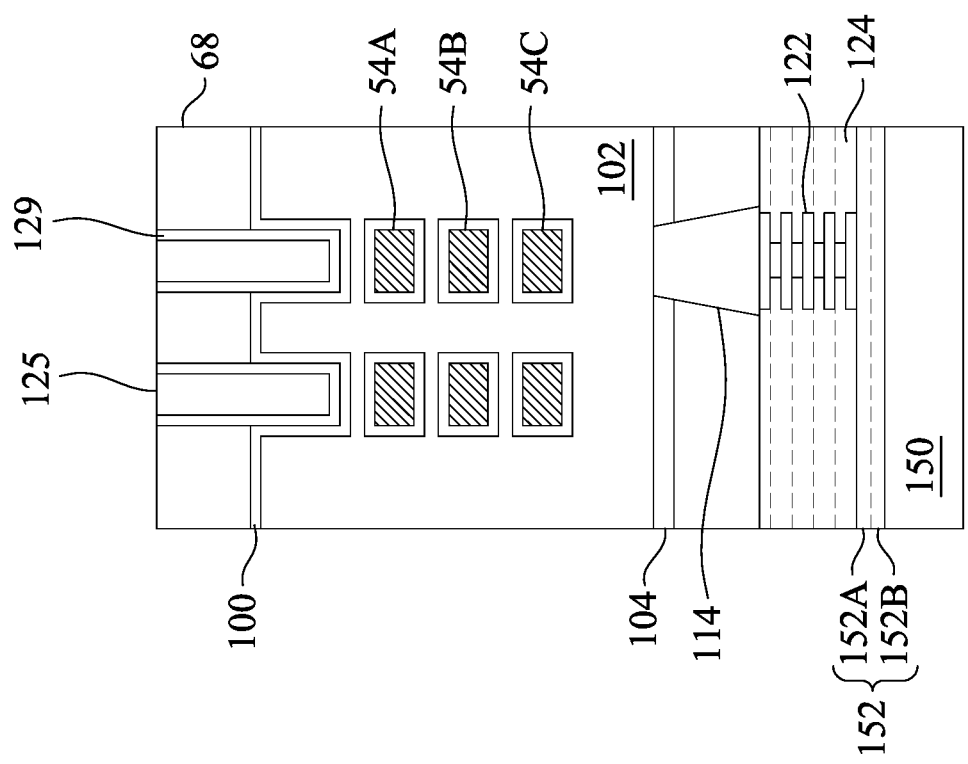
Figure 31C:
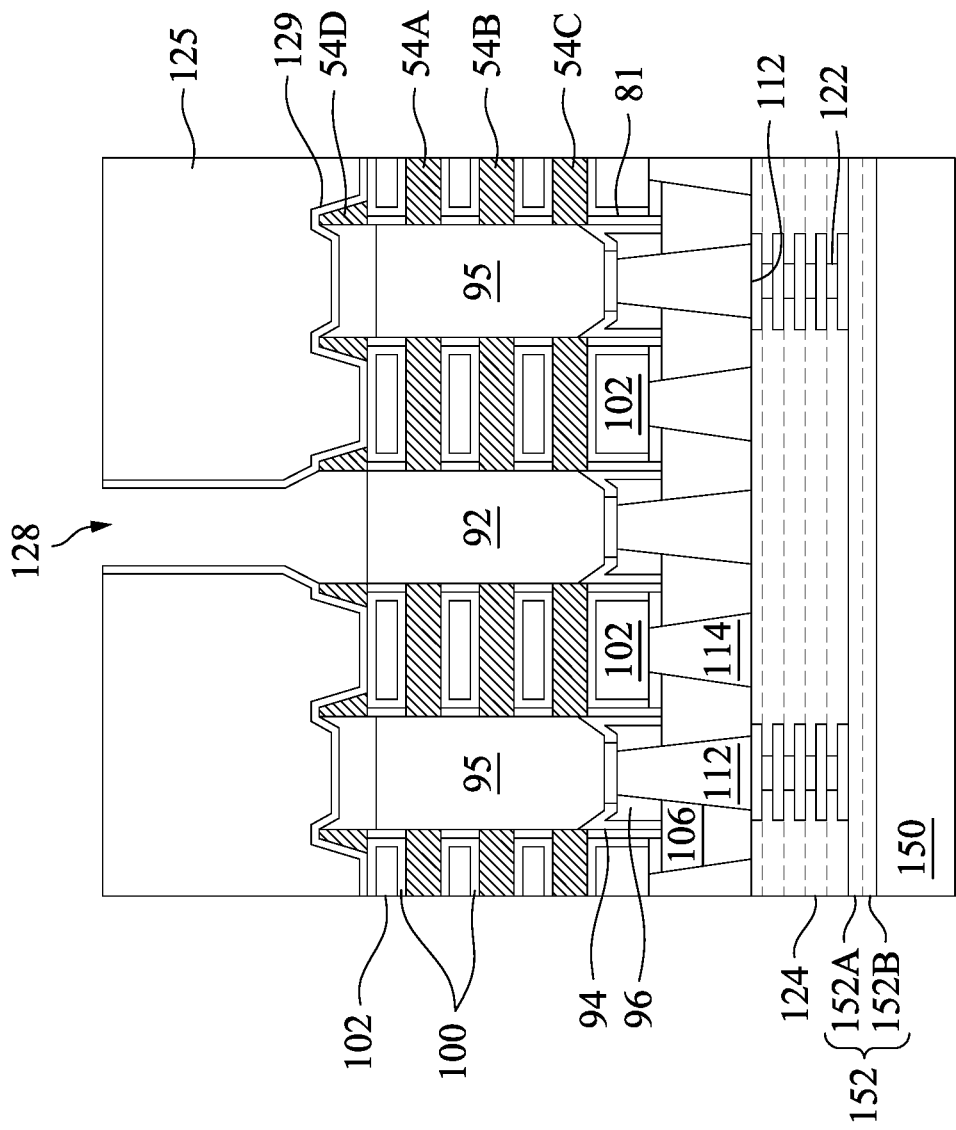

In FIGS. 31A through 31C, the first epitaxial materials 91 and the second epitaxial materials 93 directly above the first epitaxial source/drain regions 92 are removed to form fifth recesses 128 and second silicide regions 131 are formed in the fifth recesses 128. The first epitaxial materials 91, and the second epitaxial materials 93 may be removed by a suitable etching process, which may be an isotropic etching process, such as a wet etching process. The etching process may have a high etch selectivity to materials of the first epitaxial materials 91 and the second epitaxial materials 93. As such, the first epitaxial materials 91, and the second epitaxial materials 93 may be removed without significantly removing materials of the dielectric layer 125, the dielectric liner 129, the STI regions 68, or the first epitaxial source/drain regions 92. As discussed previously, the second epitaxial materials 93 may be formed of materials having lower germanium concentrations such that the etching rate of the second epitaxial materials 93 is lower in order to protect the first epitaxial source/drain regions 92 from excessive etching during the etching process used to remove the first epitaxial materials 91, and the second epitaxial materials 93. The fifth recesses 128 may expose the dielectric liner 129, sidewalls of portions of the second nanostructure 54D, sidewalls of the STI regions 68, and backside surfaces of the first epitaxial source/drain regions 92.

Second silicide regions 131 may then be formed in the fifth recesses 128 on backsides of the first epitaxial source/drain regions 92. The second silicide regions 131 may be similar to the first silicide regions 110, described above with respect to FIGS. 20A through 20C. For example, the second silicide regions 131 may be formed of a like material and using a like process as the first silicide regions 110.

Figure 32B:
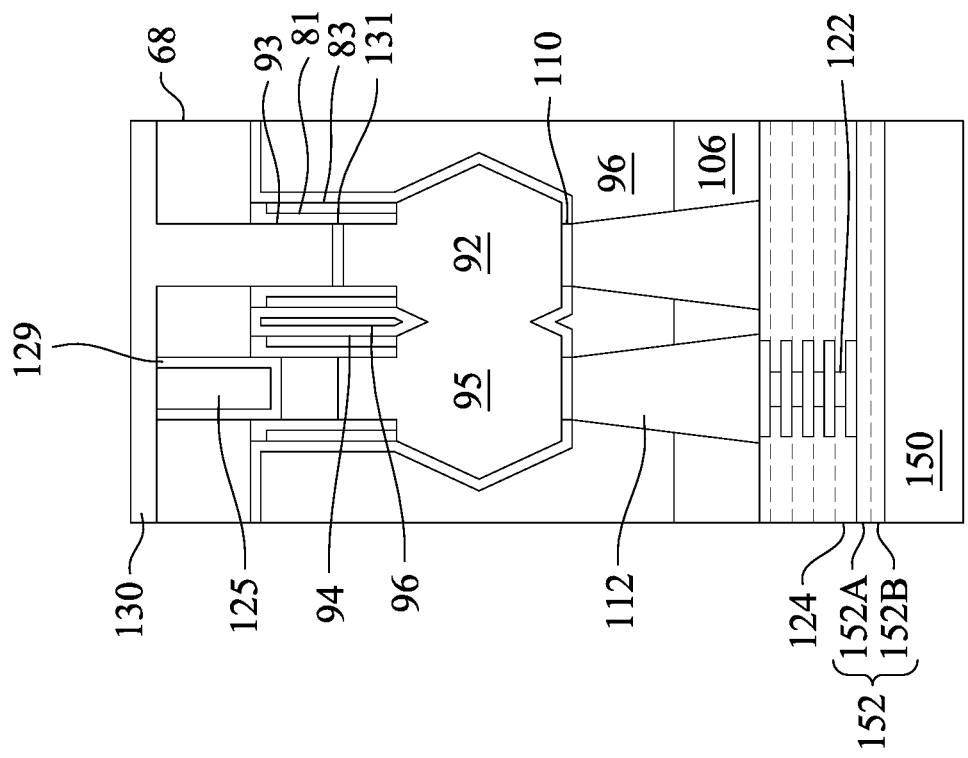
Figure 32A:
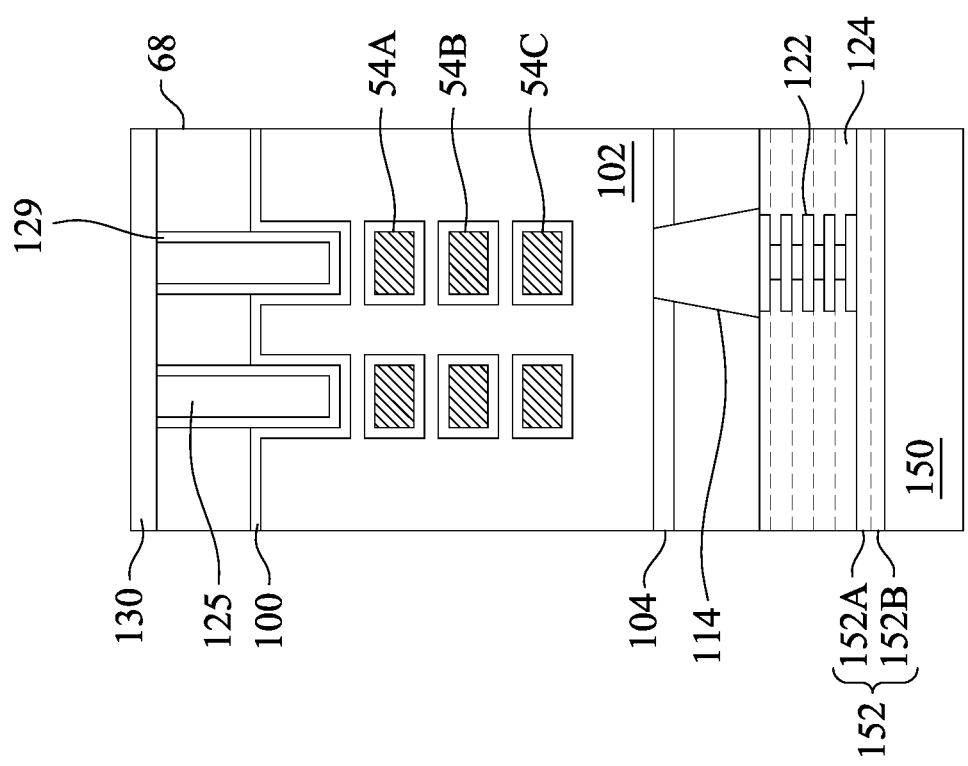
Figure 32C:
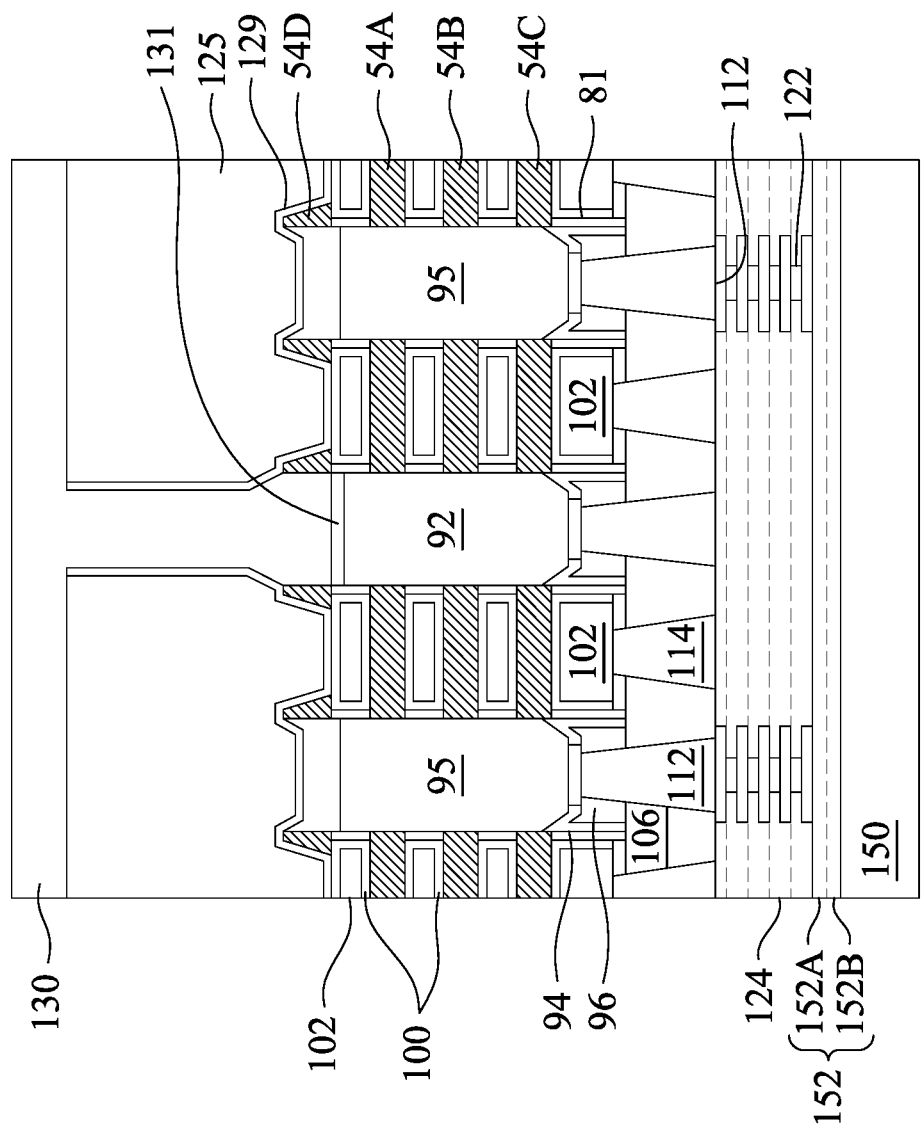

In FIGS. 32A through 32C, backside vias 130 are formed in the fifth recesses 128. The backside vias 130 may extend through the dielectric layer 125 and the dielectric liner 129, and may be electrically coupled to the first epitaxial source/drain regions 92 through the second silicide regions 131. The backside vias 130 may each comprise one or more layers, such as barrier layers, diffusion layers, and fill materials. For example, in some embodiments, the backside vias 130 each include a barrier layer and a conductive material, and are each electrically coupled to an underlying conductive feature (e.g., a second silicide region 131). The backside vias 130 are electrically coupled to the first epitaxial source/drain regions 92 through the second silicide regions 131. The barrier layer may include titanium, titanium nitride, tantalum, tantalum nitride, or the like. The conductive material may be copper, a copper alloy, silver, gold, tungsten, cobalt, aluminum, nickel, ruthenium, or the like.

Figure 33B:
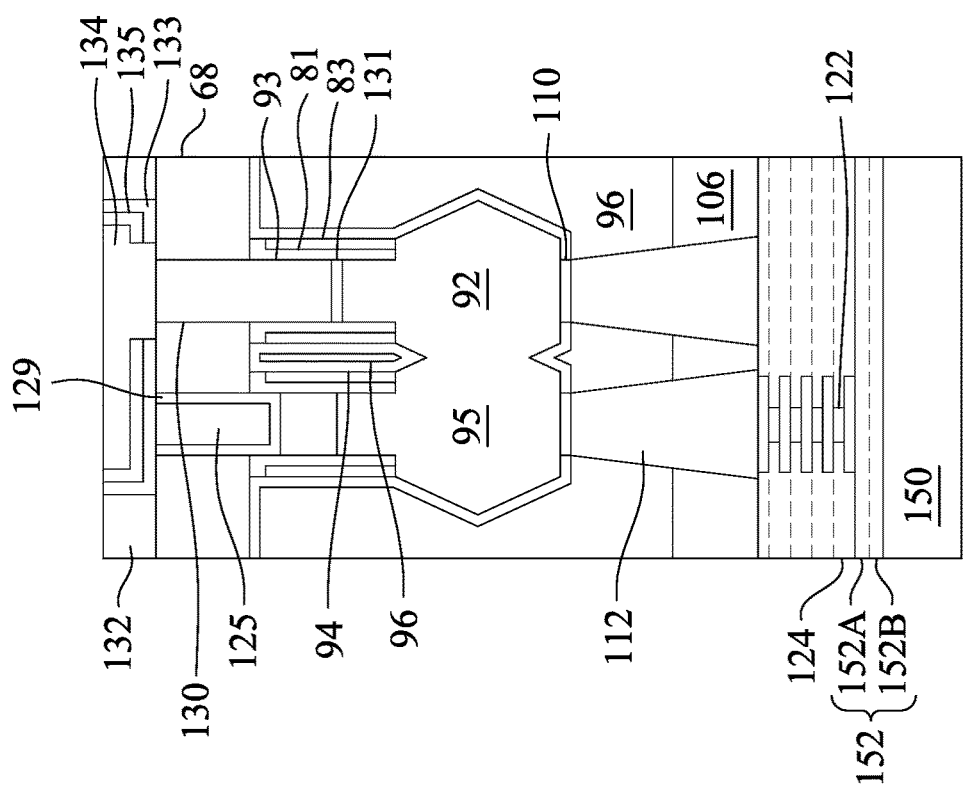
Figure 33A:
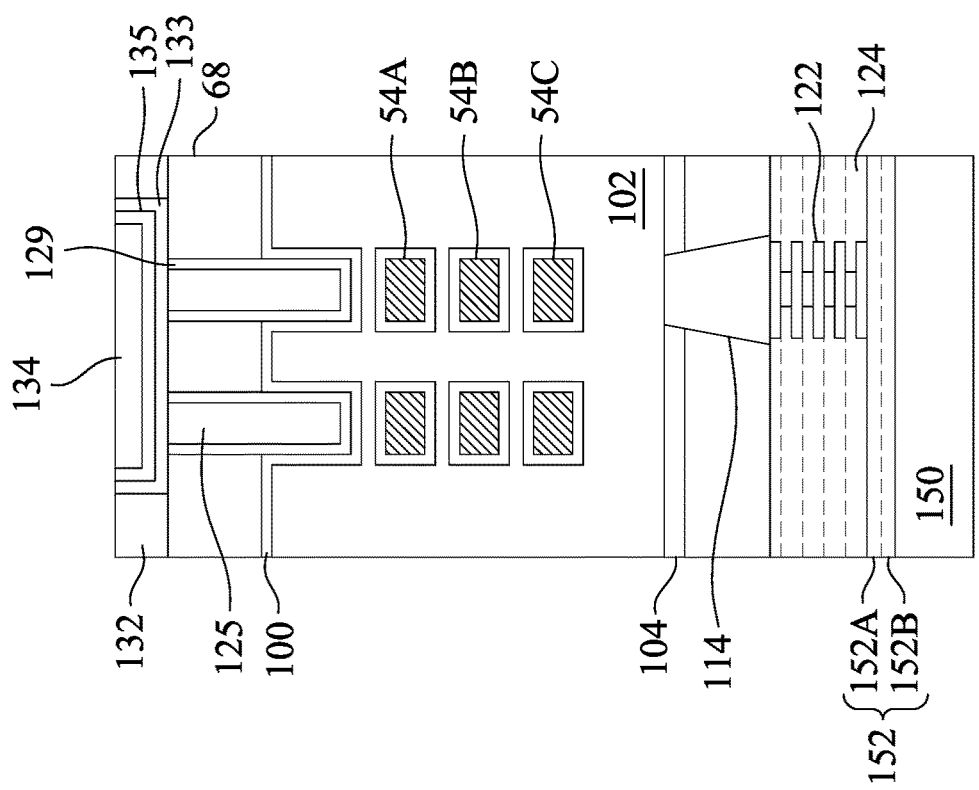
Figure 33C:
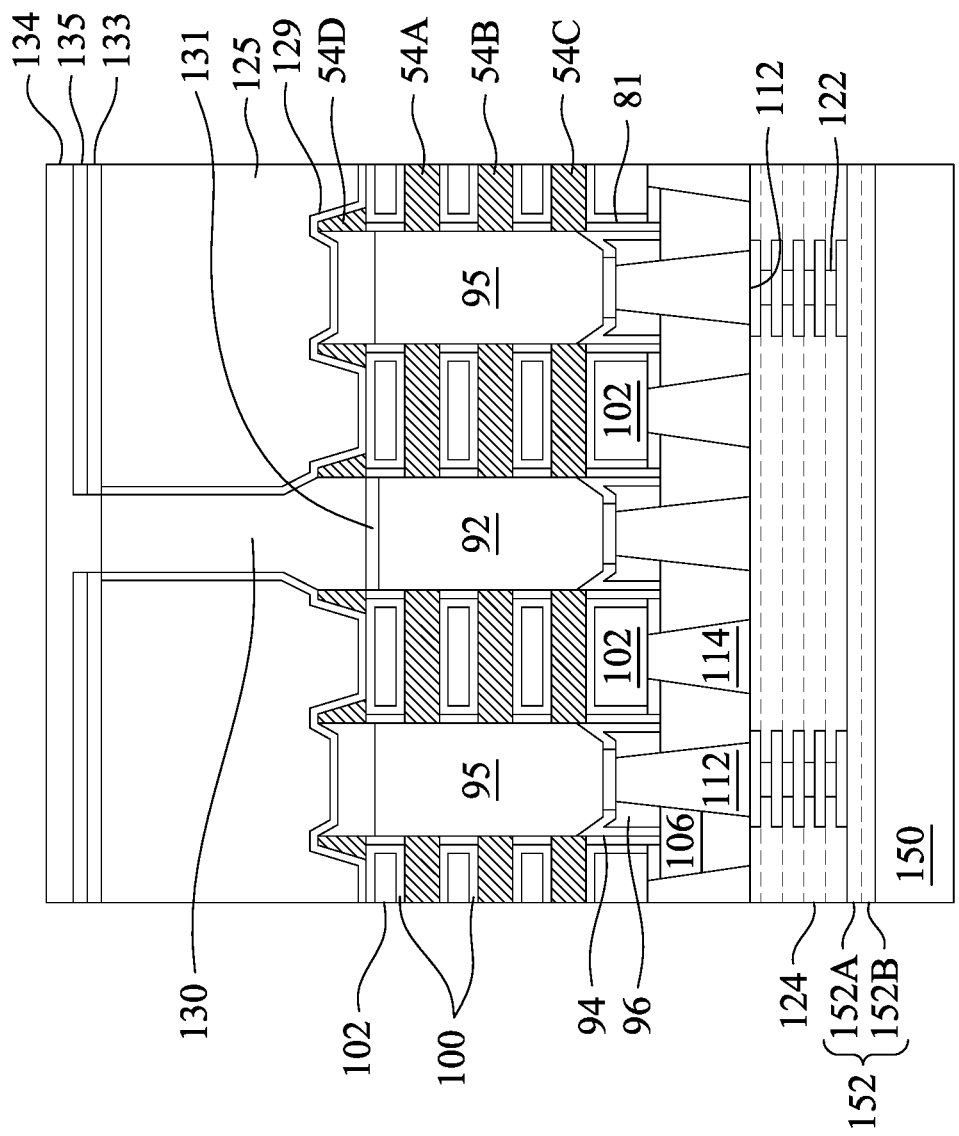

In FIGS. 33A through 33C, the backside vias 130 are planarized and conductive lines 134 and a dielectric layer 132 are formed. A planarization process, such as a CMP, may be performed to level backside surfaces of the backside vias 130 with backside surfaces of the dielectric layer 125. A first liner layer 133 a second liner layer 135, the conductive lines 134 and the dielectric layer 132 may then be formed over the dielectric layer 125. The dielectric layer 132 may be similar to the second ILD 106. For example, the dielectric layer 132 may be formed of materials and using processes the same as or similar to those used for the second ILD 106.

The first liner layer 133, the second liner layer 135, and the conductive lines 134 are formed in the dielectric layer 132. Forming the first liner layer 133, the second liner layer 135, and the conductive lines 134 may include patterning recesses in the dielectric layer 132 using a combination of photolithography and etching processes, for example. The first liner layer 133 is then formed by depositing a dielectric material in the recess. The first liner layer 133 may comprise, aluminum oxide, or the like, that may be formed using, for example, CVD, ALD, or the like. The second liner layer 135 is then formed over the first liner layer 133. The second liner layer 135 may comprise SiC, SiCH$_3$, or the like, that may be formed using, for example, CVD, ALD, or the like. A recess is patterned in the first liner layer 133 and the second liner layer 135 using a combination of photolithography and etching processes to expose the backside surfaces of the backside vias 130. The conductive lines 134 are then formed by depositing a conductive material over the first liner layer 133 and the second liner layer 135. The conductive material also fills the recess in the first liner layer 133 and the second liner layer 135 to physically contact the backside vias 130. In some embodiments, the conductive lines 134 comprise a metal layer, which may be a single layer or a composite layer comprising a plurality of sub-layers formed of different materials. In some embodiments, the conductive lines 134 comprise copper, aluminum, cobalt, tungsten, titanium, tantalum, ruthenium, or the like. An optional diffusion barrier and/or optional adhesion layer may be deposited prior to filling the recesses with the conductive material. Suitable materials for the barrier layer/adhesion layer include titanium, titanium nitride, titanium oxide, tantalum, tantalum nitride, titanium oxide, or the like. The conductive lines 134 may be formed using, for example, CVD, ALD, PVD, plating or the like. The conductive lines 134 are electrically coupled to the first epitaxial source/drain regions 92 through the backside vias 130 and the second silicide regions 131. A planarization process (e.g., a CMP, a grinding, an etch-back, or the like) may be performed to remove excess portions of the first liner layer 133, the second liner layer 135, and the conductive lines 134 formed over the dielectric layer 132.

In some embodiments, the conductive lines 134 are backside power rails, which are conductive lines that electrically connect the first epitaxial source/drain regions 92 to a reference voltage, a supply voltage, or the like. By placing power rails on a backside of the resulting semiconductor die rather than on a front-side of the semiconductor die, advantages may be achieved. For example, a gate density of the nano-FETs and/or interconnect density of the front-side interconnect structure 120 may be increased. Further, the backside of the semiconductor die may accommodate wider power rails, reducing resistance and increasing efficiency of power delivery to the nano-FETs. For example, a width of the conductive lines 134 may be at least twice a width of first level conductive lines (e.g., the first conductive features 122) of the front-side interconnect structure 120.

Figure 34B:
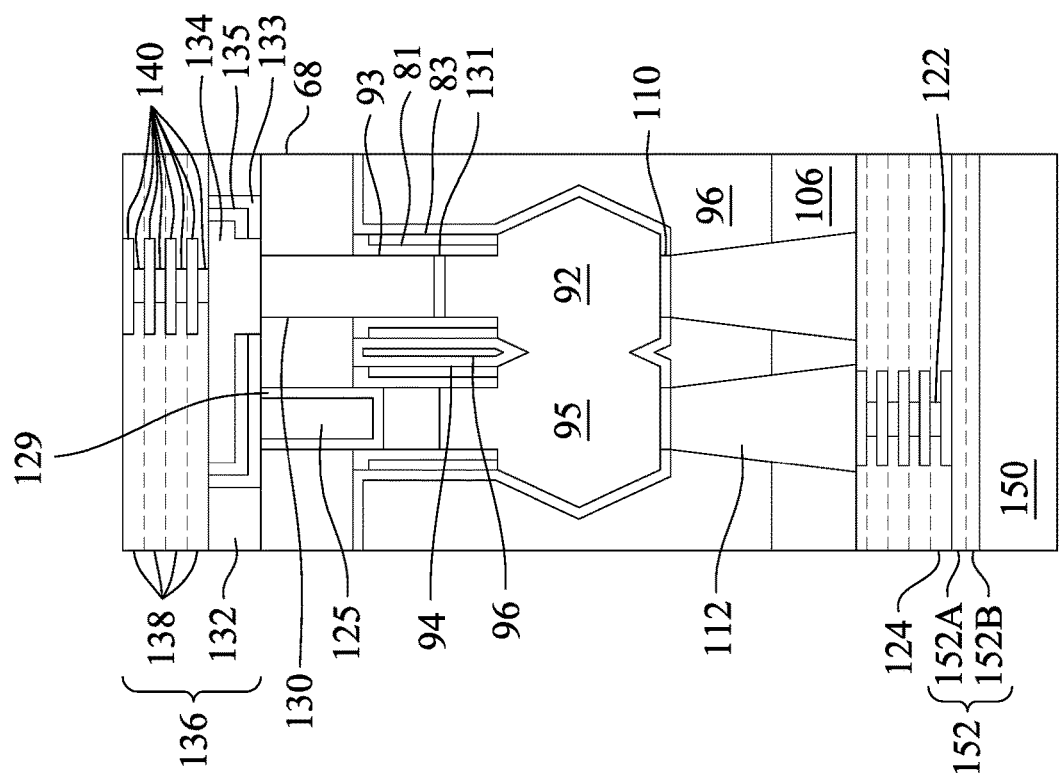
Figure 34A:
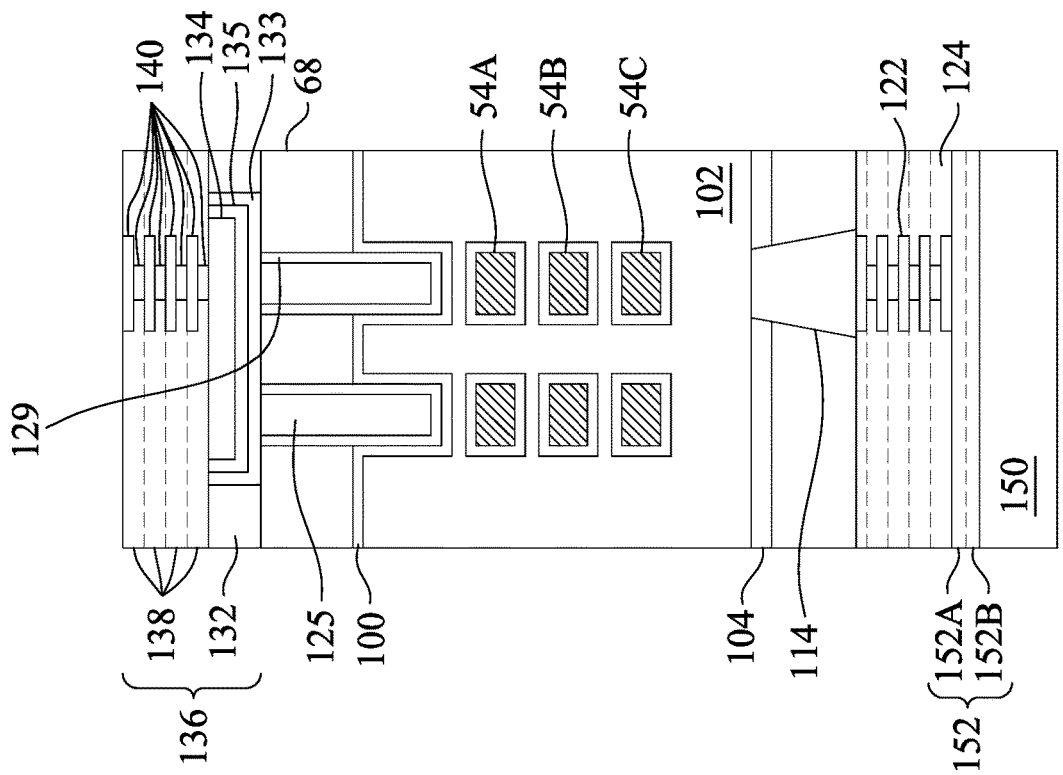
Figure 34C:
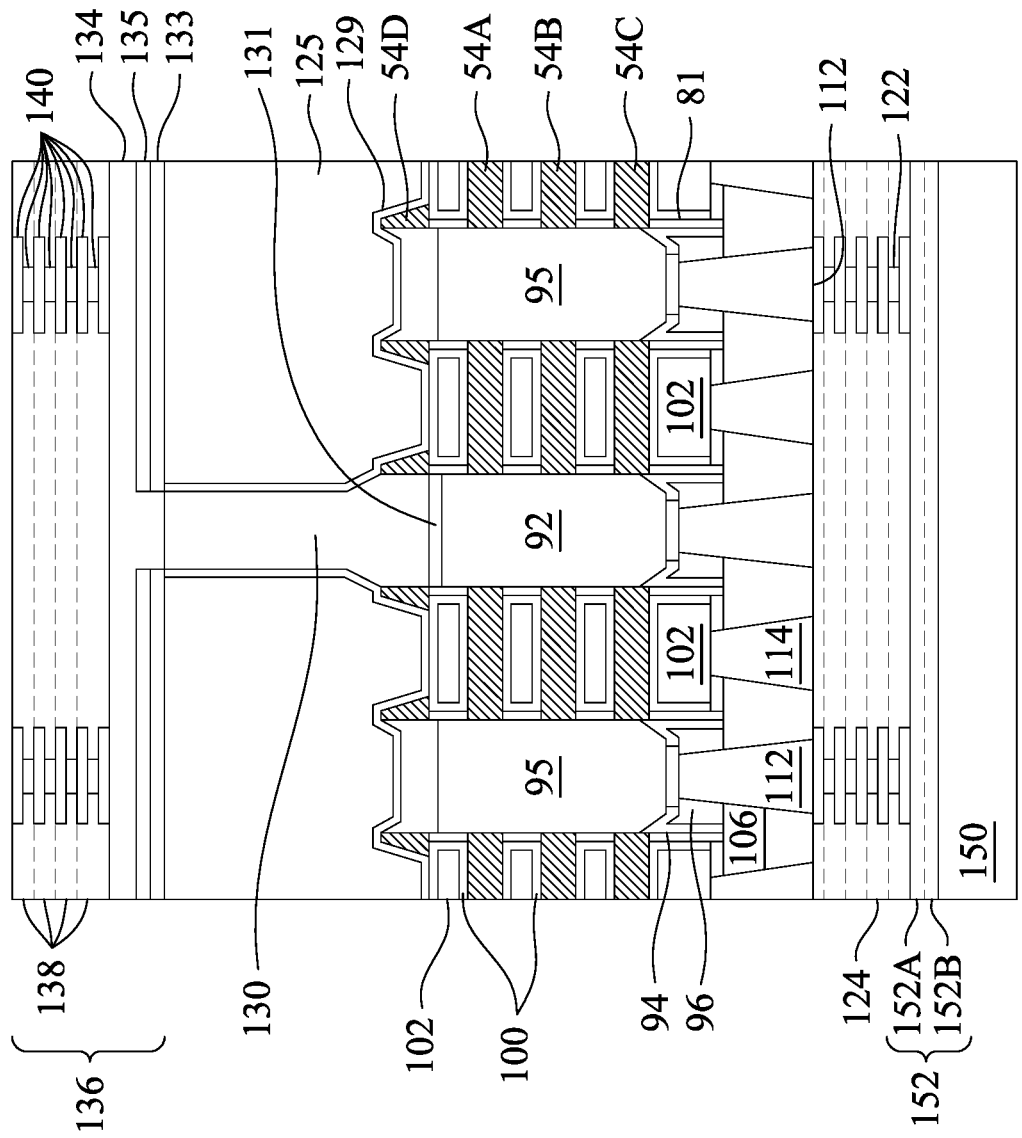

In FIGS. 34A through 34C, remaining portions of a backside interconnect structure 136 are formed over the first liner layer 133, the second liner layer 135, the dielectric layer 132 and the conductive lines 134. The backside interconnect structure 136 may be referred to as a backside interconnect structure because it is formed on a backside of the transistor structures 109 (e.g., a side of the transistor structures 109 opposite the side of the transistor structure 109 on which active devices are formed). The backside interconnect structure 136 may comprise the dielectric layer 132, the first liner layer 133, the second liner layer 135, and the conductive lines 134.

The remaining portions of the backside interconnect structure 136 may comprise materials and be formed using processes the same as or similar to those used for the front-side interconnect structure 120, discussed above with respect to FIGS. 22A through 22C. In particular, the backside interconnect structure 136 may comprise stacked layers of second conductive features 140 formed in dielectric layers 138. The second conductive features 140 may include routing lines (e.g., for routing to and from subsequently formed contact pads and external connectors). The second conductive features 140 may further be patterned to include one or more embedded passive devices such as, resistors, capacitors, inductors, or the like. The embedded passive devices may be integrated with the conductive lines 134 (e.g., the power rail) to provide circuits (e.g., power circuits) on the backside of the nano-FETs.

Figure 35B:
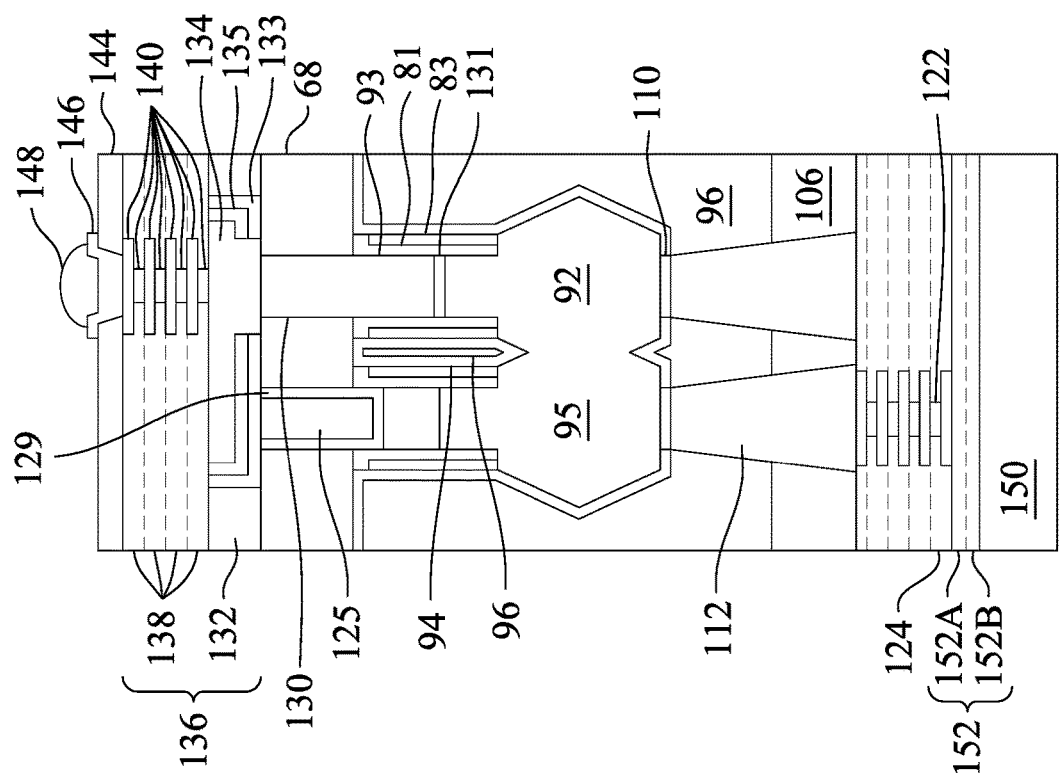
Figure 35A:
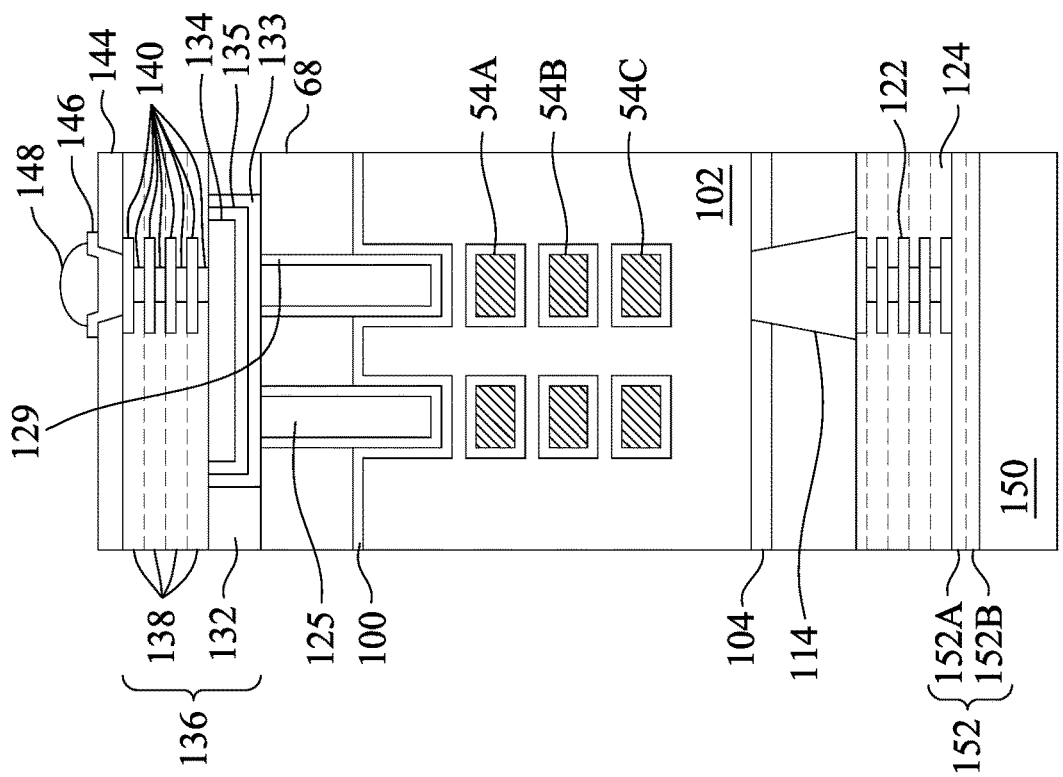
Figure 35C:
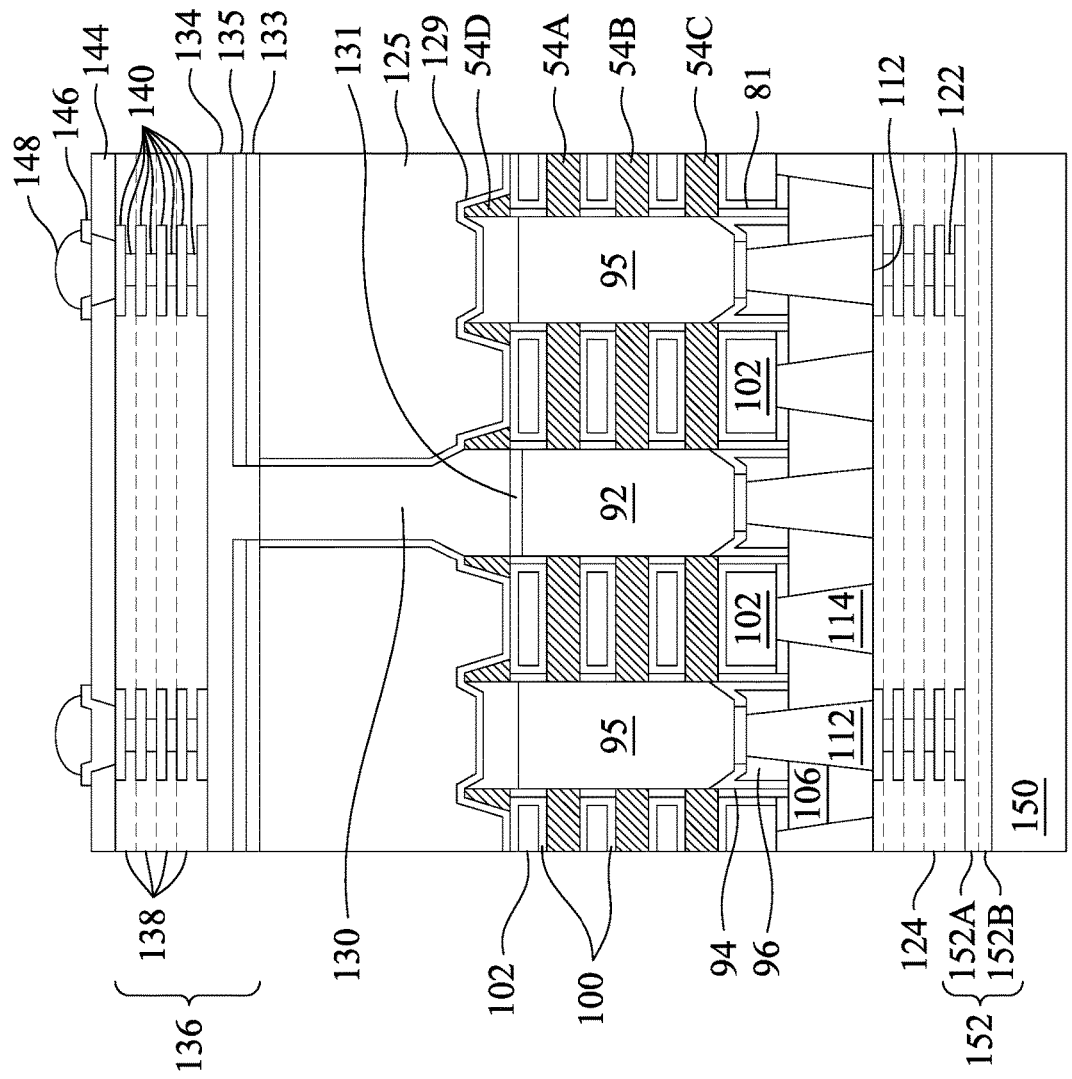

In FIGS. 35A through 35C, a passivation layer 144, UBMs 146, and external connectors 148 are formed over the backside interconnect structure 136. The passivation layer 144 may comprise polymers such as PBO, polyimide, BCB, or the like. Alternatively, the passivation layer 144 may include non-organic dielectric materials such as silicon oxide, silicon nitride, silicon carbide, silicon oxynitride, or the like. The passivation layer 144 may be deposited by, for example, CVD, PVD, ALD, or the like.

The UBMs 146 are formed through the passivation layer 144 to the second conductive features 140 in the backside interconnect structure 136 and the external connectors 148 are formed on the UBMs 146. The UBMs 146 may comprise one or more layers of copper, nickel, gold, or the like, which are formed by a plating process, or the like. The external connectors 148 (e.g., solder balls) are formed on the UBMs 146. The formation of the external connectors 148 may include placing solder balls on exposed portions of the UBMs 146 and reflowing the solder balls. In some embodiments, the formation of the external connectors 148 includes performing a plating step to form solder regions over the topmost second conductive features 140 and then reflowing the solder regions. The UBMs 146 and the external connectors 148 may be used to provide input/output connections to other electrical components, such as, other device dies, redistribution structures, printed circuit boards (PCBs), motherboards, or the like. The UBMs 146 and the external connectors 148 may also be referred to as backside input/output pads that may provide signal, supply voltage, and/or ground connections to the nano-FETs described above.

The embodiments of the present disclosure have some advantageous features. During the formation of a backside via in a semiconductor device, the forming of a dummy semiconductor layer on a topmost layer of a nanosheet stack, and etching through the dummy semiconductor layer such that end portions of the topmost layer of the nanosheet stack are covered by sidewall spacers may allow for the removal of middle portions of the topmost layer of the nanosheet stack by a subsequent etching process while using the sidewall spacers to mask the end portions of the topmost layer. This may allow for a reduction in damage to interfaces between epitaxial source/drain regions and layers of the nanosheet stack underlying the topmost layer of the nanosheet stack during the subsequent etching process. In addition, during the etch process, the topmost layer of the nanosheet can be etched along preferential directions that leave portions of the topmost layer of the nanosheet that protect against damage caused by over etching to interfaces between epitaxial source/drain regions and layers of the nanosheet stack underlying the topmost layer of the nanosheet stack. Embodiments disclosed herein may allow for a larger process window and therefore allow for more process variability during the formation of the backside via, resulting in an increase in manufacturing yield. Further, the reduction in damage to interfaces between epitaxial source/drain regions and channel layers of the nanosheet stack underlying the topmost layer of the nanosheet stack results in devices that may have a reduced vulnerability to electrostatic discharge.

In accordance with an embodiment, a method includes depositing a dummy semiconductor layer and a first semiconductor layer over a substrate; forming spacers on sidewalls of the dummy semiconductor layer; forming a first epitaxial material in the substrate; exposing the dummy semiconductor layer and the first epitaxial material, where exposing the dummy semiconductor layer and the first epitaxial material includes thinning a backside of the substrate; etching the dummy semiconductor layer to expose the first semiconductor layer, where the spacers remain over and in contact with end portions of the first semiconductor layer while etching the dummy semiconductor layer; etching portions of the first semiconductor layer using the spacers as a mask; and replacing a second epitaxial material and the first epitaxial material with a backside via, the backside via being electrically coupled to a source/drain region of a first transistor. In an embodiment, the dummy semiconductor layer has a thickness in a range from about 3 nm to about 5 nm, and the first semiconductor layer has a thickness in a range from about 6 nm to about 7 nm. In an embodiment, the spacers include silicon carbonitride (SiCN) or silicon oxycarbonitride (SiOCN). In an embodiment, the first epitaxial material, the second epitaxial material, and the dummy semiconductor layer include silicon germanium, where the first epitaxial material has a higher atomic concentration of germanium than the second epitaxial material, and where the second epitaxial material has a higher atomic concentration of germanium than the dummy semiconductor layer. In an embodiment, the first epitaxial material has an atomic concentration of germanium that is in a range from 20% to 25%, the second epitaxial material has an atomic concentration of germanium in a range from 20% to 25%, and the dummy semiconductor layer has an atomic concentration of germanium in a range from 20% to 25%. In an embodiment, the first semiconductor layer includes silicon having a crystal orientation that is in a <110> family of crystal directions. In an embodiment, a first portion of the backside via that contacts sidewalls of the first semiconductor layer has a width that is greater than widths of other portions of the backside via. In an embodiment, the first semiconductor layer includes silicon having a crystal orientation that is in a <100> family of crystal directions.

In accordance with yet another embodiment, a method includes depositing a dummy semiconductor layer over a semiconductor substrate; depositing a first semiconductor layer over the dummy semiconductor layer; forming a dummy backside via in the semiconductor substrate, where the dummy backside via extends through the dummy semiconductor layer and the first semiconductor layer, and where spacers isolate the dummy backside via from the dummy semiconductor layer; etching a backside of the semiconductor substrate to expose the dummy backside via, the spacers, and the dummy semiconductor layer; removing the dummy semiconductor layer to expose the first semiconductor layer; forming a cavity in the first semiconductor layer by etching the first semiconductor layer using the spacers as an etch mask; and replacing the dummy backside via with a conductive material to form a backside via. In an embodiment, the dummy semiconductor layer and the first semiconductor layer include different materials. In an embodiment, the dummy backside via includes a first epitaxial material and a second epitaxial material. In an embodiment, the method further includes forming a source/drain region of a transistor over the dummy backside via, where an atomic concentration of germanium in the source/drain region is lower than an atomic concentration of germanium of the first epitaxial material and the second epitaxial material. In an embodiment, after forming the dummy backside via the spacers contact the second epitaxial material of the dummy backside via. In an embodiment, removing the dummy semiconductor layer includes a wet etching process using tetramethylammonium hydroxide (TMAH).

In accordance with an embodiment, a device includes a first transistor structure in a first device layer; a front-side interconnect structure on a front-side of the first device layer; a first dielectric layer on a backside of the first device layer; and a backside via extending through the first dielectric layer to a source/drain region of the first transistor structure, where a lower portion of the backside via directly contacts a first sidewall of a first semiconductor layer, and where the first dielectric layer extends through the first semiconductor layer. In an embodiment, a second sidewall of the first semiconductor layer forms an angle in a range from 49.7° to about 59.7° with a bottom surface of the first semiconductor layer. In an embodiment, the first semiconductor layer includes silicon having a crystal orientation that is in a <110> family of crystal directions. In an embodiment, a material of the first semiconductor layer and a material of a channel region of the first transistor structure are the same. In an embodiment, a first portion of the source/drain region contacts the channel region, where a first width of the first portion of the source/drain region is larger than a second width of a top surface of the source/drain region and a third width of a bottom surface of the source/drain region. In an embodiment, the first semiconductor layer has a height that is in a range from about 6 nm to about 7 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing a dummy semiconductor layer and a first semiconductor layer over a substrate;
   forming spacers on sidewalls of the dummy semiconductor layer;
   forming a first epitaxial material and a second epitaxial material in the substrate;
   exposing the dummy semiconductor layer and the first epitaxial material, wherein exposing the dummy semiconductor layer and the first epitaxial material comprises thinning a backside of the substrate;
   etching the dummy semiconductor layer to expose the first semiconductor layer, wherein the spacers remain over and in contact with end portions of the first semiconductor layer while etching the dummy semiconductor layer;
   etching portions of the first semiconductor layer using the spacers as a mask; and
   replacing the second epitaxial material and the first epitaxial material with a backside via, the backside via being electrically coupled to a source/drain region of a first transistor.

2. The method of claim 1, wherein the dummy semiconductor layer has a thickness in a range from about 3 nm to about 5 nm, and the first semiconductor layer has a thickness in a range from about 6 nm to about 7 nm.

3. The method of claim 1, wherein the spacers comprise silicon carbonitride (SiCN) or silicon oxycarbonitride (SiOCN).

4. The method of claim 1, wherein the first epitaxial material, the second epitaxial material, and the dummy semiconductor layer comprise silicon germanium, wherein the first epitaxial material has a higher atomic concentration of germanium than the second epitaxial material, and wherein the second epitaxial material has a higher atomic concentration of germanium than the dummy semiconductor layer.

5. The method of claim 4, wherein the first epitaxial material has an atomic concentration of germanium that is in a range from 20% to 25%, the second epitaxial material has an atomic concentration of germanium in a range from 20% to 25%, and the dummy semiconductor layer has an atomic concentration of germanium in a range from 20% to 25%.

6. The method of claim 1, wherein the first semiconductor layer comprises silicon having a crystal orientation that is in a <110>family of crystal directions.

7. The method of claim 1, wherein a first portion of the backside via that contacts sidewalls of the first semiconductor layer has a width that is greater than widths of other portions of the backside via.

8. The method of claim 1, wherein the first semiconductor layer comprises silicon having a crystal orientation that is in a <100>family of crystal directions.

9. A method comprising:
   depositing a dummy semiconductor layer over a semiconductor substrate;
   depositing a first semiconductor layer over the dummy semiconductor layer;
   forming a dummy backside via in the semiconductor substrate, wherein the dummy backside via comprises a first epitaxial material and a second epitaxial material, wherein the dummy backside via extends through the dummy semiconductor layer and the first semiconductor layer, and wherein spacers isolate the dummy backside via from the dummy semiconductor layer;
   etching a backside of the semiconductor substrate to expose the dummy backside via, the spacers, and the dummy semiconductor layer;
   removing the dummy semiconductor layer to expose the first semiconductor layer;
   forming a cavity in the first semiconductor layer by etching the first semiconductor layer using the spacers as an etch mask; and
   replacing the dummy backside via with a conductive material to form a backside via.

10. The method of claim 9, wherein the dummy semiconductor layer and the first semiconductor layer comprise different materials.

11. The method of claim 9 further comprising forming a source/drain region of a transistor over the dummy backside via, wherein an atomic concentration of germanium in the source/drain region is lower than an atomic concentration of germanium of the first epitaxial material and the second epitaxial material.

12. The method of claim 9, wherein after forming the dummy backside via the spacers contact the second epitaxial material of the dummy backside via.

13. The method of claim 9, wherein removing the dummy semiconductor layer comprises a wet etching process using tetramethylammonium hydroxide (TMAH).

14. The method of claim 9, wherein a germanium concentration of the first epitaxial material is higher than a germanium concentration of the second epitaxial material.

15. A method comprising:
   forming a first semiconductor layer and a second semiconductor layer sequentially over a substrate;
   forming a first recess in the first semiconductor layer, the second semiconductor layer and the substrate;
   depositing spacers in the first recess on sidewalls of the first semiconductor layer;
   depositing a first sacrificial material and a second sacrificial material sequentially in the first recess;
   forming an epitaxial source/drain region in the first recess over the first sacrificial material and the second sacrificial material;
   exposing a backside of the second semiconductor layer by removing the first semiconductor layer, wherein after removing the first semiconductor layer the spacers overlap and are in physical contact with end portions of the second semiconductor layer;
   forming a second recess in the second semiconductor layer; and
   replacing the first sacrificial material and the second sacrificial material with a conductive via that is electrically coupled to the epitaxial source/drain region.

16. The method of claim 15 further comprising thinning a backside of the substrate to expose a surface of the first sacrificial material.

17. The method of claim 15, wherein forming the cavity in the second semiconductor layer comprises etching portions of the second semiconductor layer using the spacers as a mask.

18. The method of claim 17 further comprising:
   after forming the cavity in the second semiconductor layer, performing a first etching process to remove the spacers.

19. The method of claim 18, wherein after performing the first etching process the second recess has curved sidewalls and a curved bottom surface.

20. The method of claim 15, wherein the first sacrificial material, the second sacrificial material, and the first semiconductor layer comprise silicon germanium, and wherein the first sacrificial material has a higher atomic concentration of germanium than the second sacrificial material.

* * * * *